(12) United States Patent
Wang et al.

(10) Patent No.: US 9,881,863 B2
(45) Date of Patent: Jan. 30, 2018

(54) SEMICONDUCTOR PACKAGES AND METHODS OF PACKAGING SEMICONDUCTOR DEVICES

(71) Applicant: UTAC Headquarters Pte. Ltd., Singapore (SG)

(72) Inventors: Chuen Khiang Wang, Singapore (SG); Nathapong Suthiwongsunthorn, Singapore (SG); Kriangsak Sae Le, Singapore (SG); Antonio Jr B Dimaano, Singapore (SG); Catherine Bee Liang Ng, Singapore (SG); Richard Te Gan, Singapore (SG); Kian Teng Eng, Singapore (SG)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 0 days.

(21) Appl. No.: 15/428,109

(22) Filed: Feb. 8, 2017

(65) Prior Publication Data

US 2017/0148722 A1    May 25, 2017

Related U.S. Application Data

(60) Continuation of application No. 14/849,560, filed on Sep. 9, 2015, now Pat. No. 9,589,875, which is a
(Continued)

(51) Int. Cl.
*H01L 23/498* (2006.01)
*H01L 21/48* (2006.01)
(Continued)

(52) U.S. Cl.
CPC .... *H01L 23/49861* (2013.01); *H01L 21/4825* (2013.01); *H01L 21/4828* (2013.01);
(Continued)

(58) Field of Classification Search
None
See application file for complete search history.

(56) References Cited

U.S. PATENT DOCUMENTS 5,477,933 A    12/1995 Nguyen
6,833,609 B1 *  12/2004 Fusaro ................ H01L 23/3121
                                                         257/668

(Continued)

OTHER PUBLICATIONS

Teh, D., et. al. "Development and Package Characterization of Advace Leadless Lead-frame Package", Manapad 2015, Apr. 22-23, Grenoble France.*

*Primary Examiner* — Joseph Schoenholtz
(74) *Attorney, Agent, or Firm* — Horizon IP Pte Ltd.

(57) ABSTRACT

A device is disclosed. The device includes a carrier substrate having first and second major surfaces. The first surface includes a die region and contact pads and the second surface includes package contacts. The carrier substrate includes a patterned lead frame which defines a line level with conductive traces and a via level with via contacts. The patterned lead frame provides interconnections between the contact pads and package contacts. The carrier substrate further includes a dielectric layer isolating the conductive traces and via contacts. The device includes a die mounted on the die region of the first surface.

20 Claims, 49 Drawing Sheets

Related U.S. Application Data division of application No. 14/257,017, filed on Apr. 21, 2014, now Pat. No. 9,136,142, which is a division of application No. 13/174,923, filed on Jul. 1, 2011, now Pat. No. 8,716,873.

(60) Provisional application No. 61/360,498, filed on Jul. 1, 2010.

(51) Int. Cl.
 *H01L 21/56* (2006.01)
 *H01L 23/31* (2006.01)
 *H01L 23/495* (2006.01)

(52) U.S. Cl.
 CPC ...... *H01L 21/4839* (2013.01); *H01L 21/4857* (2013.01); *H01L 21/565* (2013.01); *H01L 23/3114* (2013.01); *H01L 23/4952* (2013.01); *H01L 23/49503* (2013.01); *H01L 23/49541* (2013.01); *H01L 23/49816* (2013.01); *H01L 23/49822* (2013.01); *H01L 23/49894* (2013.01); *H01L 23/49534* (2013.01); *H01L 23/49827* (2013.01)

(56) References Cited

U.S. PATENT DOCUMENTS

| | | |
|---|---|---|
| 6,946,324 B1 | 9/2005 | McLellan et al. |
| 7,045,887 B2 | 5/2006 | Karnezos |
| 7,045,893 B1 | 5/2006 | Paek et al. |
| 7,132,753 B1 | 11/2006 | St. Amand et al. |
| 7,501,839 B2 | 3/2009 | Chan et al. |
| 7,892,889 B2 | 2/2011 | Howard et al. |
| 7,927,917 B2 | 4/2011 | Pagaila et al. |
| 8,017,448 B2 | 9/2011 | Ino |
| 8,053,275 B2 | 11/2011 | Hasegawa |
| 8,163,604 B2 | 4/2012 | Ong et al. |
| 8,183,087 B2 | 5/2012 | Lin et al. |
| 8,263,439 B2 | 9/2012 | Marimuthu et al. |
| 8,390,108 B2 | 3/2013 | Cho et al. |
| 2001/0008305 A1* | 7/2001 | McLellan ........... H01L 21/4832 257/692 |
| 2002/0022356 A1 | 2/2002 | Shiflet |
| 2003/0207498 A1* | 11/2003 | Islam .................. H01L 23/3114 438/120 |
| 2005/0263864 A1 | 12/2005 | Islam et al. |
| 2006/0170093 A1 | 8/2006 | Pendse |
| 2006/0226556 A1* | 10/2006 | Kurita ................... H01L 21/563 257/778 |
| 2007/0079986 A1 | 4/2007 | Kikuchi et al. |
| 2007/0079987 A1 | 4/2007 | Yamamichi et al. |
| 2007/0080439 A1 | 4/2007 | Kikuchi et al. |
| 2007/0126085 A1 | 6/2007 | Kawano et al. |
| 2007/0164457 A1 | 7/2007 | Yamaguchi et al. |
| 2008/0057621 A1 | 3/2008 | Lee |
| 2008/0079127 A1 | 4/2008 | Gerber |
| 2008/0265399 A1 | 10/2008 | Chao |
| 2009/0032960 A1 | 2/2009 | Pratt |
| 2009/0152547 A1 | 6/2009 | Park et al. |
| 2009/0223046 A1 | 9/2009 | Murayama et al. |
| 2009/0283884 A1 | 11/2009 | Kang et al. |
| 2009/0289336 A1 | 11/2009 | Meghro et al. |
| 2009/0302465 A1* | 12/2009 | Huang .................. H01L 21/568 257/737 |
| 2009/0321947 A1 | 12/2009 | Pratt |
| 2010/0081236 A1 | 4/2010 | Yang et al. |
| 2010/0129964 A1* | 5/2010 | Goh ..................... H01L 21/4832 438/124 |
| 2010/0140759 A1 | 6/2010 | Pagaila et al. |
| 2010/0140773 A1 | 6/2010 | Galera et al. |
| 2010/0148360 A1 | 6/2010 | Lin et al. |
| 2010/0304530 A1 | 12/2010 | Yim et al. |
| 2011/0068453 A1 | 3/2011 | Cho et al. |
| 2011/0140254 A1 | 6/2011 | Tsai et al. |
| 2011/0140259 A1 | 6/2011 | Cho et al. |
| 2011/0147901 A1 | 6/2011 | Huang et al. |
| 2011/0156227 A1 | 6/2011 | Lin et al. |
| 2011/0169145 A1 | 7/2011 | Maniwa et al. |
| 2011/0215448 A1 | 9/2011 | Cho et al. |
| 2011/0285009 A1 | 11/2011 | Chi et al. |
| 2011/0316117 A1 | 12/2011 | Kripesh et al. |
| 2012/0043656 A1 | 2/2012 | Hayashi |

* cited by examiner

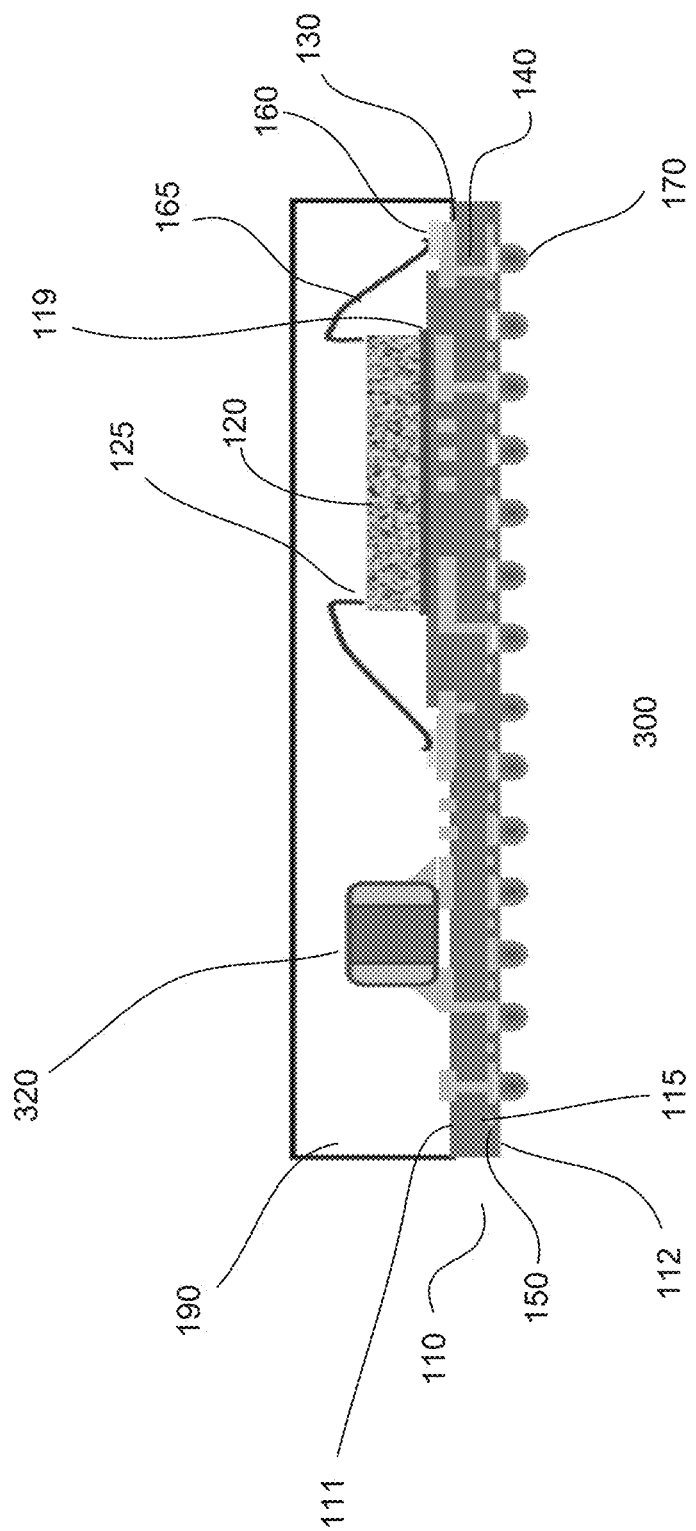

1900

1900

SEMICONDUCTOR PACKAGES AND METHODS OF PACKAGING SEMICONDUCTOR DEVICES

CROSS-REFERENCE TO RELATED APPLICATIONS

This application is a continuation application of co-pending U.S. patent application Ser. No. 14/849,560, filed Sep. 9, 2015, which is a divisional application of U.S. patent application Ser. No. 14/257,017, now U.S. Pat. No. 9,136,142, filed Apr. 21, 2014 which is a divisional application of U.S. patent application Ser. No. 13/174,923, now U.S. Pat. No. 8,716,873, filed Jul. 1, 2011, which claims priority of U.S. Provisional Application No. 61/360,498, filed Jul. 1, 2010, the contents of which are incorporated herein by reference in their entireties for all purposes.

BACKGROUND

Through substrate vias (TSVs) are used to facilitate wafer level packaging. Coventional TSV processing requires the use of a temporary carrier which later needs to be removed. The handling and processing of a thin TSV wafer bonded to a carrier is one of the costliest and most difficult issues encountered.

Package-on-package (PoP) structures enable higher density of components on a motherboard. PoP packages are particularly useful, for example, in the PDA/mobile phone devices where small packaging size is an important factor. However, existing PoP packages suffer from several disadvantages. If solder balls are used for the interconnection between the packages, the package pitch will be restricted by the ball size, ball height and ball pitch. For example, in existing PoP structures, the bottom package for wire-bonded dies is limited to 0.5 mm pitch. There are a few available proprietary solutions to address finer pitch PoP package such as the Through Mold Via with laser drilling or MAP PoP stacking with additional singulation steps to expose the solder ball contacts. These processes may be considered as relatively complex and hence not desirable.

From the foregoing discussion, there is a desire to provide an improved package.

SUMMARY

Embodiments relate to semiconductor packages. In one embodiment, a device is disclosed. The device includes a carrier substrate having first and second major surfaces. The first surface includes a die region and contact pads and the second surface includes package contacts. The carrier substrate includes a patterned lead frame which defines a line level with conductive traces and a via level with via contacts, wherein the patterned lead frame provides interconnections between the contact pads and package contacts. The carrier substrate further includes a dielectric layer isolating the conductive traces and via contacts. The device includes a die mounted on the die region of the first surface.

In another embodiment, a method of forming a package is presented. The method includes providing a conductive base carrier having conductive traces defined on a first surface and the conductive traces are separated by spaces. A first dielectric layer is formed on the first surface. The first dielectric layer fills the spaces between and covers the conductive traces. The first dielectric layer is patterned to form contact openings to expose the first conductive traces and contact pads are formed in the contact openings. A die is mounted on the first surface of the base carrier. The die is coupled to the contact pads. The die is encapsulated. The method further includes patterning the second surface of the base carrier to form via contacts of a via level. A second dielectric layer is formed with package openings which exposes the via contacts. Package contacts are formed in the package openings.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer the same parts throughout the different views. Also, the drawings are not necessarily to scale, emphasis instead generally being placed upon illustrating the principles of the invention. In the following description, various embodiments of the present invention are described with reference to the following drawings, in which:

FIG. 3 shows another embodiment of a device;

FIG. 4a-1, FIGS. 5a-c, FIGS. 6a-d and FIGS. 7a-d show various embodiments of a method for forming a semiconductor package;

DETAILED DESCRIPTION

Embodiments relate to semiconductor packages. The packages are use to package one or more semiconductor dies. For the case of more than one die, the dies may be arranged in a planar arrangement, vertical arrangement, or a combination thereof. The dies, for example, may include memory devices, logic devices, communication devices, optoelectronic devices, digital signal processors (DSPs), microcontrollers, system-on-chips (SOCs) as well as other types of devices or a combination thereof. Such packages may be incorporated into electronic products or equipment, such as phones, computers as well as mobile and mobile smart products. Incorporated the packages into other types of products may also be useful.

Figure 1A:
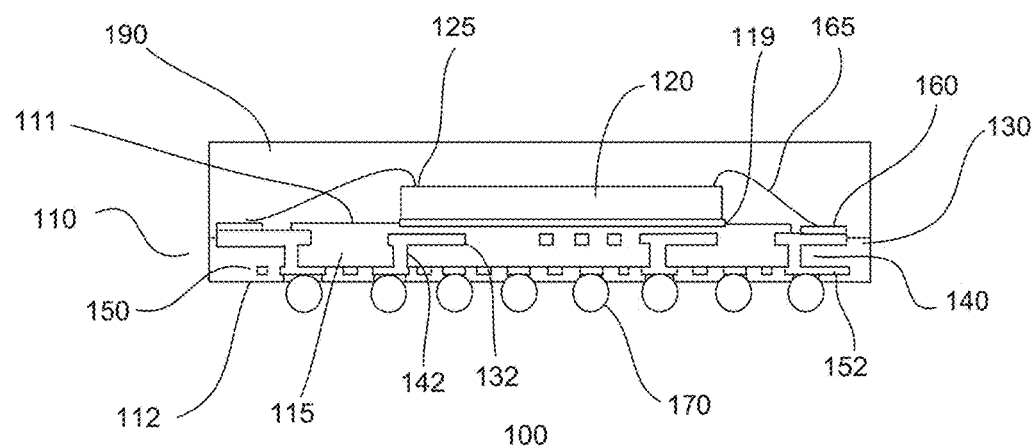
FIGS. 1a-c show embodiments of a semiconductor package.
Figure 1B:
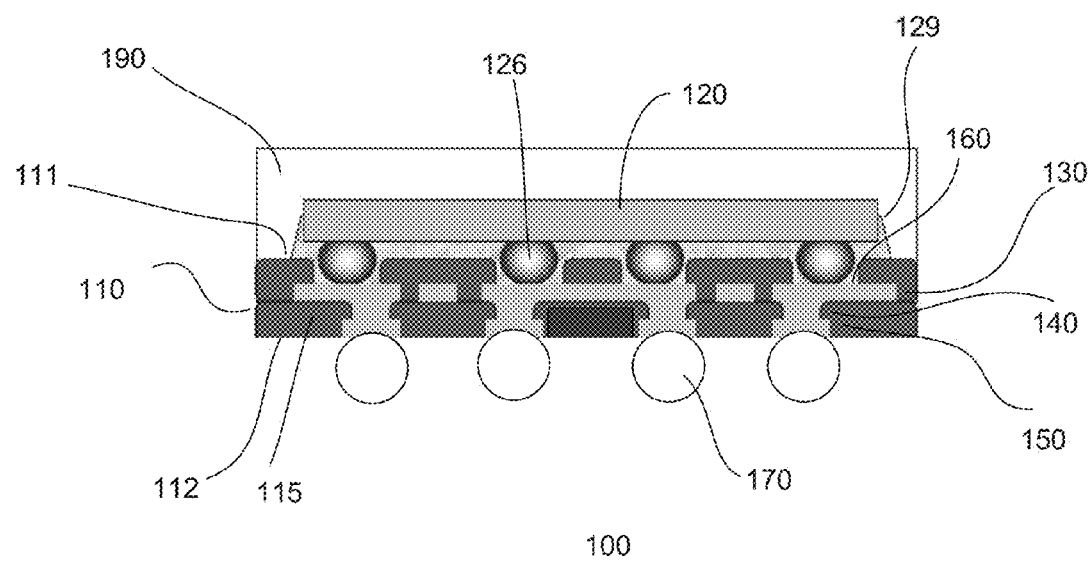
Figure 1C:
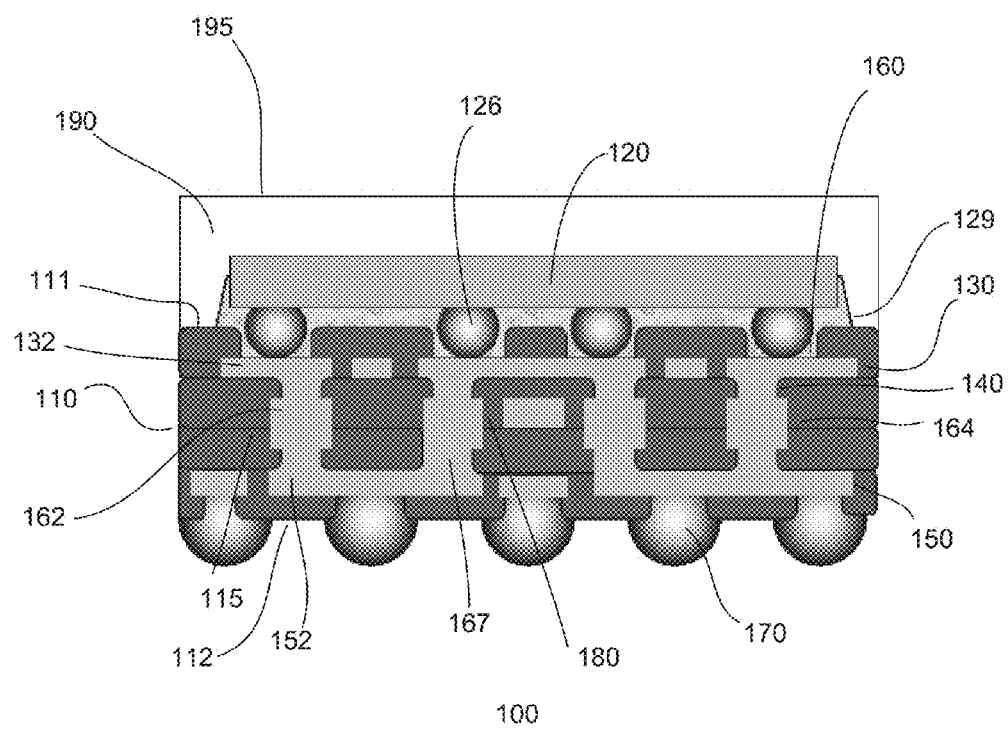

FIGS. 1a-c show embodiments of a semiconductor package 100. The package includes a package substrate 110. The package substrate includes first and second major surfaces 111 and 112. The first major surface, for example, may be referred to as the top surface and the second major surface, for example, may be referred to as the bottom surface. Other designations for the surfaces may also be useful. In one embodiment, the top surface includes a die or chip region on which a die 120 is mounted.

In one embodiment, package contacts 170 are provided on the bottom surface. The package contacts serve as external package connections. For example, the package contacts can be electrically coupled to an external device (not shown), such as a circuit board. The package contacts may comprise spherical shaped structures or balls arranged in a grid pattern to form a BGA type package. Other types of package contacts, such as solder lands, flat shaped contacts or contact pads, may be used. The package contacts, for example, can be formed from solder. Various types of conductive materials may be used. For example, the package contacts may be formed from solders, such as lead-based or non lead-based solders. Other types of materials, such as Cu—OSP, Ni—Au, alloys or conductive polymers, may also be used. Bottom package pads can be provided on which the package contacts are disposed. Arranging the contacts in other patterns or providing other types of contacts are also useful.

Contact pads 160 are disposed on the top surface of the substrate. The contact pads, for example, comprise a conductive material. The contact pads may, in one embodiment, comprise Ni, Cu, Au or Pd. Other types of conductive materials may also be useful. The contact pads are electrically coupled to the die.

In the case of a wire bond die, as shown in FIG. 1a, the contact pads are disposed on the periphery of the chip region. The contact pads, for example, may be formed by electro or electroless plating. Wire bonds 165 are provided to couple the bond pads 125 on the die to contact pads on the package substrate. The bond pads are provided on, for example, an active top surface of the die. The die may be mounted on the carrier by an adhesive 119. The adhesive, such as epoxy, may be an adhesive paste or an adhesive tape. Other types of adhesives may also be useful.

In another embodiment, a flip chip having die contacts 126 on an active surface of the die is mounted onto the chip region, as shown in FIGS. 1b-c. The contact pads, in the case of a flip chip application, are disposed in the chip region. The contact pads are configured to match the pattern of the die contacts of the flip chip. An underfill 129, such as an epoxy-based polymeric material, may be provided in the space between the die and package substrate. Alternatively, no underfill is provided between the die and package substrate.

Referring back to FIGS. 1a-c, the contact pads are coupled to the bottom package pads or contacts for providing electrical connection to the die. The package may include a cap 190 which encapsulates the die. The cap, for example, may be formed by encapsulant. For example, the cap material may be an epoxy resin, silicon or plastic. Other mold compounds may also be useful. The cap provides protection against the environment.

The package substrate comprises a conductive leadframe. The leadframe may comprise, for example, copper. Other types of conductive materials may also be useful for the leadframe. In one embodiment, the leadframe comprises a patterned leadframe. The patterned leadframe defines conductive line and traces which allow routing of signals under the chip attach region, as well as areas outside of the chip attach region. For example, the patterned leadframe defines a first line level 130 and a first via level 140. The first line level includes first conductive traces 132. In one embodiment, the first conductive traces are proximate to the top surface of the package substrate and coupled to the contact pads. The first via level comprises first via contacts 142 which coupled to the first conductive traces. The first via contacts may be coupled to the package contacts on the second surface of the package substrate. For example, the first via contacts may extend from the first line level to the second surface of the package substrate to couple to the package contacts. In one embodiment, the first via contacts couple first conductive traces to respective package contacts. Other configurations of via contacts may also be useful.

In one embodiment, a second line level 150 is provided in the package substrate. The second line level, for example, serves as the bottom line level. The second line level includes second conductive traces 152 which are coupled to the package contacts. For example, the first via contacts may extend from the first line level to the second line level, coupling the first conductive traces to the second conductive traces. In one embodiment, the first via contacts couple first conductive traces to respective second conductive traces. Other configurations of via contacts may also be useful.

In one embodiment, the second line level comprises a material separate from the lead frame. For example, the second line level comprises a built-up conductive layer of the lead frame. The second line level, for example, may comprise copper or alloys. Other types of conductive materials may also be used to form the second line level. The second line level, in some embodiments, is the same material as the lead frame. Providing second line level which is of different material than the lead frame is also useful.

The package substrate includes a dielectric layer 115. The dielectric layer isolates the conductive and via levels. The dielectric layer, for example, comprises polymer or solder mask material. Other types of dielectric materials, such as dielectric composites, may also be useful. The dielectric layer, in one embodiment, may serve as the top surface of the package substrate, with openings exposing the contact pads. For example, the openings are provided in the dielectric layer to expose the contact pads recessed below, as shown in FIG. 1b. The top surface of the dielectric layer need not be coplanar in the package substrate. For example, the dielectric layer may be recessed below the contact pads, as shown in FIG. 1a. In other embodiments, the contact pads may protrude above the surface of the dielectric layer.

In some embodiments, intermediate line levels may be provided between the first and second line levels, as shown in FIG. 1c. Although the die comprises a flip-chip die, it is understood that intermediate line levels may be employed for wire bonded dies, such as shown in FIG. 1a. As shown, one intermediate line level 164 is provided between the first and second line levels. The intermediate line level includes intermediate conductive traces 162. The intermediate conductive traces may be coupled to the first conductive traces on the first line level by first via contacts and the second conductive traces on the second line level by intermediate via contacts 167. In other embodiments, more than one intermediate line levels may be provided. Additional intermediate via levels with via contacts may be included to provide interconnections to the different line levels. For example, a package substrate with x line levels may include x−1 via levels. Providing a package substrate with multiple line levels allows more complex circuitry to be formed in the package substrate. Hence, this allows for higher I/O counts for the package which enhances device performance. The multiple line levels also assist in heat dissipation from the device to the PCB.

Although the semiconductor package is shown as a single package, FIGS. 1a-c can be extended to stack chip configurations such as TSV stacks or wirebonded stack or a combination thereof.

Figure 2:
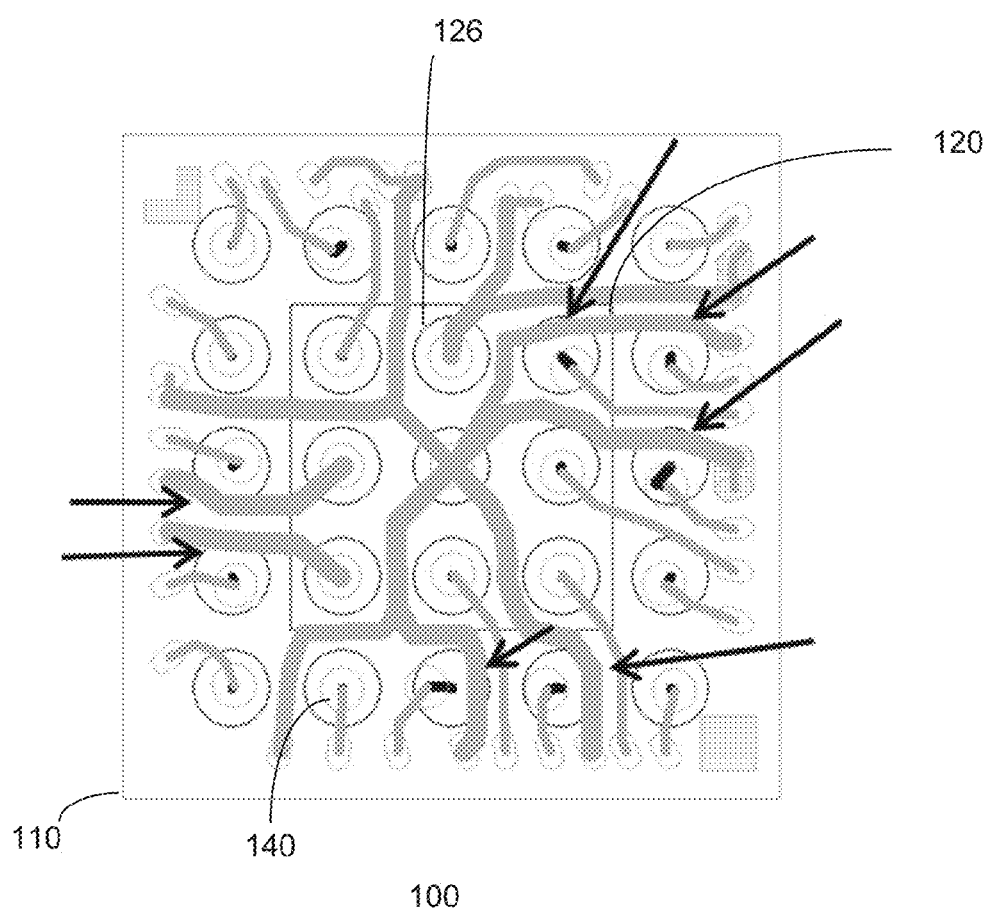
FIG. 2 shows a plan view of an embodiment of a device.

FIG. 2 shows an example of a plan view of an embodiment of a device 100. The plan view, for example, corresponds to a package which includes a flip chip 120 mounted on a package substrate 110 with first and second line levels 130 and 150 as indicated by the arrows. The conductive traces on the different levels are interconnected by via contacts on a via level 140. The plan view shows the overlay of first and second or more conductive traces. The flip chip, for example, is arranged in a BGA format having 9 die contacts 126. Although shown is package with a flip chip die, the overlap of the first and second conductive traces also can be employed for a wire bonded die. It is understood that other pattern of conductive traces may be employed for the different line levels, depending on the application, such as pattern of the package contacts and type of die or dies.

FIG. 3 shows another embodiment of a device 300. The device, as shown, is similar to the device as described in FIG. 1a. As such, common elements may not be described or described in detail. The device includes a die 120 mounted on a die region of a package substrate 110. The die, as shown, may be coupled to contact pads 160 disposed on the periphery of the die region on the first surface of the package substrate by wire bonds. In other embodiments, the die may be a flip chip coupled to contact pads in the die region.

The package substrate includes additional die regions. As shown, the package substrate includes one additional die region. Providing other number of additional die regions may also be useful. The additional die region accommodates an additional die. In one embodiment, the additional die region accommodates a surface mount (SMT) device 320. The SMT device, for example, includes active or passive device. The SMT device is coupled to contact pads on the package substrate. In other embodiments, the additional die region accommodates other types of dies. For example, the additional die region may accommodate a wire bond type of die or a flip chip. The package may include a cap 190 which encapsulates the dies. The cap, for example, comprises a molding compound. The cap provides protection against the environment.

Figure 4A:
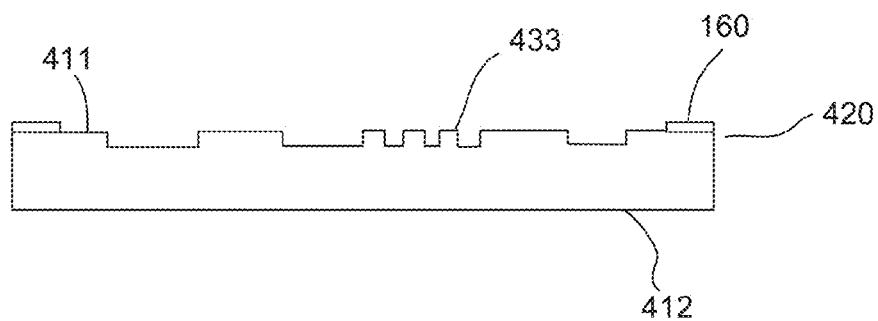

FIG. 4a-1 show an embodiment of a method for forming a semiconductor package 400. Referring to FIG. 4a, a base carrier or leadframe 420 is provided. The base carrier comprises a conductive substrate having first and second major surfaces 411 and 412. The conductive substrate, for example, comprises copper. Other types of conductive materials may also be useful. The first major surface of the base support carrier, in one embodiment, is patterned to create a topography which defines conductive lines or traces that permit routing of signals under the die attach region, as well as areas outside of the die attach region. For example, the first major surface of the base carrier is patterned to define the first conductive traces of a first line level. For example, mesas 433 define conductive traces of the first line level separated by recesses or trenches. The thickness of a line level, for example, may be about 5 to 50 μm. Other thickness dimensions may also be useful, depending on design and performance requirements. A bulk portion of the base substrate remains.

Patterning of the first major surface may be achieved using, for example, mask and etch techniques. The etch, for example, includes a wet etch. Other techniques for patterning the first major surface may also be useful. The patterned base carrier, for example, serves as a base leadframe carrier.

The patterning of the first major surface also defines location of contact pads. In one embodiment, a conductive layer is formed on the conductive substrate in the location of the contact pads to form contact pads 160. A contact pad, for example, comprises a metal layer. The contact pads may be formed, in one embodiment, by plating. Other techniques or materials for forming the contact pads may also be useful.

The base carrier includes a die region defined on which a die is attached. In one embodiment, the contact pads are disposed on a periphery of the die region. Providing contact pads on the periphery of the die region, for example, facilitate wirebonds between the carrier and a die mounted on the die region. Other configurations of contact pads may also be useful. For example, the contact pads may be disposed in the die attach region for mounting for a flip chip type of die.

In some embodiments, the partially processed base carrier, as shown, may be provided by a base leadframe supplier. The partially processed base carrier will then be further processed by the customer of the leadframe supplier to complete the package.

Figure 4B:
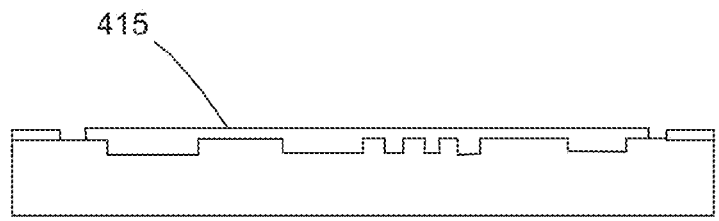

As shown in FIG. 4b, a dielectric layer 415 is formed on the first major surface of the base carrier. The dielectric layer fills the recesses and covers the conductive lines. The dielectric layer leaves the contact pads 160 exposed to facilitate electrical connections to the die. In one embodiment, the dielectric layer comprises polymer, solder mask or dielectric composite materials. The dielectric layer, for example, may be formed on the first major surface by printing, such as screen or stencil printing, lamination or spin on techniques. Other techniques or materials may also be useful to form the dielectric layer. The dielectric layer helps to improve the structural strength of the base carrier prior to die attach.

Figure 4C:
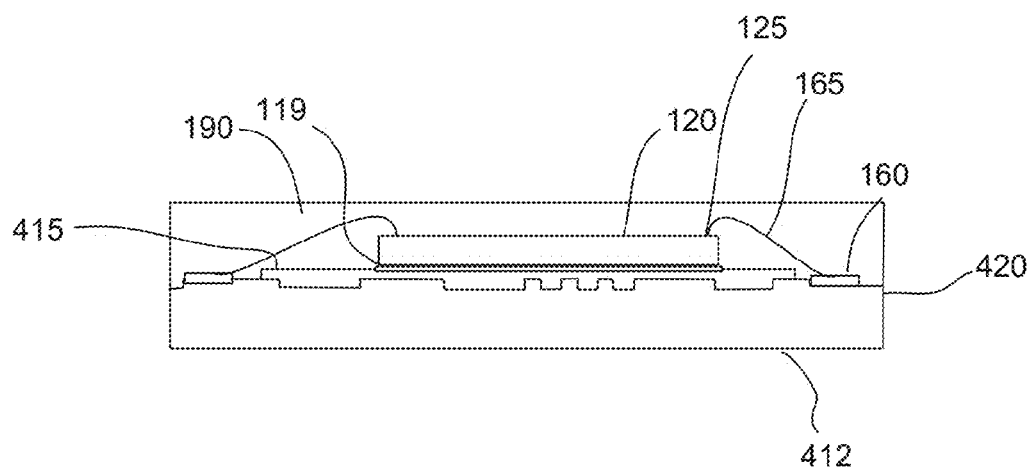

Referring to FIG. 4c, a die 120 is attached to the die region of the base carrier. In one embodiment, an adhesive 119 may be used to mount the die to the base carrier. The adhesive, for example, may comprise an adhesive paste or die attach film, such as tape. Other types of adhesives, such as epoxy, may also be useful. Wirebonds 165 are formed to create electrical connection between contact pads on the carrier and bond pads 125 on the die. A cap 190 is formed over the die and first surface of the base carrier. The cap provides protection against the environment. The cap, for example, comprises a mold compound. The cap may be formed by, for example, transfer, compression or injection molding. Other techniques or materials may also be useful to form the cap.

As described, a wirebond type of die is attached to the base carrier. In other embodiments, a flip chip type of die is attached to the base carrier. In the case of a flip chip, it includes die contacts on a surface thereof. The die contacts are mated to contact pads disposed in the die region on the base carrier. The die contacts and contact pads are reflowed to form electrical connections. An underfill material may be provided between the die and base carrier. The underfill material, for example, includes an epoxy-based polymeric material. The underfill material encapsulates and protects the die contacts.

Figure 4D:
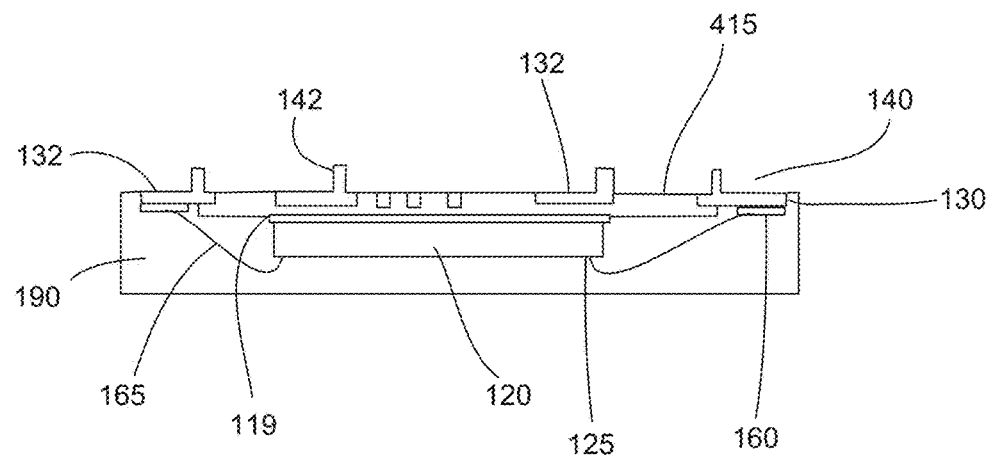

In FIG. 4d, the second major surface of the base carrier is processed. In one embodiment, the second major surface of the base carrier is cleaned. For example, the clean comprises a wet clean or a plasma clean to remove oxide. The second major surface is patterned to remove excess material. For example, the bulk material is removed up to the surface of the dielectric layer 415. This forms conductive lines 132 of the first line level 130. Additionally, patterning of the base carrier also forms via contacts or posts 142 of a first via level 140.

The second major surface may be patterned or removed using mask and etch, grinding or polishing techniques. The etch, for example, includes a wet etch. Other techniques for patterning the second major surface may also be useful.

Figure 4E:
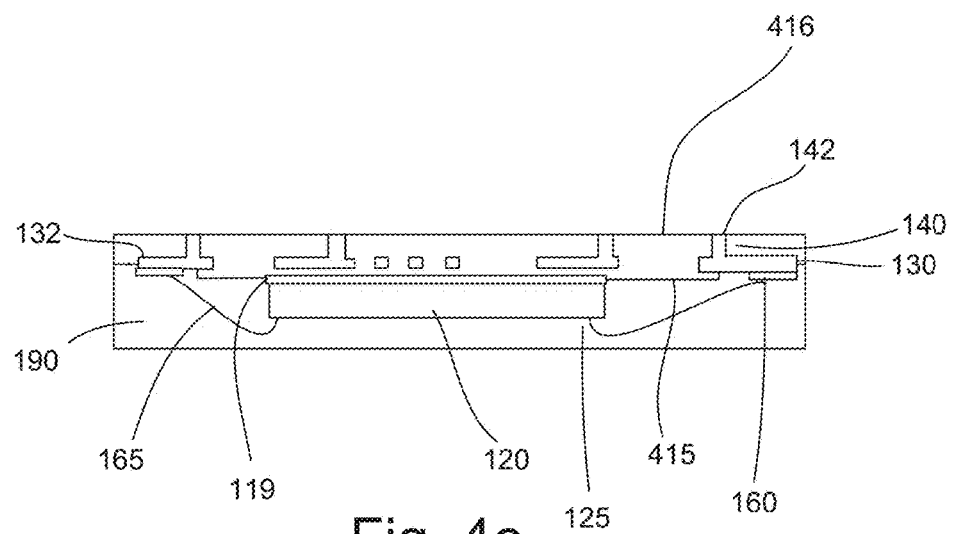

Referring to FIG. 4e, a dielectric layer 416 is formed on the base carrier. The dielectric layer is formed on the patterned second surface of the base carrier. In one embodiment, the dielectric layer comprises polymer, solder mask or dielectric composite materials. The dielectric layer may be formed by, for example, printing, lamination or spin on techniques. Other techniques or dielectric materials may be used to form the dielectric layer. The top of the via contacts, for example, are exposed. This forms the carrier substrate with first metal line level and first via level.

As described, the patterning of the base carrier is performed after the molding (post-mold) process to form the cap. The cap may advantageously serve to provide structural support to facilitate the packaging process.

Figure 4F:
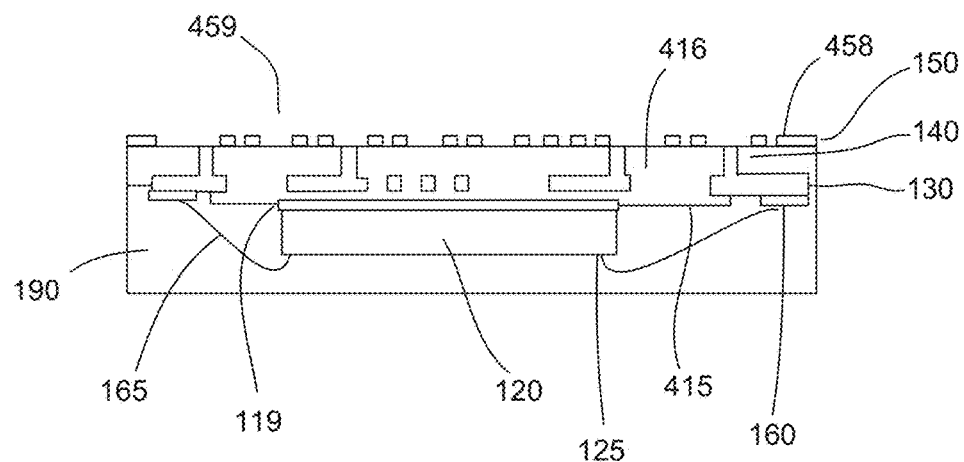

In one embodiment, as shown in FIG. 4f, the process continues to form a second line level 150 of a carrier substrate. In one embodiment, the second line level is formed by forming a second line level mask on the base carrier with openings 459 corresponding to the second conductive traces of the second line level. The openings, for example comprise trench openings which correspond to the second conductive traces. The second line level mask 458, for example, comprises a patterned photoresist layer.

Figure 4G:
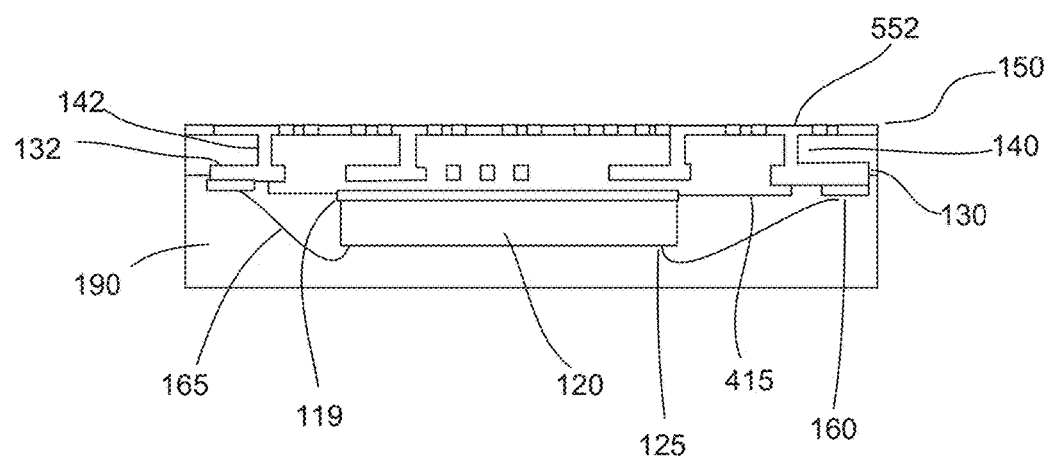

Referring to FIG. 4g, the openings in the mask is filled with a conductive material 552. In one embodiment, the mask openings are filled with copper. Other types of conductive materials may also be useful. The conductive material, in one embodiment, is selectively filled. For example, mask opening is selectively filled by plating.

Figure 4H:
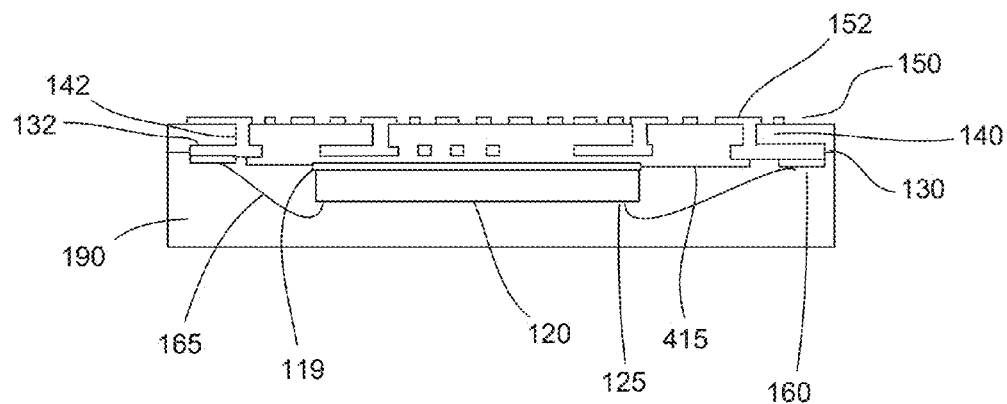

In FIG. 4h, the mask is removed, leaving second conductive traces 152 on the surface of the substrate above the dielectric layer. The mask, for example, may be removed by ashing. Other techniques for removing the mask may also be useful.

Figure 4I:
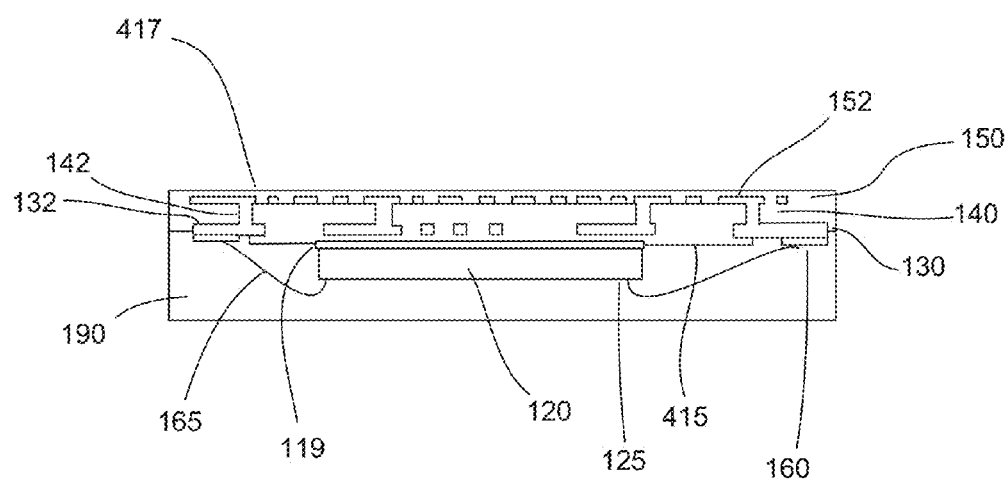

As shown in FIG. 4i, a dielectric layer 417 is deposited on the carrier substrate, filling the spaces between and covering the second conductive traces. The dielectric layer, for example, comprises polymer, solder mask or dielectric composite materials. To form the dielectric layer, printing, lamination or spin on techniques may be employed. Other types of dielectric materials or techniques may be used to form the dielectric layer. The dielectric should be sufficiently thick to cover the conductive traces. Covering the conductive traces by other thicknesses may also be useful.

Figure 4J:
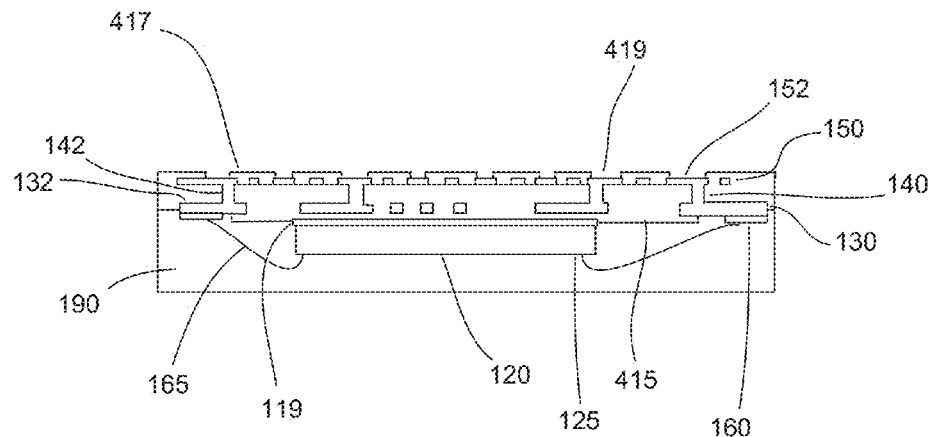

Referring to FIG. 4j, the dielectric layer is patterned to form openings 419 to expose portions of the second conductive traces. The openings correspond to locations of package contacts of the package. The patterned dielectric layer serves as a package mask for subsequently forming package contacts in the openings.

Figure 4K:
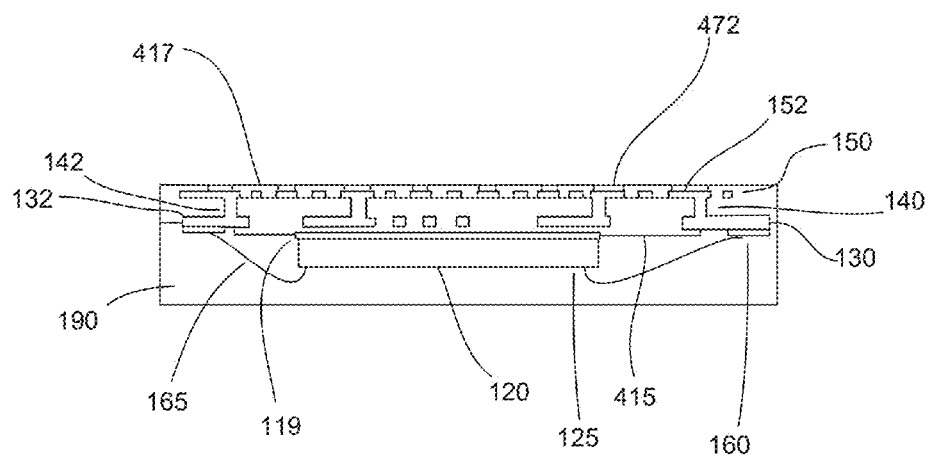
Figure 4I:
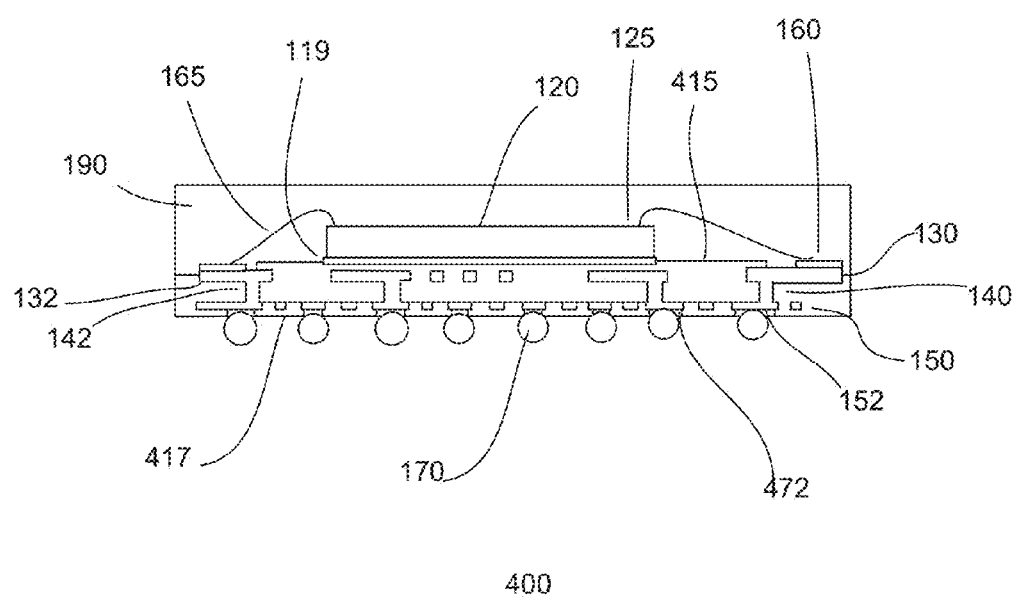

In one embodiment, package pads 472 are formed on the exposed portions of the conductive traces within the opening, as shown in FIG. 4k. In one embodiment, the package pads comprise a conductive material. In one embodiment, the package pads are selectively formed in the openings of the dielectric layer by plating techniques. The package pads, in one embodiment have a top surface at or below a top surface of the package mask layer.

Referring to FIG. 4l, package contacts 170 are formed in the openings of the package mask. For example, the package contacts are formed on the package pads in the openings of the package mask. The package contacts, for example, may comprise spherical shaped structures or balls arranged in grid pattern to form a BGA type package. Other types of package contacts, such as solder lands, flat shaped contacts or conductive pads may be used. The package contacts, for example, can be formed from solder, Ni—Au, Cu—OSP or ENEPIG materials. The package contacts may comprise various types of solder. In other embodiments, non-lead based package contacts may also be used.

Figure 5A:
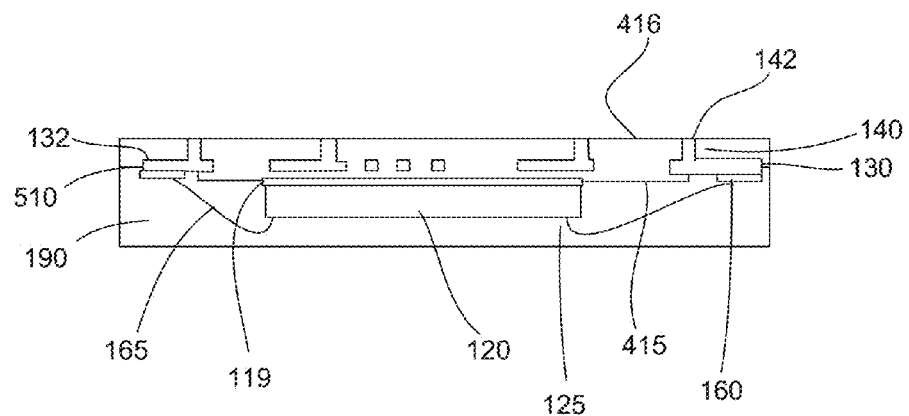
Figure 5B:
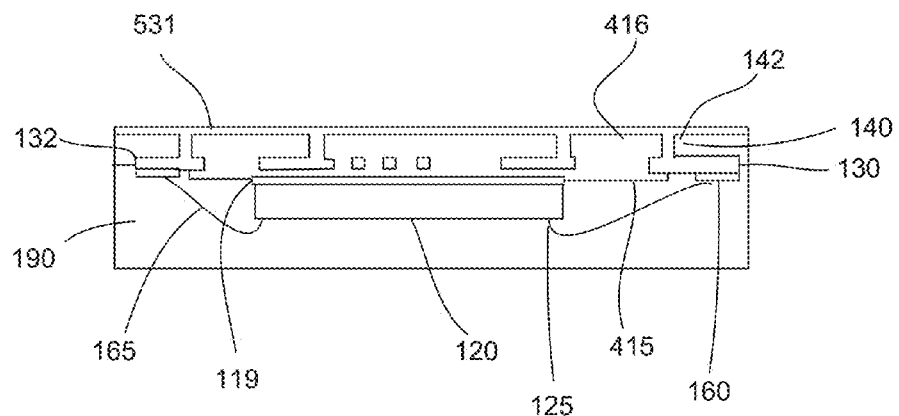
Figure 5C:
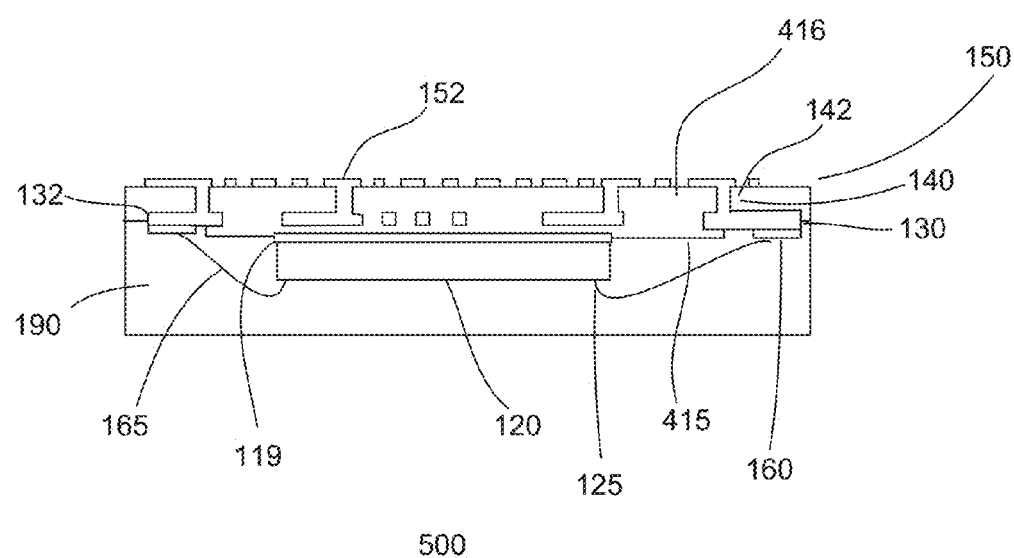

FIGS. 5a-c show another embodiment of a process for forming a semiconductor package 500. Referring to FIG. 5a, a partially processed base carrier substrate 510 is provided. The base carrier substrate is at the stage of processing as described in FIG. 4e. For example, a die 120 is mounted on the first major surface of the carrier substrate and first conductive line 130 and via 140 levels with first conductive traces 132 and first via contacts 142 are formed. A dielectric layer 416 isolates the conductive traces and via contacts and has a top surface which is coplanar with the top surface of the first via contacts.

Referring to FIG. 5b, the process continues to form the second conductive traces of the second conductive line level. In one embodiment, a conductive layer 531 is formed on the second surface of the partially processed carrier substrate. The conductive layer, for example comprises copper. The conductive layer may be formed by, for example, lamination techniques. The thickness of the conductive layer is about the thickness of the second conductive traces. For example, the thickness of the conductive layer may be about 5 to 50 µm. Other materials or techniques for forming the conductive layer may also be useful.

In FIG. 5c, the conductive layer is patterned to form second conductive traces 152. Patterning of the conductive layer can be achieved by mask and etch techniques. The etch, for example, includes a wet etch. Other techniques for patterning the conductive layer may also be useful. The process continues as described in FIG. 4h and onwards.

Figure 6A:
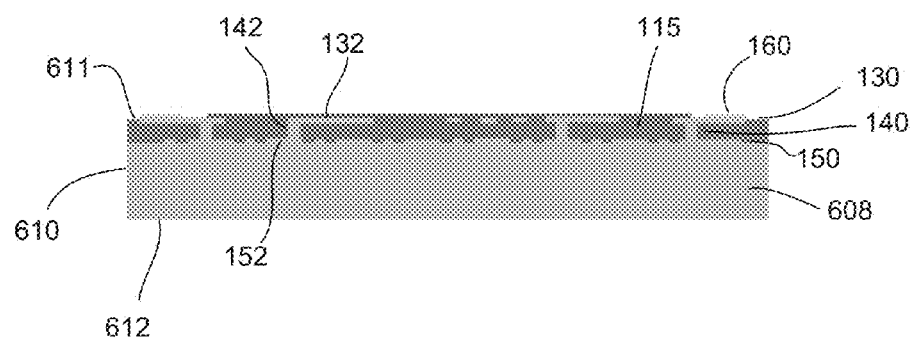

FIGS. 6a-d show another embodiment of a process for forming a semiconductor package 600. Referring to FIG. 6a, a partially processed support carrier 610 is provided. The partially processed support carrier includes first and second major surfaces 611 and 612. The partially processed support carrier includes a base carrier or lead frame 608. The base carrier comprises a conductive material. For example, the base carrier comprises copper. Other types of conductive materials may also be useful.

The first major surface of the base carrier, in one embodiment, is patterned to create a topography which defines conductive traces of a line level. In one embodiment, the first major surface is patterned to define second conductive traces of a second line level 150. For example, mesas define conductive traces of the line level separated by recesses or trenches. A bulk portion of the base substrate remains. In one embodiment, patterning of the first major surface also forms via contacts 142 of a first via level 140 coupled to the conductive traces. Forming the via contacts in a separate patterning process may also be useful.

Patterning of the first major surface may be achieved using, for example, mask and etch techniques. The etch, for example, includes a wet etch. Other techniques for patterning the first major surface may also be useful. The patterned base carrier, for example, serves as a base leadframe carrier.

In one embodiment, a first line level 130 with first conductive traces 132 is disposed in a dielectric layer 115 on the first major surface of the base carrier. The first conductive traces may comprise copper while the dielectric layer comprises polymer, solder mask or dielectric composite materials. Other types of materials for the first conductive traces and dielectric layer may also be useful. The dielectric layer covers the traces, except the contact pads.

The first conductive traces include contact pads 160. In one embodiment, a contact pads comprises a conductive layer disposed on the second conductive traces. A contact pad, for example, comprises a metal, such as Ni, Au, Cu or Pd. Other types of materials may also be useful. The contact pads may be plated to the second conductive traces.

In some embodiments, the partially processed support carrier, as shown, may be provided by a leadframe supplier. The partially processed support carrier will then be further processed by the customer (or package manufacturer) of the leadframe supplier to complete the package. In other embodiments, the partially processed support carrier may be processed by the package manufacturer.

The base carrier includes a die region defined on the surface of the dielectric layer on which a die is attached. In one embodiment, the contact pads are disposed on a periphery of the die region. Providing contact pads on the periphery of the die region, for example, facilitate wirebonds between the carrier and a die mounted on the die region. Other configurations of contact pads may also be useful. For example, the contact pads may be disposed in the die attach region for mounting for a flip chip type of die.

Figure 6B:
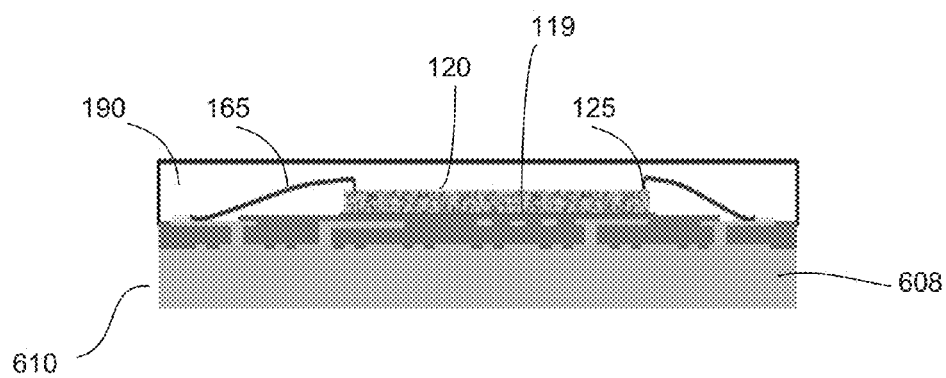

Referring to FIG. 6*b*, a die 120 is attached to the die region on the base carrier. In one embodiment, an adhesive 119 may be used to mount the die to the base carrier. The adhesive, for example, may comprise an adhesive paste or die attach film, such as tape. Other types of adhesives, such as epoxy, may also be useful. Wirebonds 165 are formed to create electrical connection between contact pads on the carrier and bond pads 125 on the die. A cap 190 is formed over the die and first surface of the base carrier. The cap provides protection against the environment. The cap, for example, comprises a mold compound. The cap may be formed by, for example, transfer, compression or injection molding using a mold. Other techniques or materials may also be useful to form the cap.

As described, a wirebond type of die is attached to the base carrier. In other embodiments, a flip chip type of die is attached to the base carrier. In the case of a flip chip, it contacts die contacts on a surface thereof. The die contacts are mated to contact pads disposed in the die region on the base carrier. The die contacts and contact pads are reflowed to form electrical connections. An underfill material may be provided between the die and base carrier. The underfill material, for example, an epoxy-based polymeric material. The underfill material encapsulates and protects the die contacts.

Figure 6C:
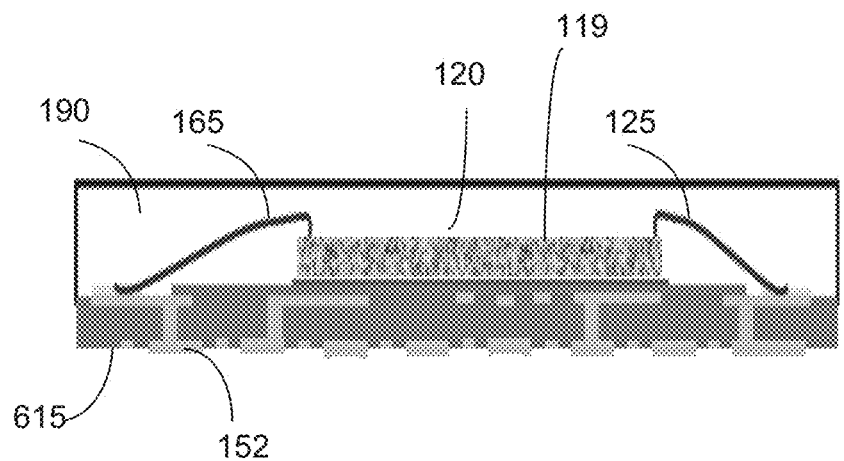

In FIG. 6*c*, the second major surface of the base carrier is processed. In one embodiment, the second major surface is patterned to remove excess material. For example, the bulk material is removed up to the surface of the dielectric layer 615. This forms second conductive traces 152 of the second line level 150. The second major surface may be patterned using an etch back process. For example, the etch includes a wet etch. Other techniques may also be useful.

Figure 6D:
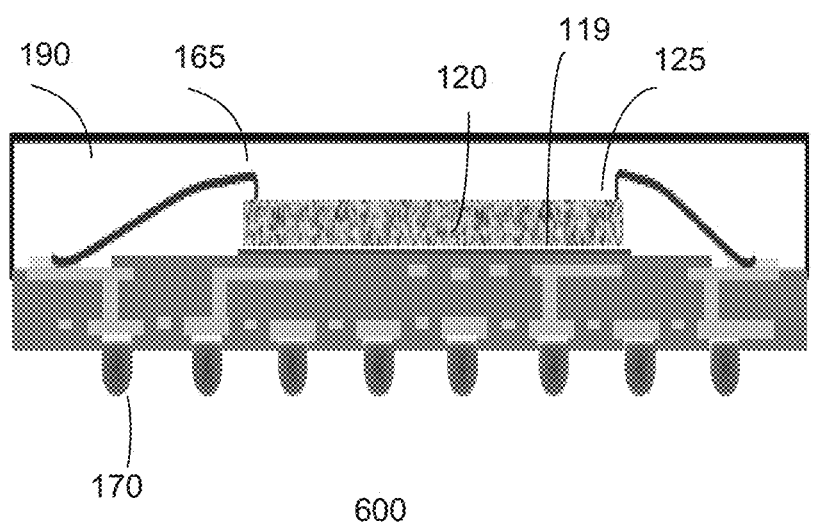

The process continues, in one embodiment, to form package contacts 170 on the second surface of the base carrier substrate, as shown in FIG. 6*d*. The process, for example, may be similar to that described in FIG. 4*i* and onwards. For example, the process continues by forming a package mask on the second surface, forming package pads and package contacts.

Although the process of FIGS. 6*a*-*c* is described in the context of a wirebond die, it can be modified for forming a package with a flip chip. The process can be applied to forming a package with SMT devices, stacked dies or a combination thereof, including non-stacked dies.

Figure 7A:
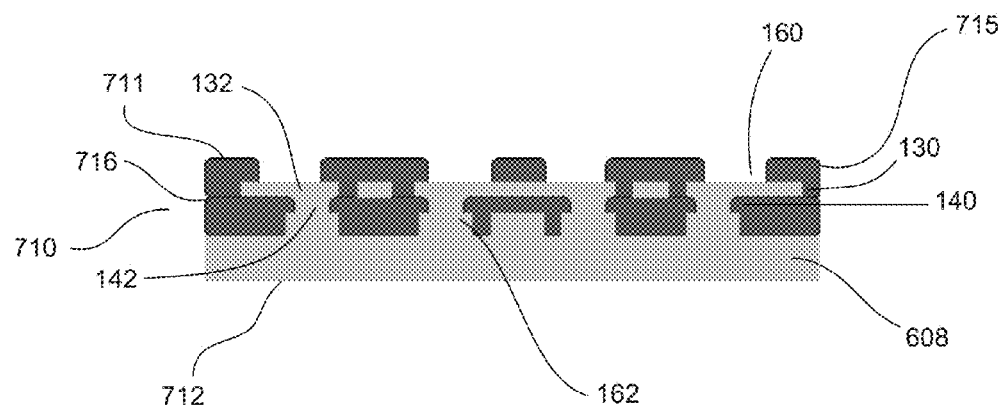

FIGS. 7*a*-*d* show another embodiment of a process for forming a semiconductor package 700. Referring to FIG. 7*a*, a partially processed support carrier 710 is provided. The partially processed support carrier includes first and second major surfaces 711 and 712. The partially processed support carrier includes a base carrier or lead frame 608. The base carrier comprises a conductive material. For example, the base carrier comprises copper. Other types of conductive materials may also be useful.

The first major surface of the base carrier, in one embodiment, is patterned to create a topography which defines conductive traces of a line level. In one embodiment, the conductive traces are intermediate conductive traces 162 of an intermediate level. For example, mesas define intermediate conductive traces of the intermediate line level separated by recesses or trenches. A bulk portion of the base substrate remains. In one embodiment, patterning of the first major surface also forms via contacts 142 of a via contact level 140 coupled to the intermediate conductive traces. Forming the via contacts in a separate patterning process may also be useful.

Patterning of the first major surface may be achieved using, for example, mask and etch techniques. The etch, for example, includes a wet etch. Other techniques for patterning the first major surface may also be useful. The patterned base carrier substrate, for example, serves as a base leadframe carrier.

A first line level 130 with first conductive traces 132 is disposed in a dielectric layer 715 on the first major surface of the base carrier. The first conductive traces may comprise copper while the dielectric layer comprises polymer, solder mask or dielectric composite materials. Other types of materials for the second conductive traces and dielectric layer may also be useful.

The first conductive traces include contact pads 160. In one embodiment, contact pads comprise a conductive layer disposed on the first conductive traces. A contact pad, for example, comprises a metal, such as Ni, Au, Cu or Pd. Other types of materials may also be useful. The contact pads may be plated to the intermediate conductive traces. In one embodiment, the contact pads are disposed in an opening in the dielectric layer in a die region for coupling with a flip chip die. Other configurations of contact pads, such as disposing them in the periphery of a die region for coupling with a wirebond die may also be useful.

In some embodiments, the partially processed support carrier, as shown, may be provided by a leadframe supplier. The partially processed support carrier will then be further processed by the customer (or package manufacturer) of the leadframe supplier to complete the package. In other embodiments, the partially processed support carrier may be processed by the package manufacturer. For example, the partially processed support carrier may be processed by patterning the first surface of the base carrier to form intermediate conductive lines and first via contacts, forming a dielectric layer 716 on the first surface of the base carrier which covers the intermediate conductive lines and first via contacts by printing, lamination or spin on techniques, and forming first conductive traces over the dielectric layer and dielectric layer therebetween. The first conductive traces may be formed over the dielectric layer by techniques as previously described. Other techniques of forming the via and contact levels may also be useful.

Figure 7B:
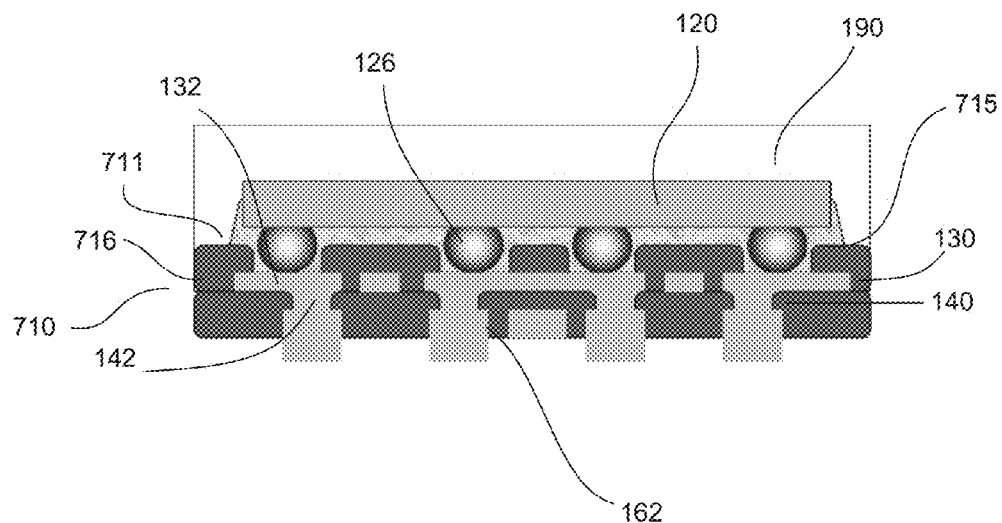

Referring to FIG. 7*b*, a die 120 is attached to the die region of the support carrier. As shown, a flip chip die is attached to the die region. For example, the die contacts 126 are mated to the contact pads in the die region of the base carrier. An underfill material may be provided between the die and base carrier. The underfill material, for example, includes an epoxy-based polymeric material. The underfill material encapsulates and protects the die contacts. Attaching other types of dies, such as a wirebond die may also be useful.

A cap 190 is formed over the die and first surface of the base carrier. The cap provides protection against the environment. The cap, for example, comprises a mold compound. The cap may be formed by, for example, transfer, compression or injection molding. Other techniques or materials may also be useful to form the cap. In some embodiment, the mold compound may serve as an underfill to fill the gaps between the die and support carrier.

As described, a flip chip die is attached to the base carrier. In other embodiments, a wirebond type of die is attached to the base carrier as described previously.

Figure 7C:
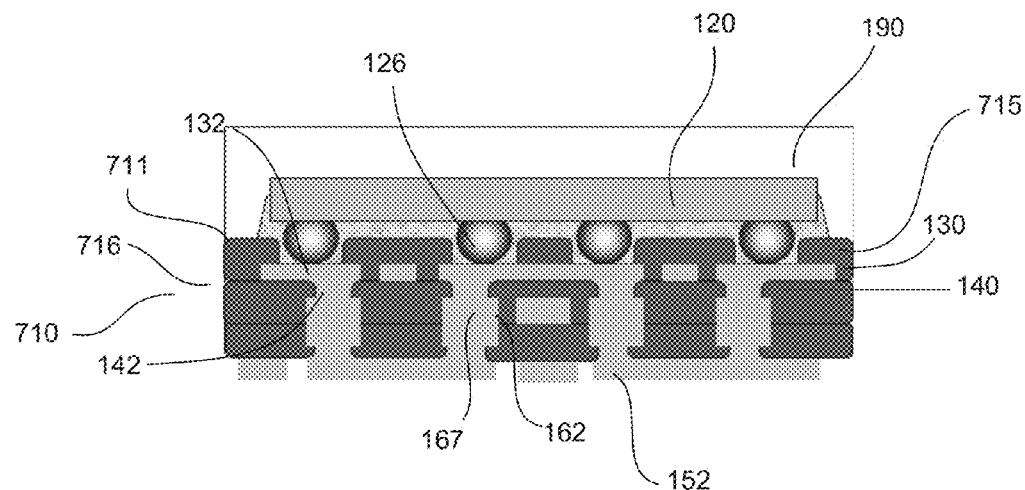

In FIG. 7c, the second major surface of the base carrier is processed. The second major surface is patterned to remove excess material. In one embodiment, the bulk material is partially removed. For example, the bulk material is partially removed to the height of an intermediate via level. Partially removing the bulk material may be achieved by, for example, using an etch back process. The etch, for example, includes a wet etch.

The partially reduced bulk material is selectively patterned to form intermediate via contact 167 of an intermediate via level. Mask and etch processes may be employed to form the intermediate via contacts and intermediate conductive traces 162 of the intermediate line level.

Figure 7D:
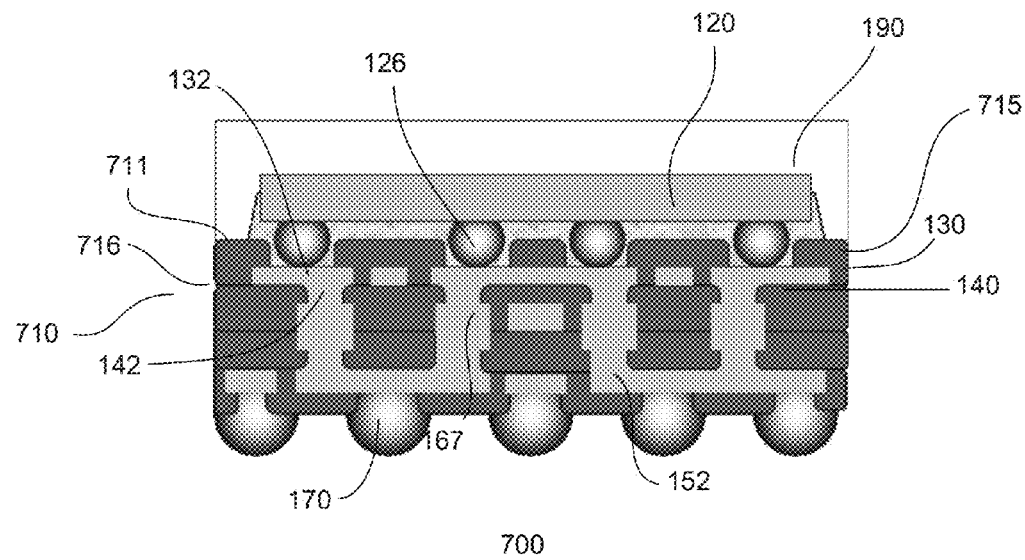

The process continues to form conductive traces, as shown in FIG. 7c. In one embodiment, the process continues to form second conductive traces 152 of a second conductive level 150. The conductive traces may be formed by techniques as described in FIGS. 4f-i or as described in FIGS. 5b-c. A dielectric layer may be formed to cover portions of the second conductive traces. Package contacts 170 are formed on the second surface of the carrier substrate, as shown in FIG. 7d. The package contacts may be formed by a process, for example, similar to that described in FIG. 4i and onwards. For example, the process continues by forming a package mask on the second surface, forming package pads and package contacts.

Although the process of FIGS. 7a-d is described in the context of a flip chip die, it can be modified to form a package with a wirebond die. The process can also be applied to forming a package with SMT devices, stacked dies or a combination thereof, including non-stacked dies.

FIGS. 8a-e show embodiments of a semiconductor package 1800. The package includes a package substrate 110. The package substrate includes first and second major surfaces 111 and 112. The first major surface, for example, may be referred to as the top surface and the second major surface, for example, may be referred to as the bottom surface. Other designations for the surfaces may also be useful. In one embodiment, the top surface includes a chip region on which a die 120 is mounted.

In one embodiment, package contacts 170 are provided on the bottom surface. The package contacts serve as external package connections. For example, the package contacts can be electrically coupled to an external device (not shown), such as a circuit board. The package contacts may comprise spherical shaped structures or balls arranged in a grid pattern to form a BGA type package. Other types of package contacts, such as solder lands, flat shaped contacts or conductive pads, may be used. The package contacts, for example, can be formed from solder. Various types of conductive materials may be used. For example, the package contacts may be formed from solders, such as lead-based or non lead-based solders. Other types of materials, such as Cu—OSP, Ni—Au, alloys or conductive polymers, may also be used. Bottom package pads can be provided on which the package contacts are disposed. Arranging the contacts in other patterns or providing other types of contacts are also useful.

On the top surface of the substrate are disposed contact pads 160. The contact pads, for example, comprise a conductive material. The contact pads may, in one embodiment, comprise Ni, Au, Cu or Pd. Other types of conductive materials may also be useful. The contact pads are electrically coupled to the die.

Figure 8A:
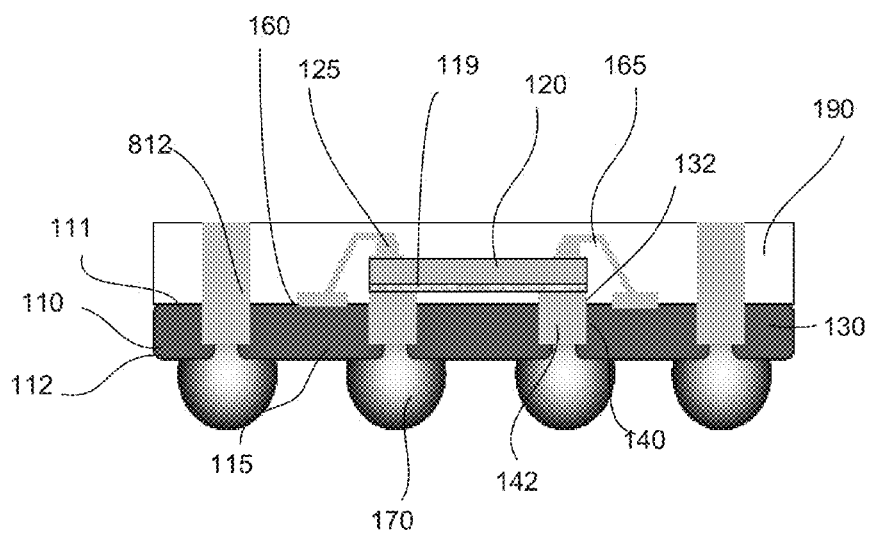
FIGS. 8a-e show various embodiments of a semiconductor package.
Figure 8B:
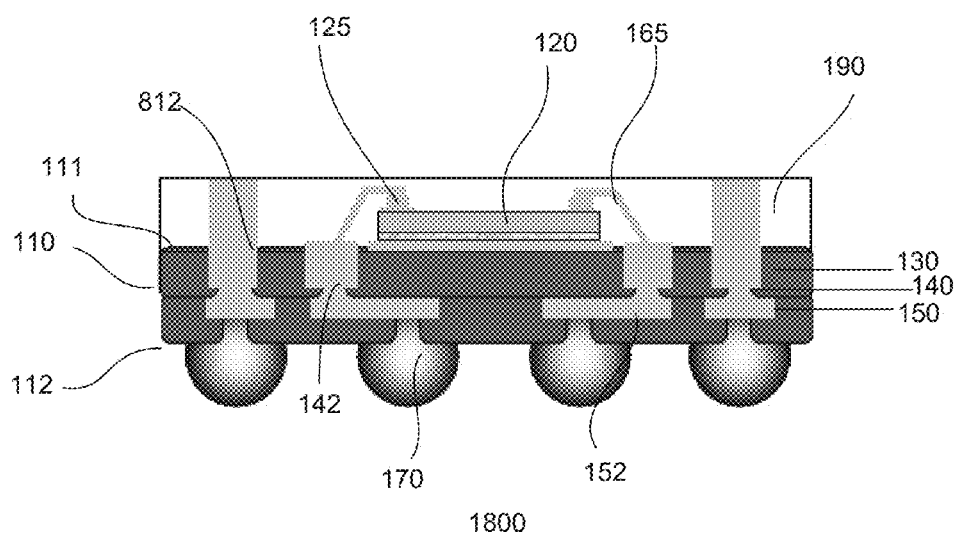
Figure 8C:
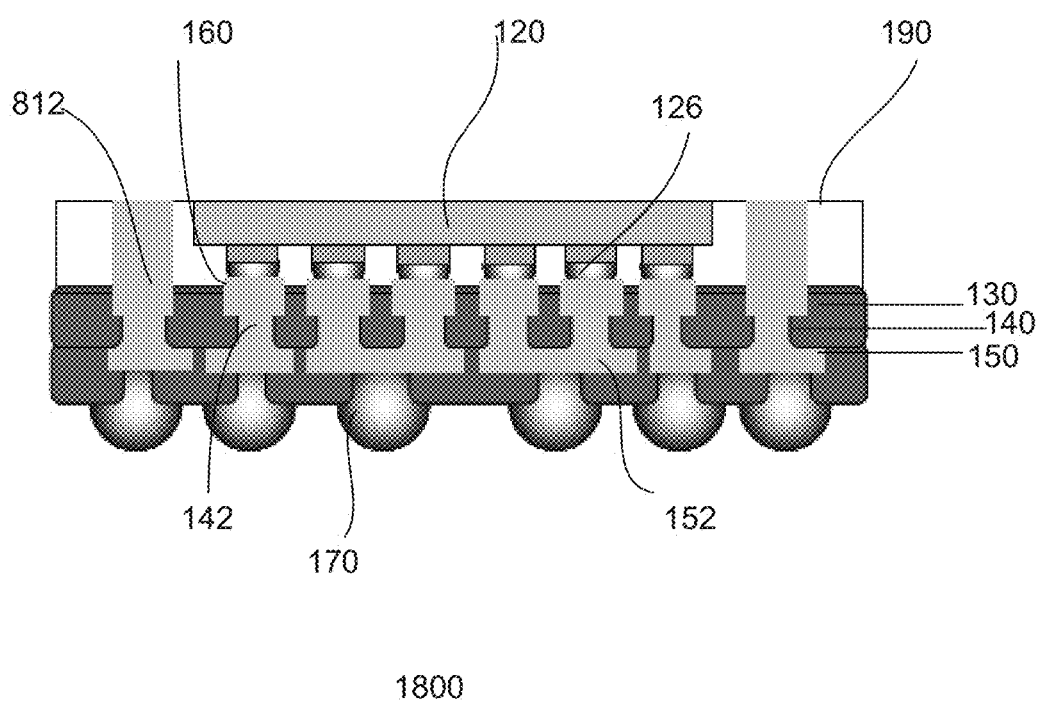
Figure 8D:
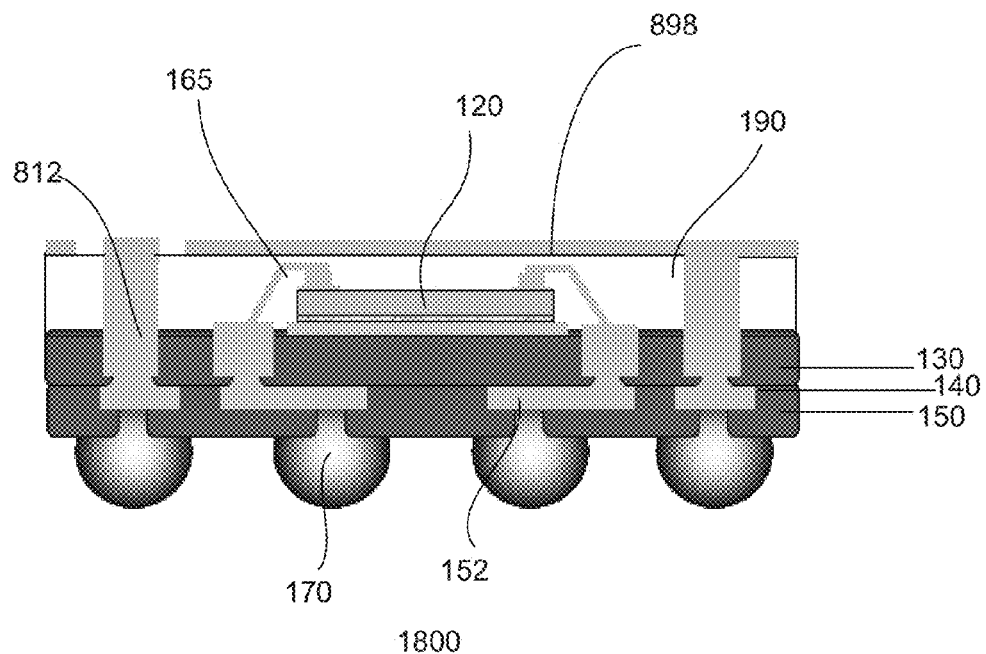

In the case of a wire bond die, as shown in FIGS. 8a, 8b and 8d, the contact pads are disposed on the periphery of the chip region. Wire bonds 165 are provided to couple the bond pads 125 on the die to contact pads on the package substrate. The bond pads are provided on, for example, an active top surface of the die. The die may be mounted on the package substrate by an adhesive 119. The adhesive may be an adhesive paste or an adhesive tape. Other types of adhesives may also be useful.

Figure 8E:
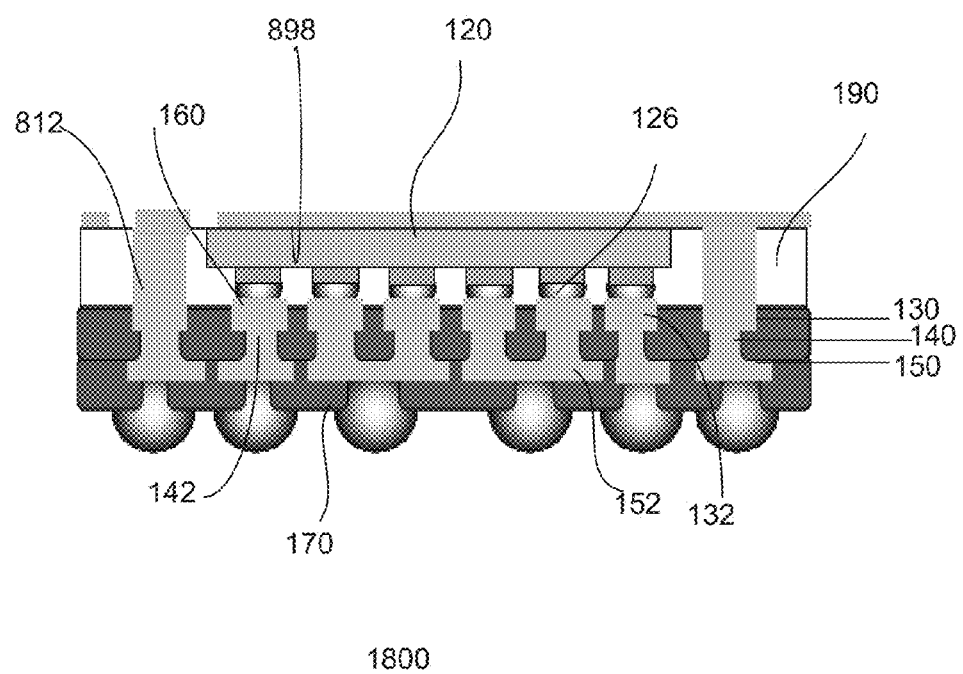

In another embodiment, a flip chip having die contacts 126 on an active surface of the die is mounted onto the chip region, as shown in FIGS. 8c and 8e. The contact pads, in the case of a flip chip application, are disposed in the chip region. The contact pads are configured to match the pattern of the die contacts of the flip chip. An underfill, such as an epoxy-based polymeric material, may be provided in the space between the die and package substrate. Alternatively, no underfill is provided between the die and carrier substrate.

Referring back to FIGS. 8a-e, the contact pads are coupled to the package contacts for providing electrical connection to the die. The package may include a cap 190 which encapsulates the die. The cap, for example, comprises a mold compound. The cap provides protection against the environment.

The package substrate includes a base carrier such as a conductive leadframe. The leadframe may comprise, for example, copper. Other types of conductive materials may also be useful for the leadframe. In one embodiment, the leadframe comprises a patterned leadframe. The patterned leadframe defines a conductive line level and via level which allows routing of signals under the die attach region, as well as areas outside of the die attach region. In one embodiment, the patterned leadframe defines a first line level 130 and a first via level 140. The first line level includes first conductive traces 132. In one embodiment, the first conductive traces are proximate to the top surface of the package substrate and coupled to the contact pads. The first via level comprises first via contacts 142 which coupled to the first conductive traces.

In one embodiment, as shown in FIG. 8a, the first via contacts are coupled to the package contacts on the second surface of the carrier substrate. For example, the first via contacts may extend from the first line level to the second surface of the package substrate to couple to the package contacts. In one embodiment, the first via contacts couple first conductive traces to respective package contacts. Other configurations of via contacts may also be useful.

In other embodiments, as shown in FIGS. 8b-e, a second line level 150 is provided in the package substrate. The second line level, for example, serves as the bottom line level. The second line level includes second conductive traces 152 which are coupled to the package contacts. For example, the first via contacts may extend from the first line level to the second line level, coupling the first conductive traces to the second conductive traces. In one embodiment, the first via contacts couple first conductive traces to respective second conductive traces. Other configurations of via contacts may also be useful.

In one embodiment, the second line level comprises a material separate from the lead frame. For example, the second line level comprises a built-up conductive layer of the lead frame. The second line level, for example, may comprise copper. Other types of conductive materials may also be used to form the second line level.

The package substrate includes a dielectric layer 115. The dielectric isolates the conductive and via levels. The dielectric layer, for example, comprises polymer, solder mask or dielectric composite materials. Other types of dielectric materials may also be useful. The dielectric layer, in one embodiment, may serve as the top surface of the carrier substrate, with openings for the contact pads.

In yet other embodiments, one or more intermediate line levels may be provided between the first and second line levels (not shown). The intermediate line levels include intermediate conductive traces interconnected by intermediate via levels.

In one embodiment, the package includes package-on-package (PoP) contacts 812 extending from the top of the cap to the package substrate. In one embodiment, the PoP contacts are part of the patterned leadframe of the package substrate. In other embodiments, the PoP contacts are not part of the patterned leadframe. For example, the PoP contacts may comprise a plated conductive material, such as copper. The conductive material may be an electrolytic or electroless plated conductive material on top of the patterned lead frame. The PoP contacts, for example, are formed on the same side of the die attach region, allowing PoP contacts and the die to be encapsulated in a standard size mold in later processing. In one embodiment, the PoP contacts facilitate stacking of additional devices or packages thereon to form a 3D package. The PoP contacts provide electrical connections from the bottom package to the top package. The PoP contacts are coupled to the package contacts on the bottom surface of the package substrate via conductive traces and via contacts. Depending on the application, the conductive traces and via contacts may be from one or more levels.

In some embodiments, as shown in FIGS. 8d-e, a heat dissipater 898 is disposed on the surface of the cap. The heat dissipater, in one embodiment, includes a conductive material which has good thermal conduction properties. For example, the heat dissipater comprises copper. Other heat dissipating materials may also be useful. The heat dissipaters, for example may be coupled to a PoP contact. The heat dissipater transfers the heat through the PoP contacts to the mother board or PCB or to the top package that are stacked on the package. The heat dissipater may also act as an electrical shield, for example, RF grounding to prevent electromagnetic radiation. In some embodiments, a plurality of heat dissipaters may be disposed on the surface of the cap. The heat dissipaters may be coupled to different PoP contacts.

Figure 9A:
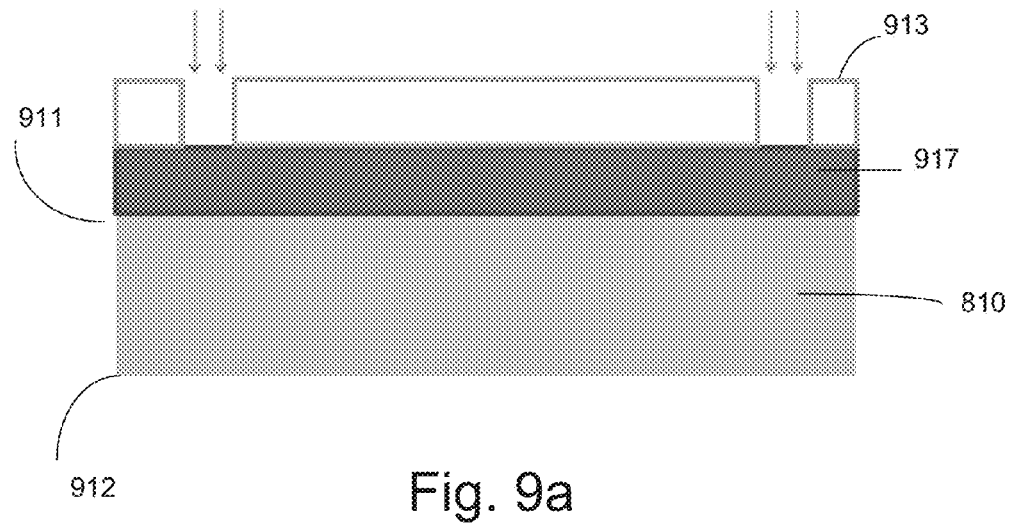
FIGS. 9a-j and FIG. 10a-c show various embodiments of a method for forming a semiconductor package.

FIGS. 9a-j show another embodiment of a method for forming a semiconductor package. Referring to FIG. 9a, a base carrier or a lead frame 810 is provided. The base carrier comprises a conductive substrate having first and second major surfaces 911 and 912. The conductive substrate, for example, comprises copper. Other types of conductive materials may also be useful. A soft mask 917 is formed on a first surface of the base carrier. The mask, for example, comprises photoresist. Other types of mask may also be useful. In some embodiment, an anti-reflective coating may be disposed beneath the photoresist to enhance image resolution.

Figure 9B:
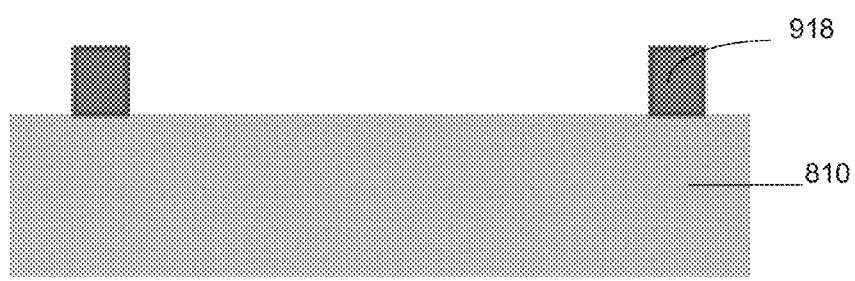

In FIG. 9b, the mask is patterned to form posts 918 on the first surface of the support carrier. Patterning of the mask, for example, may be achieved by selectively exposing it with an exposure using a photo mask. The exposed resist is developed, transferring the pattern of the photo mask 913 to the resist. For example, depending on whether the resist is a positive or negative resist, the exposed or unexposed regions are removed by the development process.

Figure 9C:
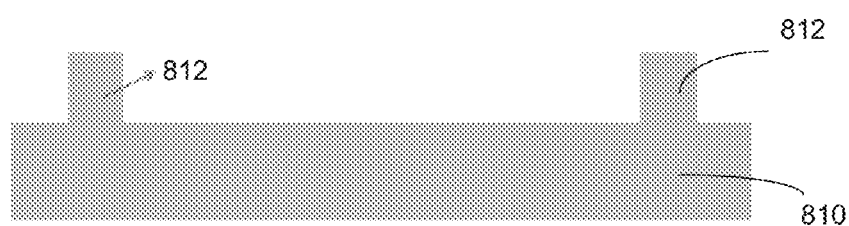

As shown in FIG. 9c, the first surface of the base carrier is patterned using the resist mask as an etch mask. For example, a wet etch is performed to partially remove exposed portions of the base carrier. Other techniques may also be useful. In one embodiment, the etch forms PoP contacts or posts 812 on the first surface of the base carrier. The base carrier is etched to form PoP posts of the desired height. The height, for example, should be sufficient to accommodate the cap which is used to encapsulate the die subsequently mounted onto a die attach region of the base carrier.

Figure 9D:
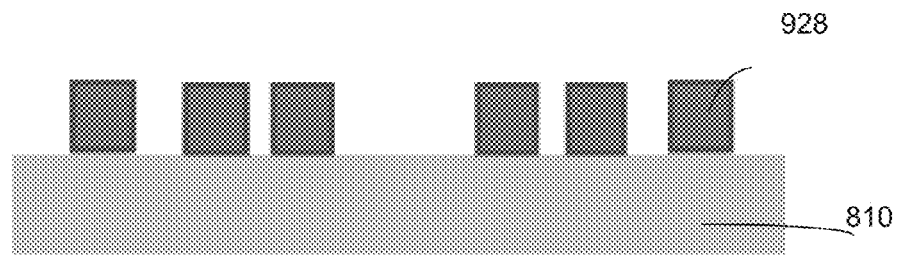
Figure 9E:
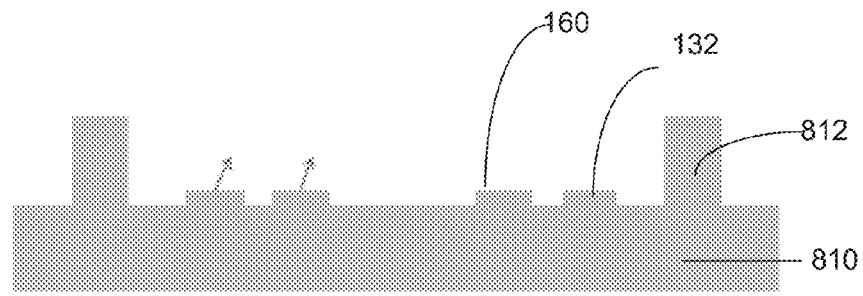

After the PoP posts are formed, a resist mask 928 is formed on the first surface of the base carrier, as shown in FIG. 9d. The resist mask is patterned to expose portions of the first surface of the base carrier for patterning. In FIG. 9e, the base carrier is etch by, for example, a wet etch using the resist mask as an etch mask. The etch forms contact pads 160, conductive traces 132 and a die paddle. In one embodiment, the etch forms conductive traces and contacts pads on a first line level.

Figure 9F:
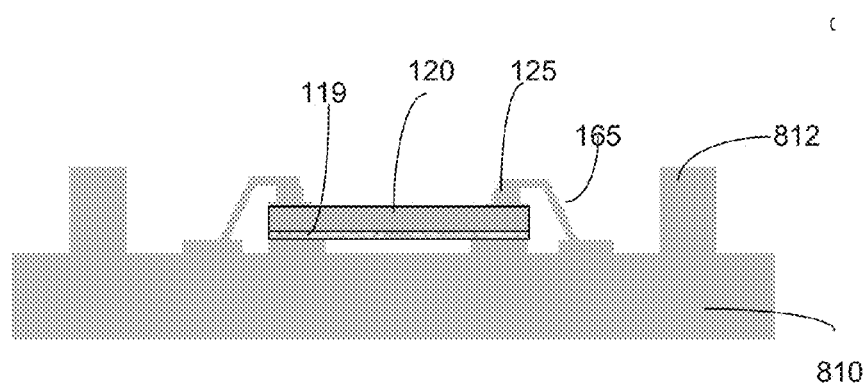

Referring to FIG. 9f, a die 120 is attached to the die attach region. In one embodiment, a wirebond type of die is attached to the die attach region. The die, for example, is attached to the die paddle in the die attach region on the surface of the base carrier. An adhesive 119 may be used to mount the die to the base carrier. The adhesive, for example, may comprise an adhesive paste or die attach film, such as tape. Other types of adhesives, such as epoxy, may also be useful. Wirebonds 165 are formed to create electrical connection between contact pads on the base carrier and bond pads 125 on the die.

Figure 9G:
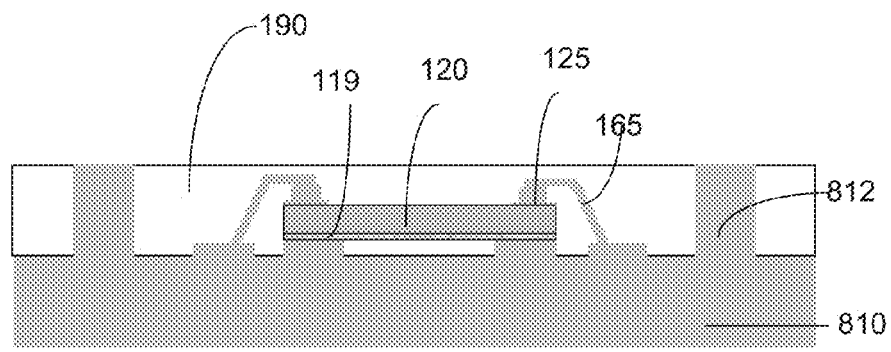

In FIG. 9g, a cap 190 is formed over the die and first surface of the base carrier. The cap provides protection against the environment. The cap, for example, comprises a mold compound. The cap may be formed by, for example, transfer, compression or injection molding. Other techniques or materials may also be useful to form the cap. In one embodiment, the PoP contacts 812 remain exposed after encapsulation. The exposed PoP contacts facilitate stacking of other devices or packages thereon.

Figure 9H:
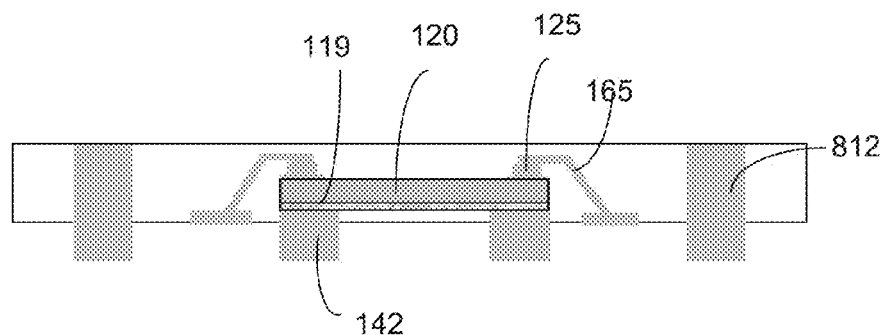

In FIG. 9h, the second major surface of the base carrier is processed. In one embodiment, the second major surface is patterned to form first via contacts 142 of a first via level. A pattern resist mask corresponding to the via contact pattern may be used. An etch, such as a wet etch, removes base carrier material exposed by the mask, leaving via contacts remaining under the patterned mask.

In one embodiment, the process may continue to form package contacts. For example, a dielectric layer is deposited on the underside of the mold with the exposed via contacts. The dielectric layer covers the via contacts. Openings are formed in the dielectric layer to expose the via contacts, serving as a solder mask for forming package contacts. This forms a package with one line level and one via level, such as that shown in FIG. 8a.

Figure 9I:
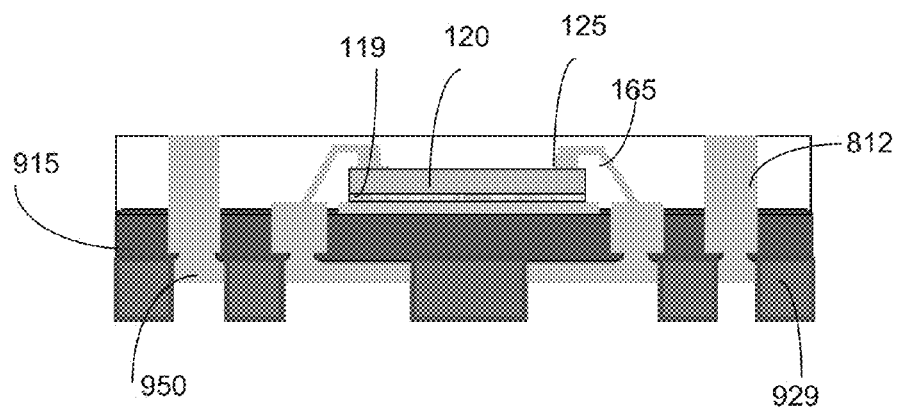

In other embodiment, the process continues by forming a dielectric layer 915 on the underside of the mold with the exposed via contacts, as shown in FIG. 9i. The dielectric layer, for example, is formed by printing, lamination or spin on techniques. The via contacts are exposed. In one embodiment, a resist mask 929 is formed on the surface of the dielectric and patterned to form trench openings corresponding to conductive traces of a second line level 950. The trench openings, in one embodiment, are selectively filled with a conductive material, such as by plating, to form second conductive traces 952. For example, the conductive material comprises copper. After the conductive traces are formed, the mask is removed. In an alternative embodiment, the second conductive traces may be formed by techniques as described previously with respect to FIGS. 5a-c.

Figure 9J:
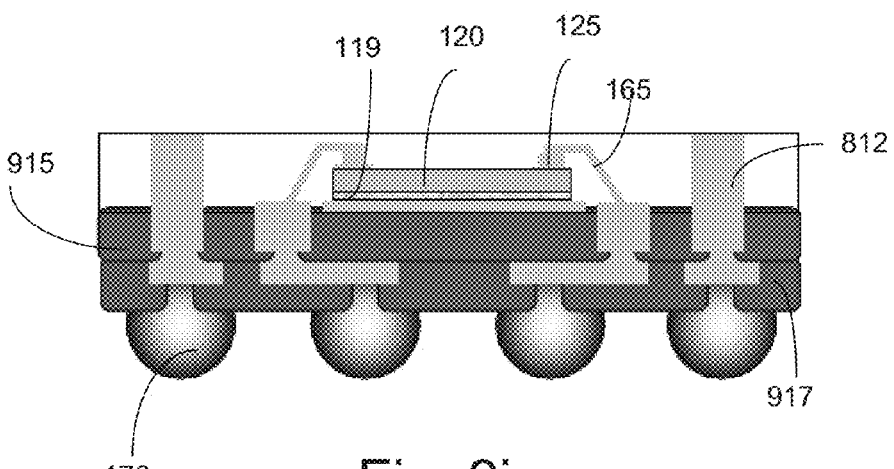

As shown in FIG. 9j, a dielectric layer 917 is deposited on the base carrier, filling the spaces between and covering the second conductive traces. The dielectric layer, for example, comprises polymer, solder mask or dielectric composite materials. To form the dielectric layer, printing, lamination or spin on techniques may be employed. Other types of dielectric materials or techniques may be used to form the dielectric layer. The dielectric should be sufficiently thick to cover the conductive traces. Covering the conductive traces by other thicknesses may also be useful.

The dielectric layer is patterned to form openings to expose portions of the second conductive traces. The openings correspond to locations of package contacts of the package. The patterned dielectric layer serves as a package mask for subsequently forming package contacts in the openings.

Package contacts 170 are formed in the openings of the package mask. For example, the package contacts are formed by similar techniques as described previously with respect to FIG. 4j and onwards.

Figure 10A:
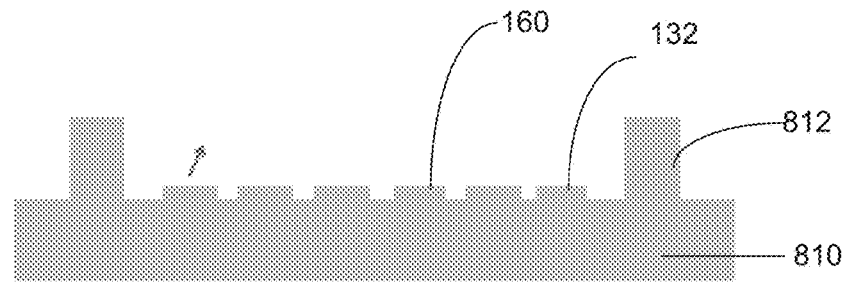
Figure 10B:
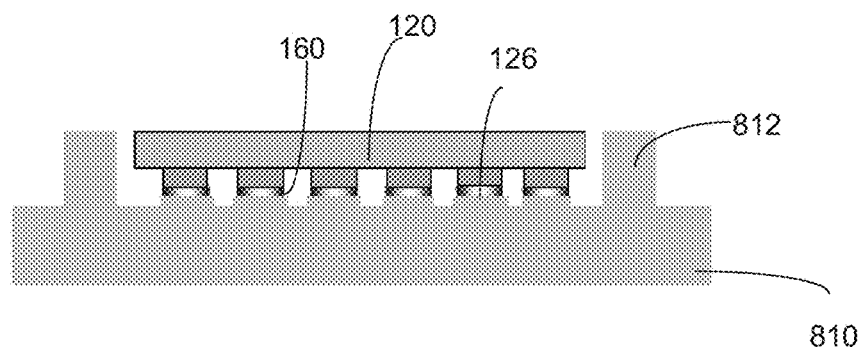
Figure 10C:
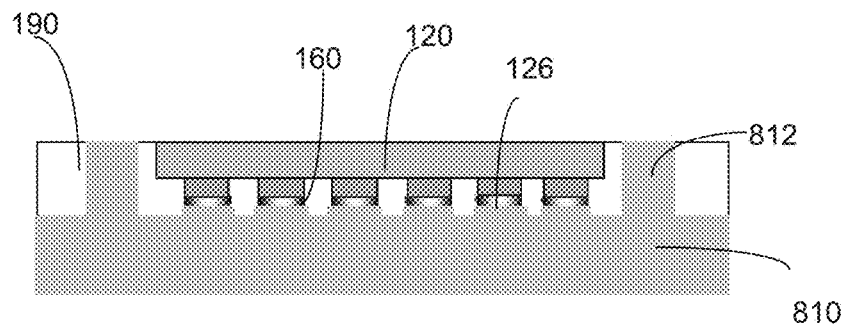

As described, a wirebond type of die is attached to the base carrier. FIGS. 10a-c show another embodiment of a package for a flip chip type of die. Referring to FIG. 10a, a partially processed base carrier or leadframe 810 is provided. The partially processed base carrier is at a stage of processing as described in FIG. 9e. As such, the common features need not be discussed or discussed in detail. For example, the base carrier is etched by, for example, a wet etch using a resist mask as an etch mask. The etch forms contact pads 160, conductive traces and a die paddle. In one embodiment, the etch forms conductive traces and contact pads on a first line level. The partially processed base carrier further includes PoP posts 812 on the first surface of the support carrier.

Referring to FIG. 10b, a flip chip type of die is attached to the partially processed carrier. In one embodiment, the flip chip type of die includes die contacts 126 on a surface thereof. The die contacts are mated to contact pads 160 disposed in the die region on the base carrier. The die contacts and contact pads are reflowed to form electrical connections. An underfill material may be provided between the die and base carrier. The underfill material, for example, an epoxy-based polymeric material. The underfill material encapsulates and protects the die contacts.

In FIG. 10c, a cap 190 is formed over the flip chip type of die and first surface of the support carrier. The cap provides protection against the environment. The cap, for example, includes a mold compound. The cap may be formed by, for example, transfer, compression or injection molding. Other techniques or materials may also be used to form the cap. In one embodiment, the PoP contacts 812 remain exposed after encapsulation. The exposed PoP contacts facilitate stacking of other devices or packages thereon.

The process continues to form a semiconductor package similar to the steps described with respect to FIG. 9h and onwards. As such, the common features need not be discussed or discussed in detail.

The PoP contacts, formed out of the base lead frame carrier or formed by plating as described facilitates stacking of one or more devices or packages thereon and provide electrical connections between the packages. Therefore, the PoP contacts are used as interconnection in the package. The advantages of having the PoP contacts formed out of the base lead frame is that the desired PoP contacts height can be easily achieved by varying the thickness of the starting base or lead frame carrier. Similarly, if a plating process is used to form the PoP contacts, the required height of the contacts can be easily adjusted using a standard size mold.

Figure 11A:
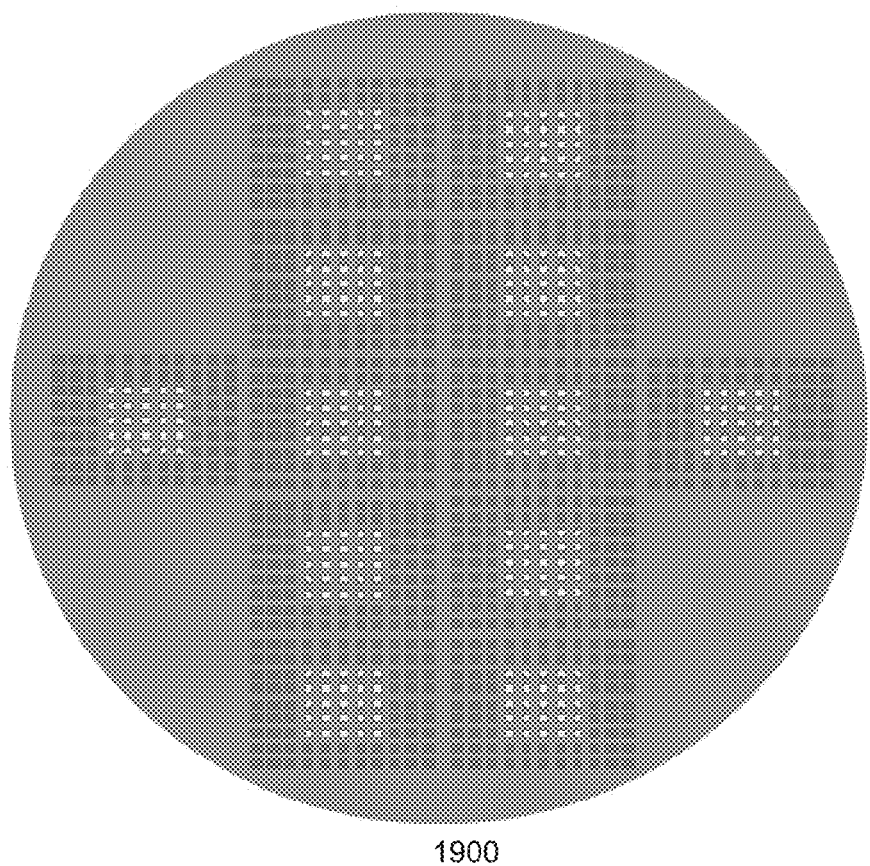
FIGS. 11a-b show plan views of various embodiments of a base carrier.
Figure 11B:
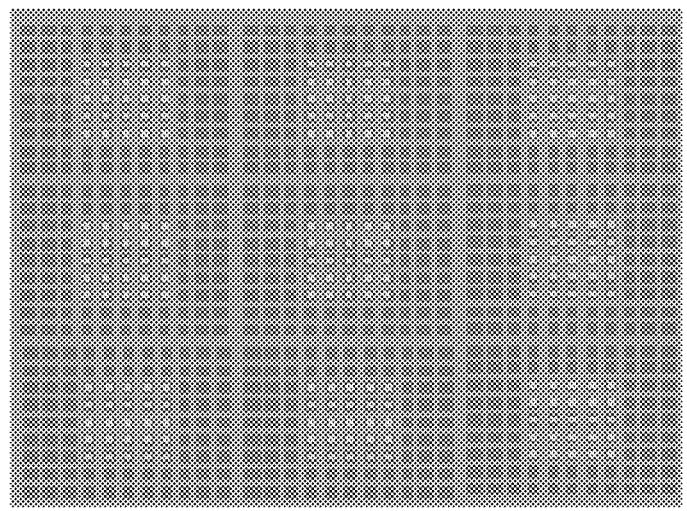

FIGS. 11a-b show plan views of various embodiments of a base carrier 1900. FIG. 11a show a plan view of an embodiment of the base carrier in the form of a wafer. For example, the base carrier is presented in an 8" wafer frame. FIG. 11b shows another embodiment of a base carrier in the form of a panel. Although the package layout in the panel form of the base carrier in FIG. 11b is presented in a 2-D array, it is understood that a 1-D array is also useful, such as in the form of a strip. Alternatively, the base carrier may be in the form of a round plate.

Figure 12A:
FIGS. 12a-m, FIG. 13a-g, FIGS. 14a-f, FIGS. 15a-e, FIG. 16a-c and FIG. 17a-c show various embodiments of a method for forming a package.

FIGS. 12a-m show another embodiment of forming a package 1200. The package, for example, comprises a fan-out structure for packages at base carrier or leadframe level. Referring to FIG. 12a, a base carrier 1110 is provided. The base carrier includes first and second major surfaces 1111 and 1112. The first major surface maybe referred to as the top or frontside surface and the second major surface may be referred to as the bottom or backside surface. Other designation for the surfaces may also be useful. The base carrier, for example, is formed from a conductive material. In one embodiment, the base carrier is formed from copper. Other types of conductive materials, such as aluminum as well as alloys, including alloys of copper, may also be useful. The base carrier, for example, is a leadframe of the package. The top surface of the leadframe includes a die attach region. The lead frame, for example, should be sufficiently thick to prevent warpage.

Figure 12B:
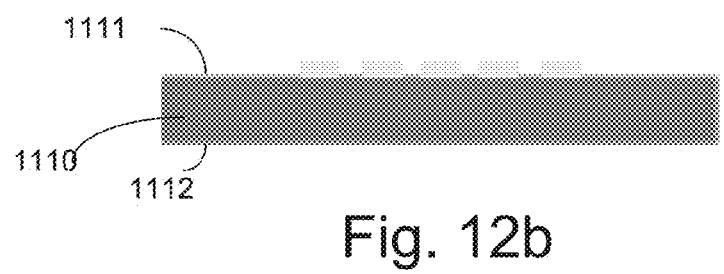

As shown in FIG. 12b, contact pads 160 are formed on the top surface of the leadframe. In one embodiment, the contact pads are formed by an under bump metallization (UBM) process. Other types of process for forming contact pads may also be useful. The contact pads are, in one embodiment, disposed in the die region of the front surface of the leadframe.

Figure 12C:
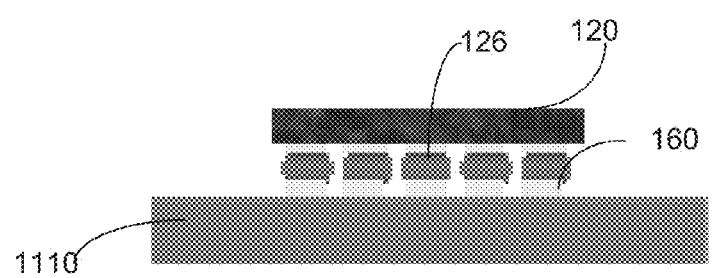
Figure 12D:
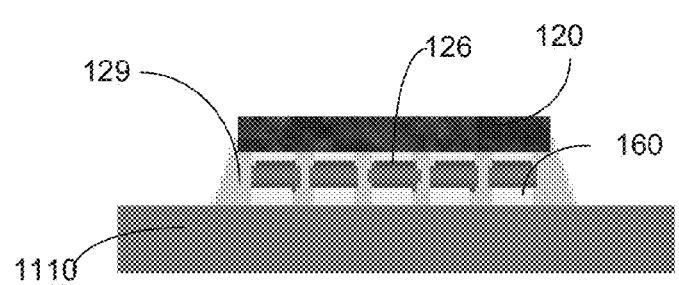

A die 120 is attached to the die region, as shown in FIG. 12c. In one embodiment, the die is a flip chip. For example, the flip chip includes die contacts 126 disposed on an active surface. The die contacts are mated to the contact pads on the frontside surface of the leadframe. In one embodiment, as shown in FIG. 12d, an underfill 129, such as an epoxy-based polymeric material, may be dispensed in the space between the die and base carrier substrate. Alternatively, no underfill is provided between the die and base carrier.

Figure 12E:
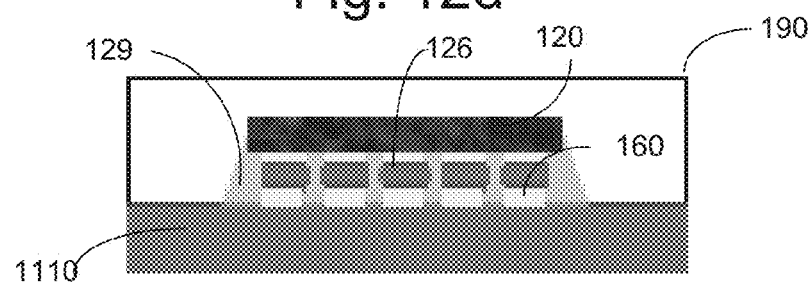

In FIG. 12e, a cap 190 is formed over the die and top surface of the package. The cap, for example, may comprise a mold compound. Other types of materials may also be useful. The cap provides protection against the environment. A transfer, compression or injection molding process may be employed to form the cap. As shown the cap completely covers the top of the die. In other embodiments, the top of the cap and top of the die may be co-planar. In some embodiment, the molding process also forms the underfill in the space between the die and leadframe.

Figure 12F:
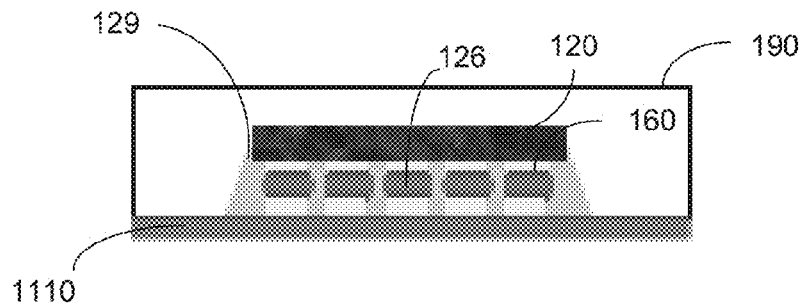

Referring to FIG. 12f, the leadframe is processed or thinned to a thickness equal to the thickness of a line level of a package substrate. In one embodiment, thinning of the leadframe is achieved by polishing, grinding or etching the backside. For example, an etch back process may be employed. The etch back process may be a wet etch. Other techniques for thinning the backside may also be useful. As described, the thinning of the leadframe is performed after the molding process to form the cap. The cap may advantageously serve to provide structural support to facilitate the packaging process.

In other embodiments, thinning is not performed. The thinning of the leadframe depends on the thickness of the leadframe. For example, if the leadframe is already of the desired thickness, thinning is not necessary.

Figure 12G:
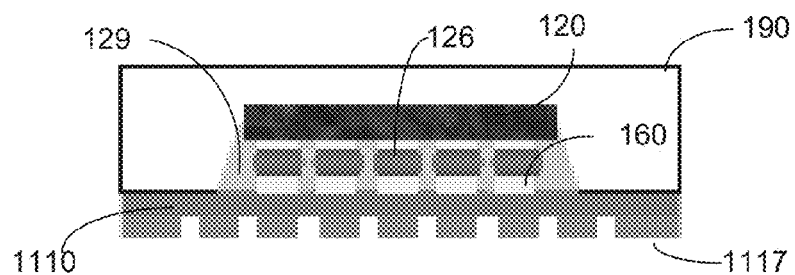

Referring to FIG. 12g, a soft mask layer 1117 is formed on the backside of the leadframe. The soft mask, for example, is a photoresist. The photoresist may be formed by, for example, a spin on process. The resist is patterned to form openings. In one embodiment, the pattern of the resist layer corresponds to the conductive traces of the first level. For example, the remaining resist which forms the patterned resist mask corresponds to conductive traces.

Figure 12H:
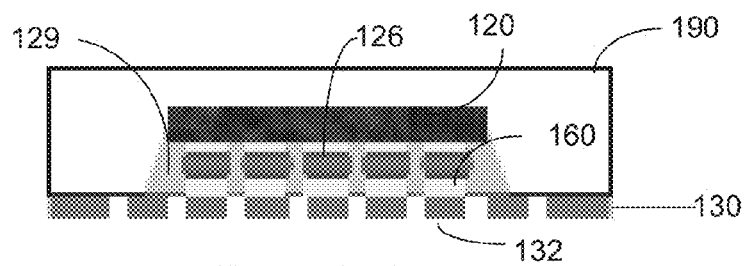

In FIG. 12h, the leadframe is patterned, removing portions exposed by the soft mask. For example, a wet etch is used to remove exposed portions of the leadframe. This leaves remaining portion of the leadframe which forms conductive traces 132 of the first line level 130.

Figure 12I:
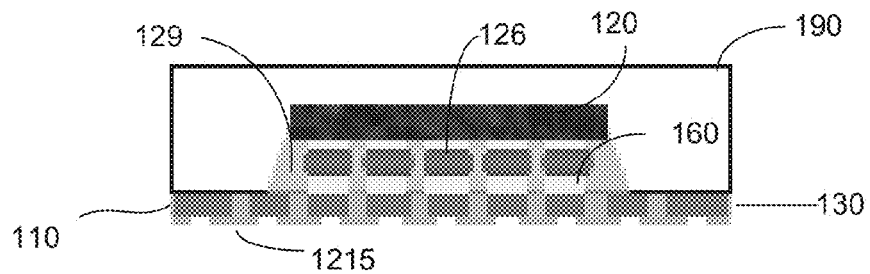

Referring to FIG. 12i, the process continues to form isolation material which fills the gaps between the conductive traces. In one embodiment, a dielectric layer 1215 is formed on the backside of the leadframe, filling the spaces between and covering the conductive traces. The dielectric layer, for example, is formed of polymer, solder mask or dielectric composite materials. The dielectric layer, for example, may be formed by printing, lamination or spin on techniques. Other dielectric materials and techniques may also be useful.

In some embodiments, this forms a package substrate 110 of the package. The process may continue to form package contacts on the bottom of the package substrate. For example, package openings are formed in the dielectric layer to expose the conductive traces. Package pads and package contacts may be formed in the opening.

Figure 12J:
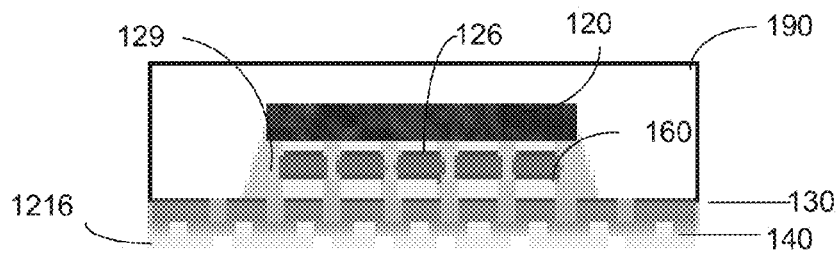

In other embodiments, the process continues to form a second line level. As shown in FIG. 12j, openings are formed in the dielectric layer. The openings correspond to via openings of a first via level 140 in which via contacts are formed. The openings may be formed by, for example, mask and etch processes. For example, the dielectric layer is etched using a patterned resist mask.

Figure 12K:
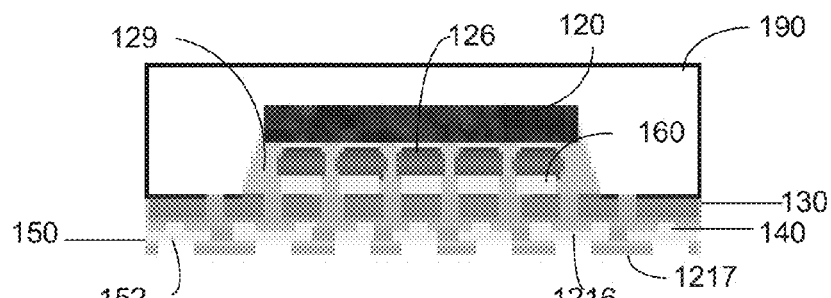

Referring to FIG. 12k, a conductive layer 1216 is formed on the backside of the leadframe. The conductive layer fills the via openings and cover the dielectric layer. In one embodiment, the conductive layer is formed of copper. The conductive layer may be formed by plating techniques, including electrolytic and electroless plating. The conductive layer should be sufficiently thick to form the via contacts and second conductive traces 152 of a second line level 150. The formed second conductive traces 152 are separated by spaces.

In FIG. 12k, a dielectric layer 1217 is formed on the backside, filling the spaces between and covering the second conductive traces. The dielectric layer 1217, for example, may be similar to the dielectric layer 1215. Other types of dielectric material may also be used to form the dielectric layer 1217. The dielectric layer is patterned to form openings to expose the second conductive traces. The openings correspond to locations of package contacts. Patterning of the dielectric layer may be achieved using a resist mask and an etch.

Figure 12L:
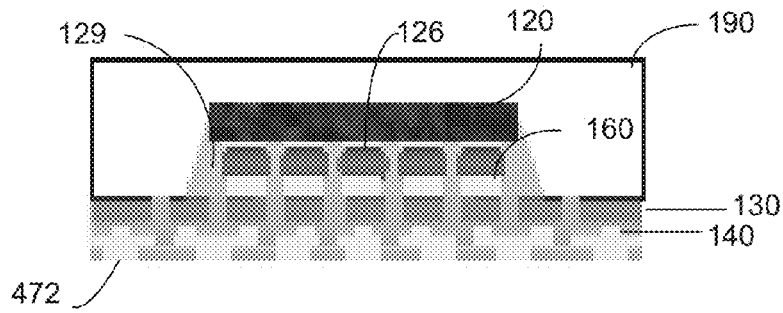
Figure 12M:
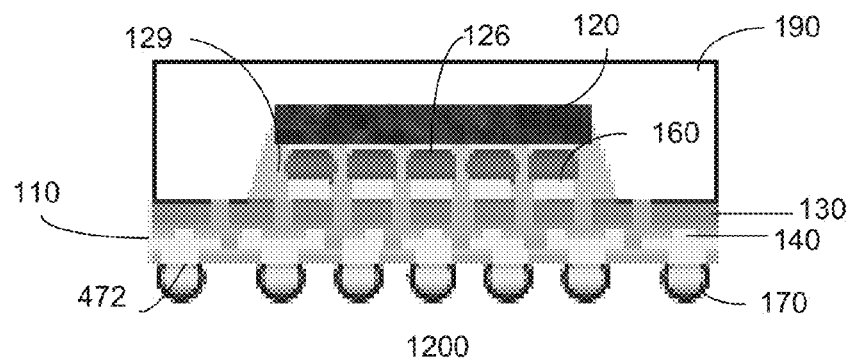

As shown in FIG. 12l, package pads 472 are formed in the openings. The package pads, for example, may be formed by UBM process. Other types of package pads may also be useful. Package contacts 170, such as solder balls, may optionally be formed in the openings, as shown in FIG. 12m.

As described, a fan out structure is provided at the package substrate level, avoiding the need to provide fan out at the die level. This results in improved package reliability at the board level.

Figure 13A:

FIGS. 13a-g show another embodiment of forming a package 1300. The package, for example, includes a fan-out structure for packages in the base carrier or leadframe level. The package has similarities to that described in FIGS. 12a-m. Common features and process steps may not be described or described in detail. Referring to FIG. 13a, a base carrier 1110 is provided. The base carrier includes first and second major surfaces 1111 and 1112. The lead frame, for example, should be sufficiently thick to prevent warpage.

Figure 13B:
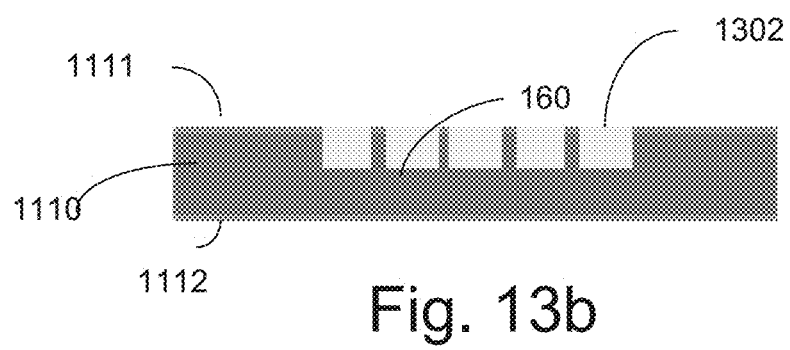

In FIG. 13b, pad recesses 1302 are formed in the top surface of the leadframe. The recesses may be formed by a mask and etch technique. For example, the etch includes a wet etch. Other techniques of forming the pad recesses may also be useful. The recesses are disposed in a die region on the top surface of the leadframe. The recesses should be sufficiently deep and arranged in a pattern to accommodate die contacts 126 of a flip chip. Contact pads 160 are formed in the recesses. In one embodiment, the contact pads are formed by an under bump metallization (UBM) process. Other types of process for forming contact pads may also be useful. The contact pads are, in one embodiment, disposed in the pad recesses in the die region of the front surface of the leadframe.

Figure 13C:
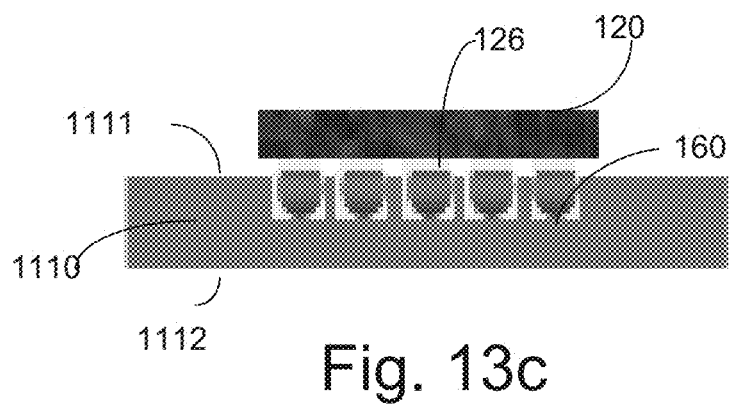

Referring to FIG. 13c, a die 120 is attached to the die region. In one embodiment, the die is a flip chip. For example, the flip chip includes die contacts 126 disposed on an active surface. The die contacts are mated to the contact pads on the frontside surface of the leadframe. The die contacts, for example, are disposed in the recesses. Since the die contacts are disposed in the recesses, no underfill is needed.

Figure 13D:
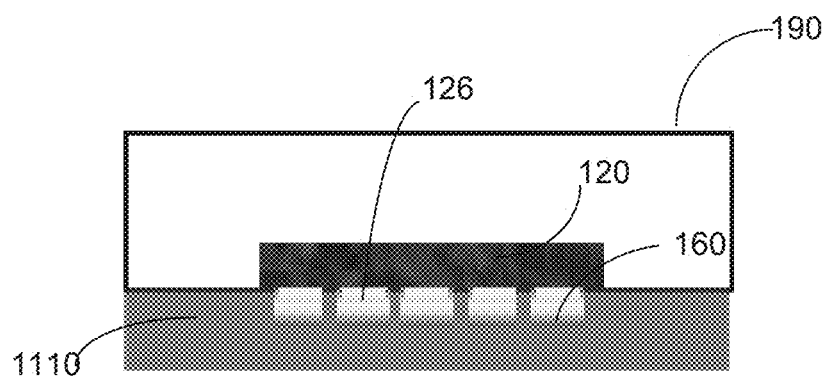

In FIG. 13d, a cap 190 is formed over the die and top surface of the package. The cap, for example, may comprise a mold compound. Other types of materials may also be useful. The cap provides protection against the environment. A transfer, compression or injection molding process may be employed to form the cap. As shown the cap completely covers the top of the die. In other embodiments, the top of the cap and top of the die may be co-planar.

Figure 13E:
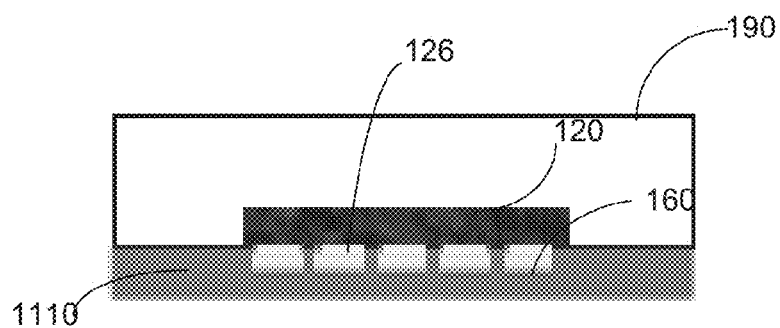

Referring to FIG. 13e, the leadframe is thinned to a thickness equal to the thickness of a line level of a package substrate. For example, the leadframe is thinned to a thickness of about 5 to 50 µm. In one embodiment, thinning of the leadframe is achieved by polishing, grinding or etching the backside. For example, an etch back process may be employed. The etch back process may be a wet etch. Other techniques for thinning the backside may also be useful.

Figure 13F:
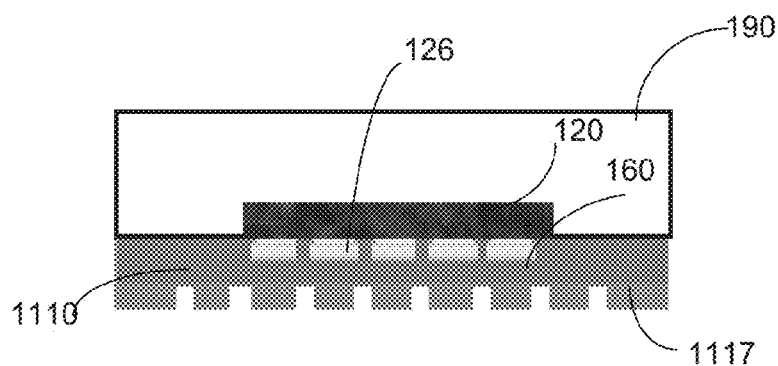

Referring to FIG. 13f, a soft mask layer is formed on the backside of the leadframe. The soft mask 1117, for example, is a photoresist. The photoresist may be formed by, for example, a spin on process. The resist is patterned to form openings. In one embodiment, the pattern of the resist layer corresponds to conductive traces 132 of the first level 130. For example, the remaining resist which forms the patterned resist mask corresponds to conductive traces.

Figure 13G:
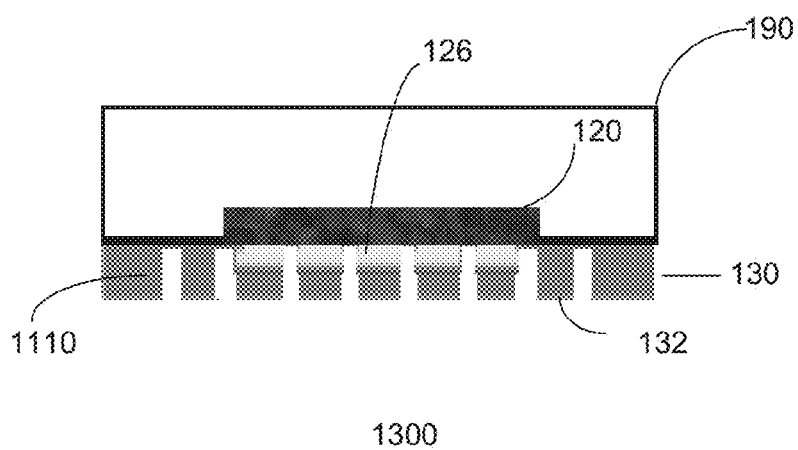

In FIG. 13g, the leadframe is patterned, removing portions exposed by the soft mask. This leaves remaining portion of the leadframe which forms conductive traces 132 of the first line level 130. The process continues to form the package, as described in FIGS. 12i-m.

Figure 14A:
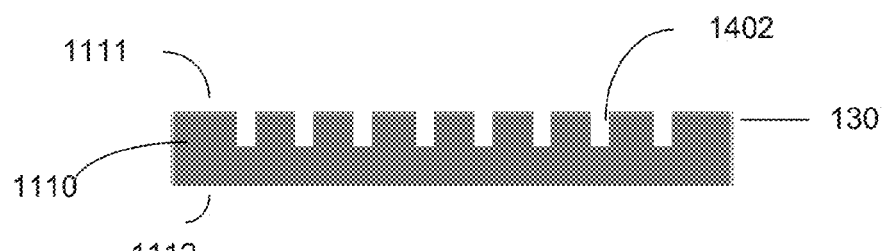

FIGS. 14a-f show another embodiment of forming a package 1400. The package, for example, includes a fan-out structure for packages in the base carrier or leadframe level. The package has similarities to that described in FIGS. 12a-m. Common features and processes steps may not be described or described in detail. Referring to FIG. 14a, a base carrier 1110 is provided. The base carrier includes first and second major surfaces 1111 and 1112. The lead frame, for example, should be sufficiently thick to prevent warpage.

The top surface of the base carrier is patterned. In one embodiment, the top surface of the base carrier is patterned to form trenches 1402. The trenches, for example, correspond to spaces between conductive traces of a first line level 130. For example, the depth of the recesses should be equal to the height of the conductive traces. The top surface may be patterned by an etch process using a resist mask. For example, the etch includes a wet etch. Other techniques for patterning the top surface of the leadframe may also be useful.

Figure 14B:
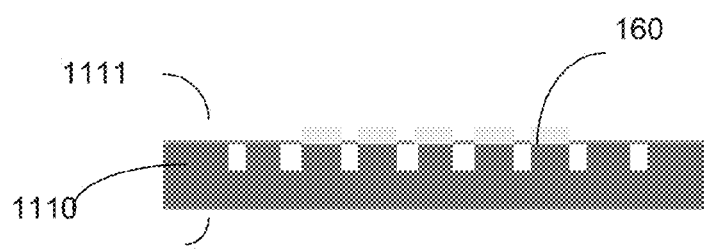

As shown in FIG. 14b, contact pads 160 are formed on the top surface of the leadframe. In one embodiment, the contact pads are formed by an under bump metallization (UBM) process. Other types of process for forming contact pads may also be useful. The contact pads are, in one embodiment, disposed in the die region of the front surface of the leadframe. Such configuration may reduces the impact of frame level warpage.

Figure 14C:
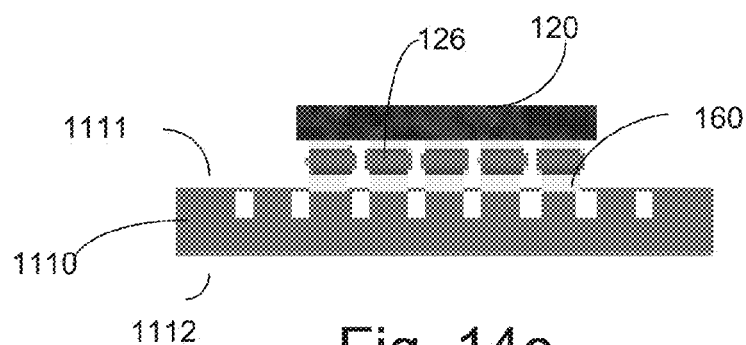
Figure 14D:
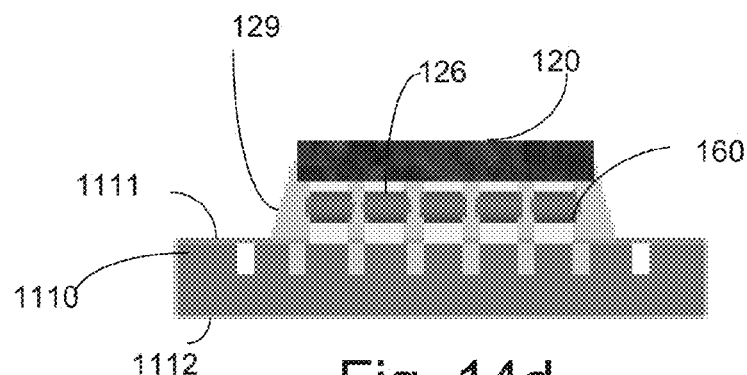

A die 120 is attached to the die region, as shown in FIG. 14c. In one embodiment, the die is a flip chip. For example, the flip chip includes die contacts 126 disposed on an active surface. The die contacts are mated to the contact pads on the frontside surface of the leadframe. In one embodiment, as shown in FIG. 14d, an underfill 129, such as an epoxy-based polymeric material, may be dispensed in the space between the die and base carrier. The underfill, for example, may also fill the trenches formed in the base carrier. Alternatively, no underfill is provided between the die and carrier substrate.

Figure 14E:
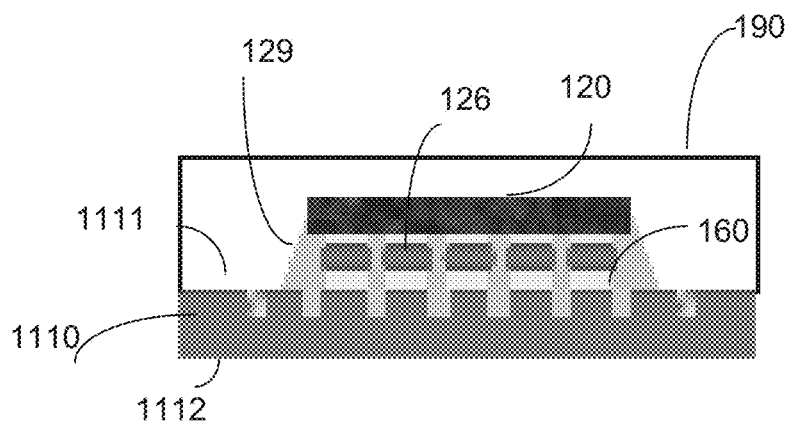

In FIG. 14e, a cap 190 is formed over the die and top surface of the package. The cap, for example, may comprise a mold compound. Other types of materials may also be useful. The cap provides protection against the environment. A transfer, compression or injection molding process may be employed to form the cap. As shown, the cap completely covers the top of the die. In other embodiments, the top of the cap and top of the die may be co-planar. In some embodiments, the molding process also forms the underfill in the space between the die and leadframe.

Figure 14F:
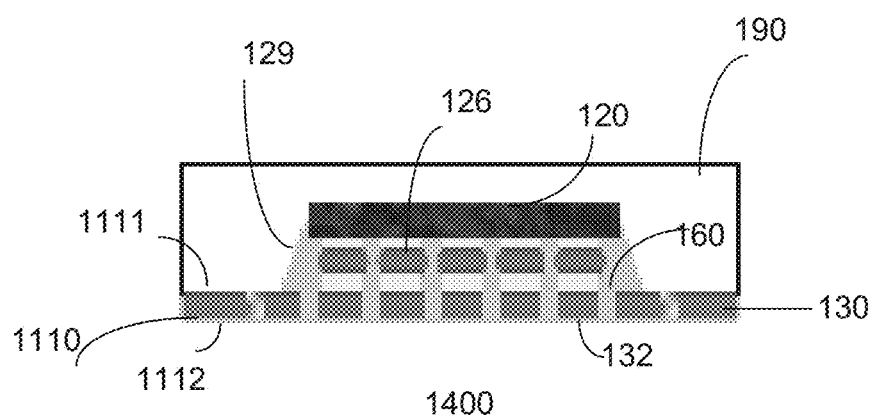

Referring to FIG. 14f, the leadframe is thinned to at least expose the bottom of the underfill material in the trenches of the base carrier. This forms first conductive lines 132 of the first line level 130 of a package substrate. The process continues to form the package. For example, the process continues as described in FIGS. 12i-m to form the package.

Figure 15A:
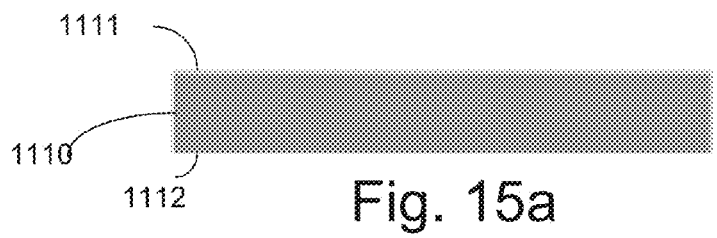

FIGS. 15a-e show another embodiment of forming a package 1500. The package, for example, includes a fan-out structure for packages in the base carrier or leadframe level. The package has similarities to that described in FIGS. 12a-m. Common features and processes steps may not be described or described in detail. Referring to FIG. 15a, a base carrier 1110 is provided. The base carrier includes first and second major surfaces 1111 and 1112. The lead frame, for example, should be sufficiently thick to prevent warpage. The top surface of the leadframe includes a die attach region.

Figure 15B:
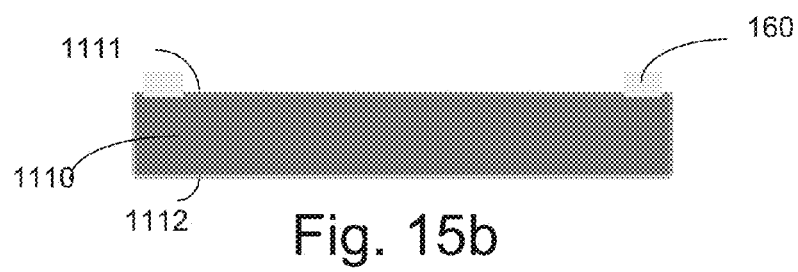

As shown in FIG. 15b, contact pads 160 are formed on the top surface of the leadframe. In one embodiment, the contact pads are formed by an under bump metallization (UBM) process. Other types of process for forming contact pads may also be useful. The contact pads are, in one embodiment, disposed in the periphery of the die region.

Figure 15C:
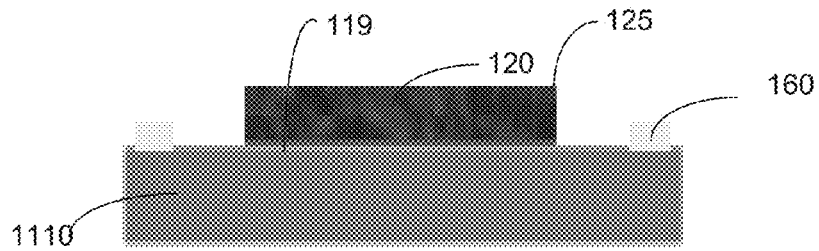

A die 120 is attached to the die region, as shown in FIG. 15c. In one embodiment, the die is a wirebond type of die. For example, the wirebond die includes bond pads 125 on an active surface. In one embodiment, an adhesive 119 may be used to mount the die to the die region. The adhesive, for example, may comprise an adhesive paste or die attach film, such as tape. Other types of adhesives, such as epoxy, may also be useful. The inactive surface of the die is attached to the leadframe, leaving the active surface with the bond pads exposed.

Figure 15D:
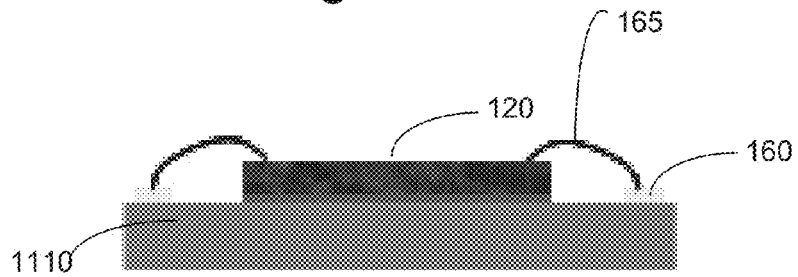
Figure 15E:
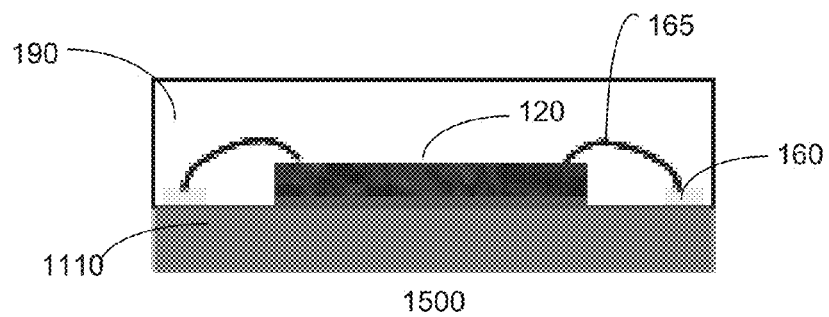

In FIG. 15d, wire bonds 165 are attached to the bond pads on the die and contact pads on the leadframe. The wirebonds may be attached using a wirebond process. A cap 190 is formed over the die and top surface of the package, as shown in FIG. 15e. The cap, for example, may comprise a mold compound. Other types of materials may also be useful. The cap provides protection against the environment. A transfer, compression or injection molding process may be employed to form the cap. As shown the cap completely covers the top of the die and wirebonds. The process continues to form the package. For example, the process continues as described in FIGS. 12f-m.

Figure 16A:
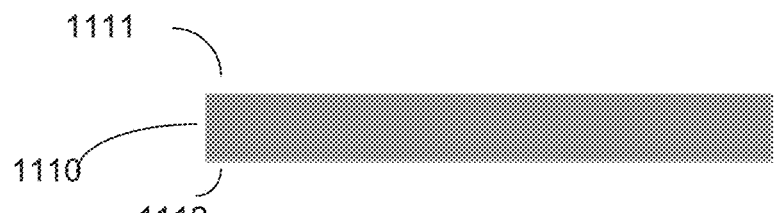
Figure 16B:
Figure 16C:
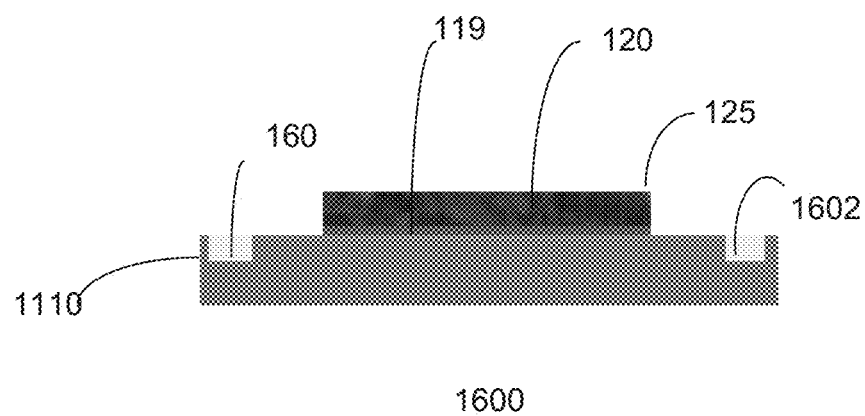

FIGS. 16a-c show another embodiment of forming a package 1600. The package, for example, includes a fan-out structure for packages in the base carrier or leadframe level. The package has similarities to that described in FIGS. 12a-m and FIGS. 15a-e. Common features and process steps may not be described or described in detail. Referring to FIG. 16a, a base carrier 1110 is provided. The base carrier includes first and second major surfaces 1111 and 1112. The top surface of the leadframe includes a die attach region.

As shown in FIG. 16b, contact pads 160 are formed in pad recesses 1602 in the periphery of the die attach region on the top surface of the leadframe. The pad recesses may be formed by an etch using a resist mask while the contact pads are formed by an under bump metallization (UBM) process. Other types of process for forming contact pads may also be useful.

A die 120 is attached to the die region, as shown in FIG. 16c. In one embodiment, the die is a wirebond type of die. For example, the wirebond die includes bond pads 125 on an active surface. In one embodiment, an adhesive 119 may be used to mount the die to the die region. The adhesive, for example, may comprise an adhesive paste or die attach film, such as tape. Other types of adhesives, such as epoxy, may also be useful. The inactive surface of the die is attached to the leadframe, leaving the active surface with the bond pads exposed. The process continues to form the package. For example, the process continues as described in FIG. 15d and onwards. In some embodiments, when thinning the leadframe, the bottom of the contact pads may be exposed. In other embodiments, the bottom of the contact pads is not exposed when thinning the leadframe.

Figure 17A:
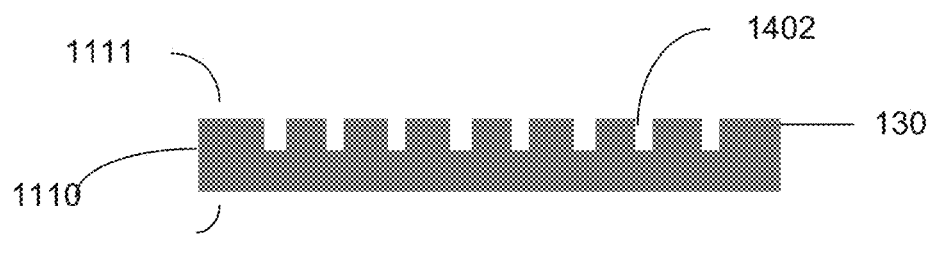
Figure 17B:
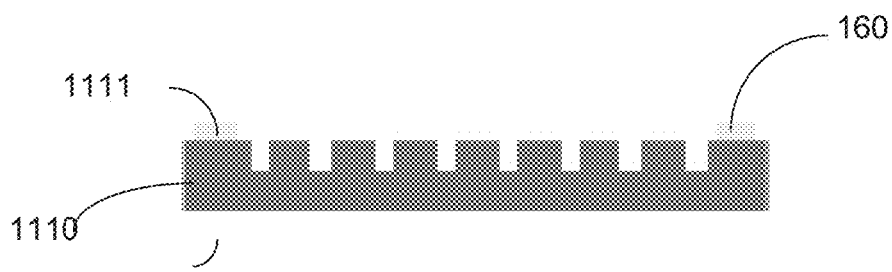
Figure 17C:
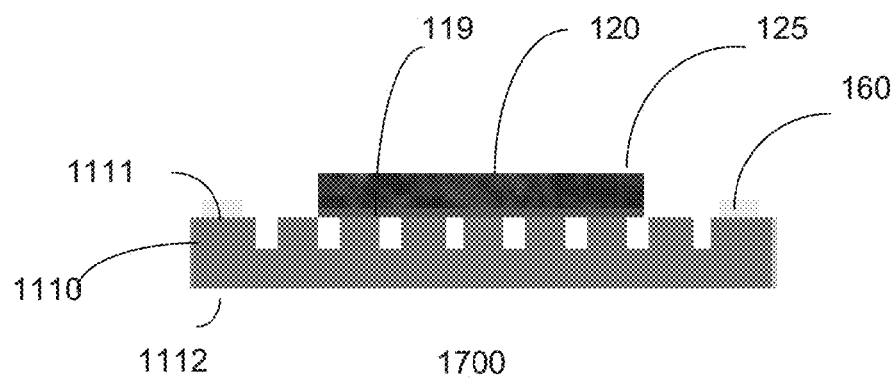

FIGS. 17a-c show another embodiment of forming a package 1700. The package, for example, includes a fan-out structure for packages in the base carrier or leadframe level.

The package has similarities to that described in FIGS. 12*a-m*, FIGS. 14*a-f* and FIGS. 15*a-e*. Common features and process steps may not be described or described in detail.

Referring to FIG. 17*a*, a base carrier 1110 is provided. The base carrier includes first and second major surfaces 1111 and 1112. The top surface of the leadframe includes a die attach region.

The top surface of the leadframe is patterned. In one embodiment, the top surface of the leadframe is patterned to form trenches 1402. The trenches, for example, correspond to spaces between conductive traces of a first line level 130. For example, the depth of the recesses should be equal to the height of the conductive traces. The top surface may be patterned by an etch process using a resist mask. Other techniques for patterning the top surface of the leadframe may also be useful.

As shown in FIG. 17*b*, contact pads 160 are formed on the top surface of the leadframe. In one embodiment, the contact pads are formed by an under bump metallization (UBM) process. Other types of process for forming contact pads may also be useful. The contact pads are, in one embodiment, disposed in the periphery of the die region and on the top surface of the lead frame.

A die 120 is attached to the die region, as shown in FIG. 17*c*. In one embodiment, the die is a wirebond type of die. For example, the wirebond die includes bond pads 125 on an active surface. In one embodiment, an adhesive 119 may be used to mount the die to the die region. The adhesive, for example, may comprise an adhesive paste or die attach film, such as tape. Other types of adhesives, such as epoxy, may also be useful. The inactive surface of the die is attached to the leadframe, leaving the active surface with the bond pads exposed.

The process may continue to form the package. For example, the process may continue to form the package as described in FIG. 15*d* and onwards as well as FIG. 16*c* and onwards.

The package can be extended to include a die stack disposed on the package substrate to form a 3 dimensional (3D) package. A fan out structure may be included in the package substrate or on top of the cap of the package. For example, the lead frame of the package substrate may include a fan out structure. The fan out structure improves pin density as well as wiring complexity of the package.

A die stack includes a plurality of dies stack on top of each other. For example the die stack may include a plurality of flip chip dies. The dies of the stack may be interconnected by through vias (TVs), such as through silicon vias (TSVs). For example, TVs extend from the top to the bottom of the die to facilitate stacking of dies, such as flip chip dies. A redistribution layer (RDL) may be used to facilitate connections between dies. The RDL may be used, for example, to facilitate connections between different types of dies.

In other embodiments, the die stack may include a plurality of wirebond dies. In the case of wirebond dies, the die above may be smaller than the one below to expose bond pads for coupling. The die stack, in some embodiments, may include different types of dies. For example, the die stack may include both flip chip and wirebond dies. The flip chip die or dies may include TVs to facilitate stacking of the dies.

In another embodiment, multiple dies may be disposed on top of a die. For example two dies may be disposed on top of a die. For example, a die and an SMT may be disposed on top of a die. Other configurations of stack dies may also be useful.

A fan out structure may be disposed on top of a die stack or a die mounted onto a package substructure. One or more dies may be disposed on the fan out structure. In the case of more than one die, the dies may be disposed in a planar configuration, stack configuration or a combination thereof. The dies may be flip chip, wire bond, or a combination thereof.

Figure 18A:
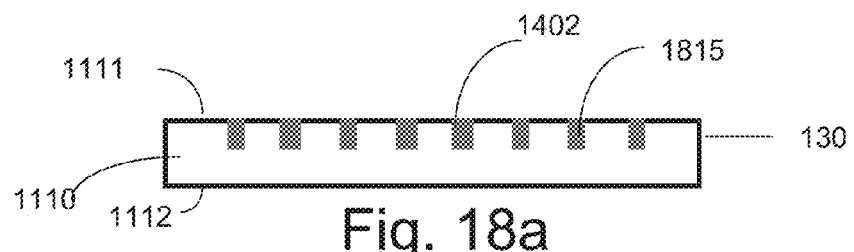
FIGS. 18a-j, FIGS. 19a-g, FIGS. 20a-g, FIGS. 21a-e, FIG. 22, FIGS. 23a-c and FIGS. 24a-e show various embodiments of a process for forming a 3D package.

FIGS. 18*a-j* show one embodiment of a method for forming a 3-dimensional (3D) package 1800. The 3D package, for example, may be a 3D System-in-Package. The package, for example, comprises a fan-out structure for packages at base carrier or leadframe level. The package has similarities to that described in FIGS. 14*a-f*. Common features and processes steps may not be described or described in detail. Referring to FIG. 18*a*, a base carrier 1110 is provided. The base carrier includes first and second major surfaces 1111 and 1112. The lead frame, for example, should be sufficiently thick to prevent warpage.

The top surface of the base carrier is patterned. In one embodiment, the top surface of the base carrier is patterned to form trenches 1402. The trenches, for example, correspond to spaces between conductive traces of a first line level 130. For example, the depth of the recesses should be equal to the height of the conductive traces. The top surface may be patterned by an etch process using a resist mask. Other techniques for patterning the top surface of the leadframe may also be useful.

The trenches, in one embodiment, are filled with a dielectric layer 1815. The dielectric layer, for example, is formed of polymer, solder mask or dielectric composite materials. The dielectric layer may be formed by printing, such as stencil or screen printing, lamination or spin on techniques. Other types of dielectric materials or techniques may also be used to form the dielectric layer.

Figure 18B:

As shown in FIG. 18*b*, contact pads 160 are formed on the top surface of the leadframe. In one embodiment, the contact pads are formed by an under bump metallization (UBM) process. Other types of process for forming contact pads may also be useful. The contact pads are, in one embodiment, disposed in the die region of the front surface of the leadframe.

Figure 18C:
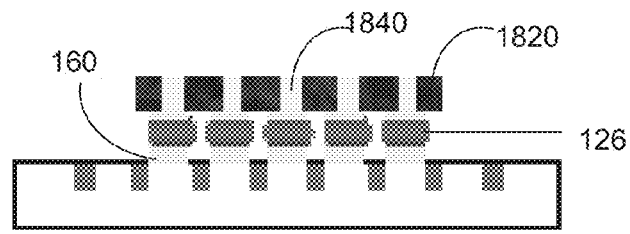
Figure 18D:
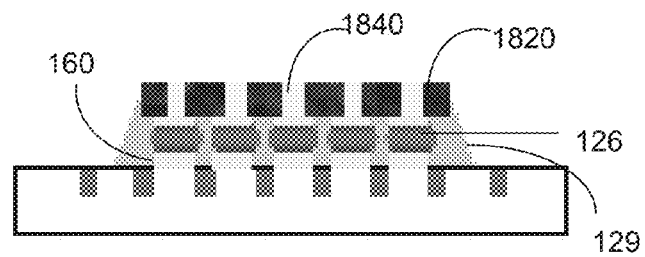

A die 1820 is attached to the die region, as shown in FIG. 18*c*. In one embodiment, the die includes a through-silicon-via (TSV) flip chip. The die of the TSV flip chip, in one embodiment, includes a plurality of through silicon via (TSV) contacts 1840 in the die substrate. The TSV flip chip, in one embodiment, includes die contacts 126 disposed on an active surface. In one embodiment, the number of the TSV contacts is the same as the number of the die contacts. Providing other number of TSV contacts is also useful. In one embodiment, the die contacts are coupled to the TSV contacts and the die contacts are mated to the contact pads on the front side surface of the leadframe. In one embodiment, as shown in FIG. 18*d*, an underfill 129, such as an epoxy-based polymeric material, may be dispensed in the space between the die and base carrier. The underfill, for example, may also fill the trenches formed in the base carrier. Alternatively, no underfill is provided between the die and carrier substrate.

Figure 18E:
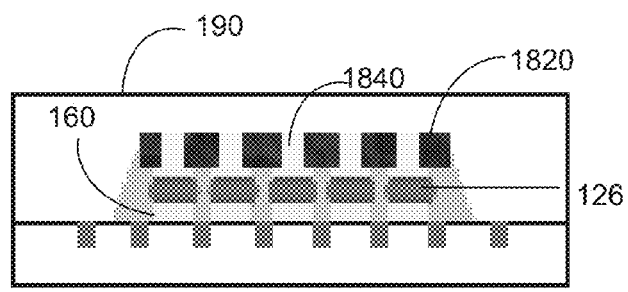

In FIG. 18*e*, a first cap 190 is formed over the die and top surface of the package. The first cap, for example, may comprise a mold compound. Other types of materials may also be useful. The cap provides protection against the environment. A transfer, compression or injection molding process may be employed to form the cap. As shown, the first cap completely covers the top of the die.

Figure 18F:
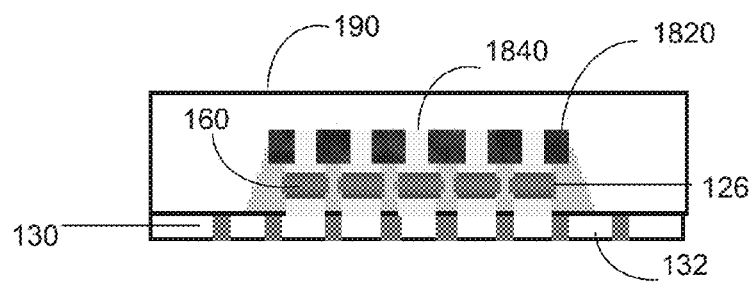
Figure 18G:
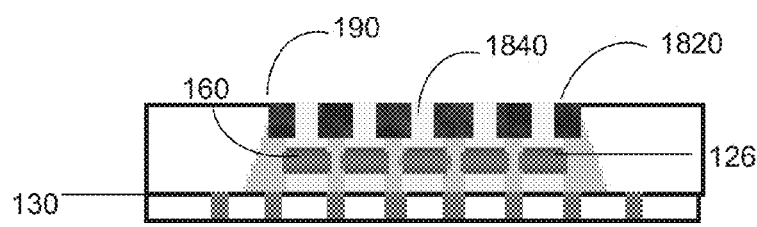

Referring to FIG. 18*f*, the leadframe is thinned to at least expose the bottom of the dielectric material in the trenches of the base carrier. This forms first conductive lines 132 of the first line level 130 of a package substrate. As described, the leadframe is thinned after the molding process to form the cap. The cap may advantageously serve to provide structural support to facilitate the packaging process. In one embodiment, the process continues by thinning a top surface of the cap until top surfaces of the TSV contacts are exposed, as shown in FIG. 18g. The top surface of the cap is thinned, for example, by grinding. Other techniques may also be used to thin the cap. In another embodiment, the thinning process may be excluded if film molding is used to directly expose the top surface of the TSV contacts.

Figure 18H:
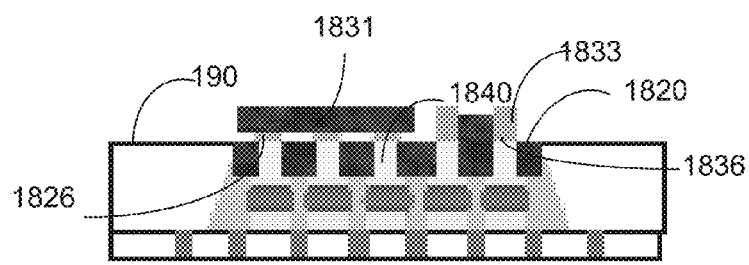
Figure 18I:
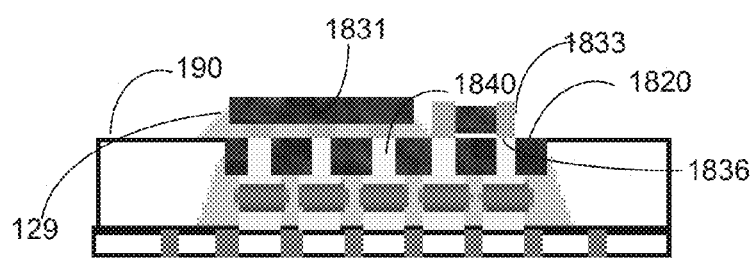

The exposed TSV contacts facilitate stacking of further devices or components thereon. In one embodiment, one or more devices, including both active and passive components, may be stacked onto the exposed TSV contacts and top surface of the first cap. In one embodiment, a flip chip 1831 and a passive device 1833 are attached thereon as shown in FIG. 18h. As shown, the die contacts 1826 of the flip chip and the electrical contacts 1836 of the passive component are coupled to the exposed TSV contacts 1840 of the TSV die 1820. As such, the exposed TSV contacts facilitate electrical connection of the components to the leadframe. In one embodiment, as shown in FIG. 18i, an underfill 129, such as an epoxy-based polymeric material, may be dispensed in the space between the flip chip 1831 and the top surface of the first cap 190. Alternatively, no underfill is provided between the flip chip and the first cap.

Figure 18J:
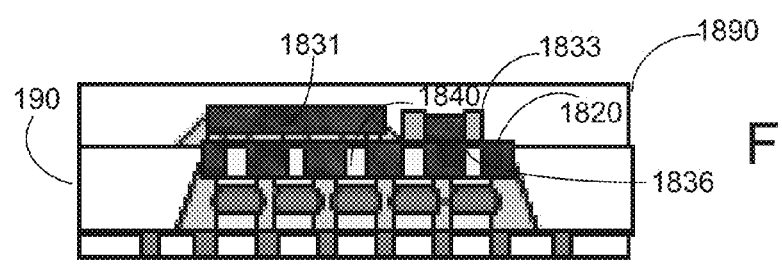

In FIG. 18j, a second cap 1890 is formed over the flip chip, the passive device and top surface of the first cap. The second cap, for example, may comprise a mold compound. Other types of materials may also be useful. Providing the second cap with a material different than the first cap may also be useful. The second cap provides protection against the environment. A transfer, compression or injection molding process may be employed to form the second cap. As shown, the cap completely covers the top of the flip chip, the passive component and the top surface of the first cap. The process continues to form additional conductive line levels, dielectric layers to isolate the conductive traces and vias and package contacts to form the package. For example, the process continues as described in FIGS. 12i-m to form the package.

FIGS. 19a-g show another embodiment of a method for forming a 3D System-in-Package 1800. The package has similarities to that described in FIGS. 14a-f and FIG. 18a-j. Common features and processes steps may not be described or described in detail. The method in FIGS. 19a-g differs from the method as described with respect to FIGS. 18a-j in which additional conductive line levels are formed prior to attachments of additional devices on top of the first cap.

Figure 19A:
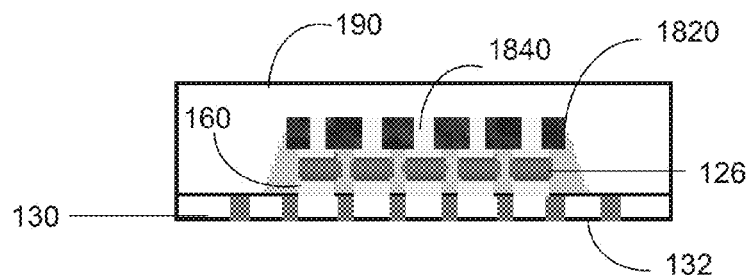

FIG. 19a shows the package processed similarly to the stage as described in FIG. 18f. For example, the leadframe is thinned to at least expose the bottom of the dielectric material in the trenches of the base carrier. This forms first conductive lines 132 of the first line level 130 of a package substrate. As such, the common features need not be discussed or discussed in detail.

Figure 19B:
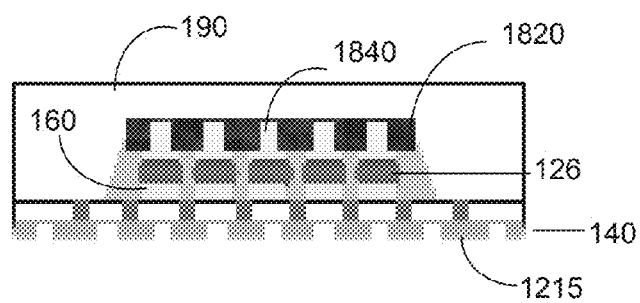

In one embodiment, the process continues to form isolation material over the conductive traces. In one embodiment, a dielectric layer 1215 is formed on the backside of the leadframe. As shown in FIG. 19b, openings are formed in the dielectric layer. The openings correspond to via openings of a first via level 140 in which via contacts are formed. The openings may be formed by, for example, mask and etch processes. For example, the dielectric layer is etched by an etch using a patterned resist mask.

Figure 19C:
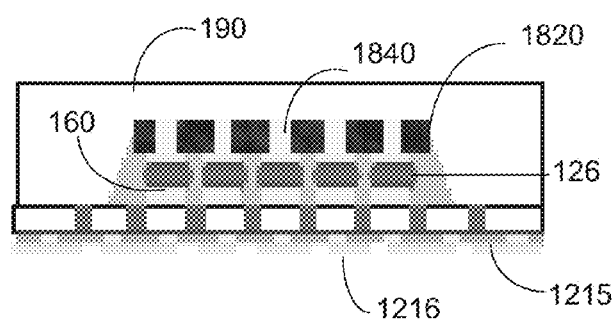

Referring to FIG. 19c, a conductive layer 1216 is formed on the backside of the leadframe. The conductive layer fills the via openings and cover the dielectric layer. In one embodiment, the conductive layer is formed of copper. The conductive layer may be formed by plating techniques, including electrolytic and electroless plating. The conductive layer should be sufficiently thick to form second conductive traces 152 of a second line level 150. The formed second conductive traces 152 are separated by spaces.

Figure 19D:
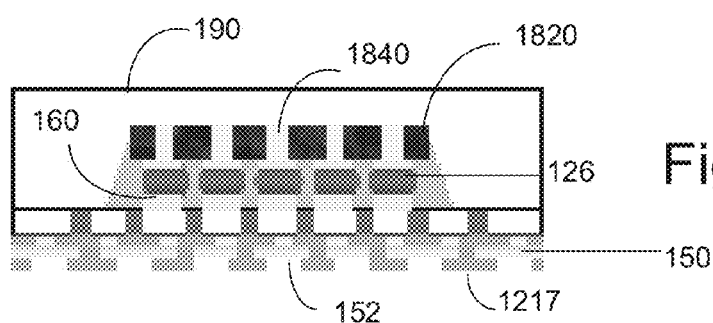

In FIG. 19d, a dielectric layer 1217 is formed on the backside, filling the spaces between and covering the second conductive traces. The dielectric layer 1217, for example, may be similar to dielectric layer 1215. Other types of dielectric material may also be used to form the dielectric layer 1217. The dielectric layer is patterned to form openings to expose the second conductive traces. The openings correspond to locations of package contacts. Patterning of the dielectric layer may be achieved using a resist mask and an etch.

Figure 19E:
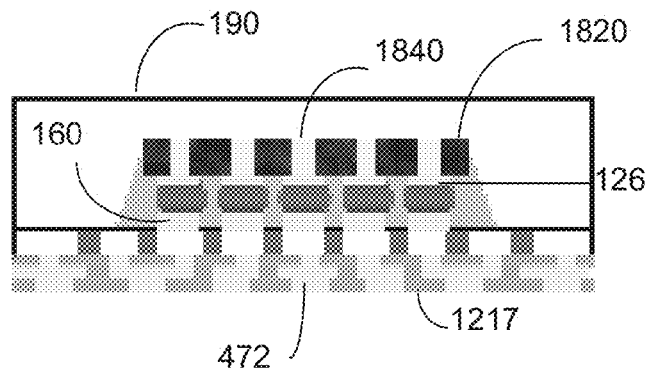
Figure 19F:
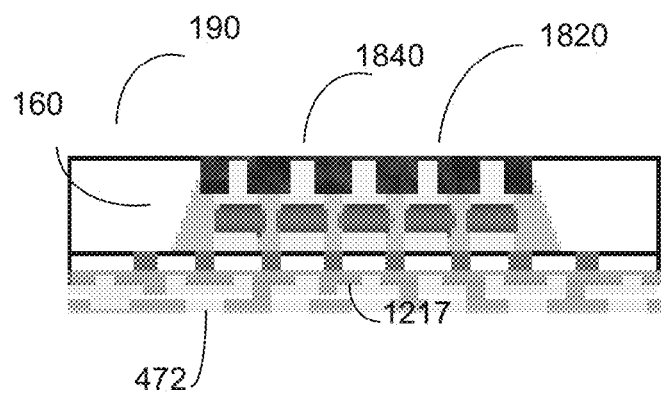

As shown in FIG. 19e, package pads 472 are formed in the openings. The package pads, for example, may be formed by UBM. Other types of package pads may also be useful. In FIG. 19f, a top surface of the first cap is thinned until top surfaces of the TSV contacts exposed. The top surface of the first cap is thinned, for example, by grinding. Other techniques may also be used to thin the first cap. In another embodiment, the thinning process may be excluded if film molding is used to directly expose the top surface of the TSV contacts.

Figure 19G:
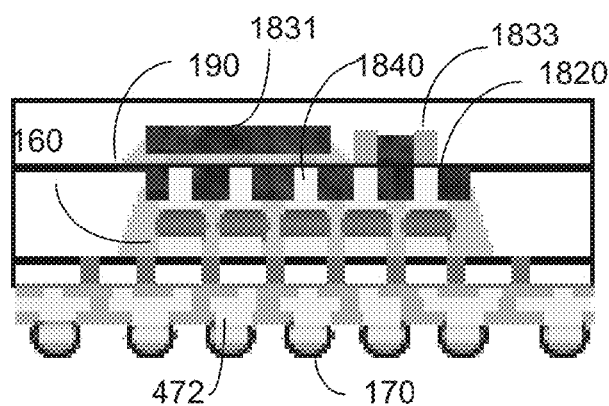

The process continues to attach additional devices or components on top of the top surface of the first cap. For example, the process continues as described in FIG. 18h to FIG. 18j. In FIG. 19g, package contacts 170, such as solder balls, are formed in the openings of the dielectric layer to complete the package.

FIGS. 20a-e show another embodiment of a method for forming a 3D package 2000. The 3D package, for example, includes a 3D wirebond package. The package has similarities to that described in FIGS. 14a-f, FIG. 18a-j and FIG. 19a-g. Common features and processes steps may not be described or described in detail.

Figure 20A:
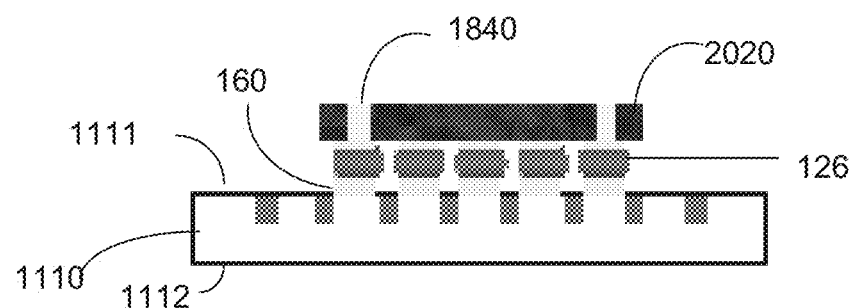

FIG. 20a shows the package processed similarly to the stage as described in FIG. 18c. For example, a die 2020 is attached to the die region, as shown in FIG. 20a. In one embodiment, the die includes a through-silicon-via (TSV) flip chip. The die of the TSV flip chip, in one embodiment, includes a plurality of through silicon via (TSV) contacts 1840 in the die substrate. However, the TSV chip in FIG. 20a differs from the TSV flip chip of FIG. 18c in terms of the number of TSV contacts and the distribution of the TSV contacts. In this embodiment, the arrangement and the number of the TSV contacts is different than the number of the die contacts. For example, the TSV contacts are disposed and are coupled to die contacts at the periphery of the die. The die contacts are mated to the contact pads on the front side surface of the leadframe.

The process continues to form the package. For example, the process continues to form an underfill 129 and the first cap to protect the TSV flip chip as described in FIG. 18d to FIG. 18f. As such, the common features need not be discussed or discussed in detail.

Figure 20B:
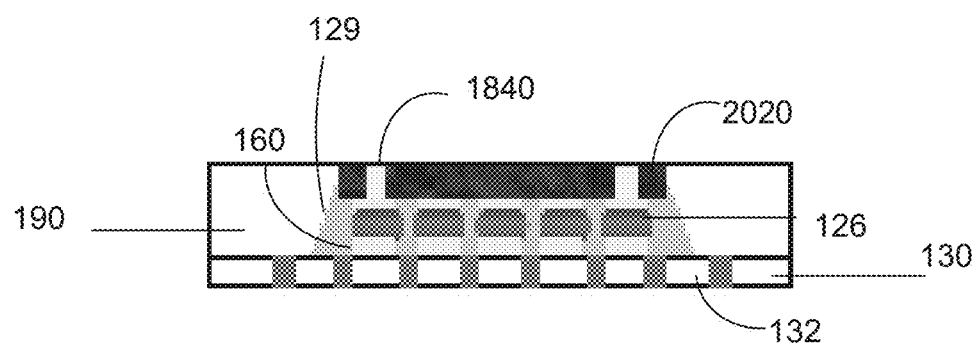

In FIG. 20b, a top surface of the first cap is thinned until top surfaces of the TSV contacts exposed. The top surface of the cap is thinned, for example, by grinding. Other techniques may also be used to thin the first cap. In another embodiment, the thinning process may be excluded if film molding is used to directly expose the top surface of the TSV contacts.

Figure 20C:
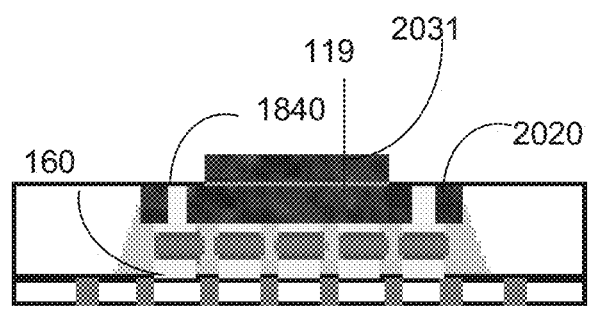

A second die 2031 is attached to the top surface of the first cap, as shown in FIG. 20*c*. In one embodiment, the die is a wirebond type of die. For example, the wirebond die includes bond pads 125 on an active surface. In one embodiment, an adhesive 119 may be used to mount the die to the die region. The adhesive, for example, may comprise an adhesive paste or die attach film, such as tape. Other types of adhesives, such as epoxy, may also be useful. The inactive surface of the second die is attached to the top surface of the cap, leaving the active surface with the bond pads exposed.

Figure 20D:
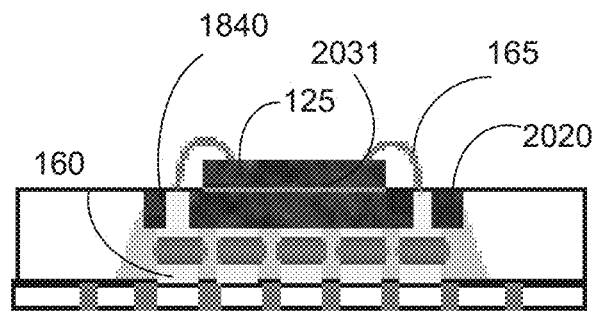
Figure 20E:
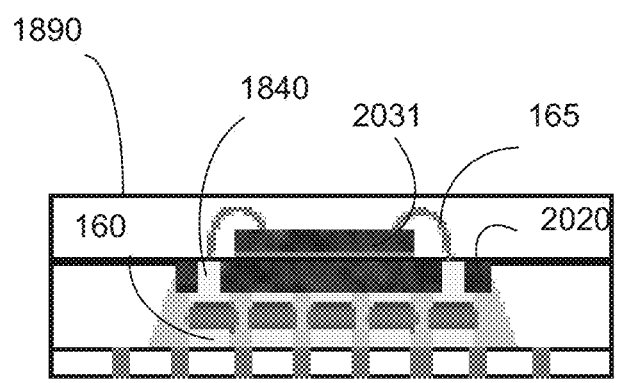

In FIG. 20*d*, wire bonds 165 are attached to the bond pads on the second die and the exposed top surface of the TSV contacts of the TSV flip chip. The wirebonds may be attached using a wirebond process. A second cap 1890 is formed over the second die and top surface of the first cap, as shown in FIG. 20*e*. The second cap, for example, may comprise a mold compound. Other types of materials may also be useful. The cap provides protection against the environment. A transfer, compression or injection molding process may be employed to form the cap. As shown the cap completely covers the top of the second die and wirebonds. The process continues to form the package. For example, the process continues as described in FIGS. 12*i-m*.

Figure 20F:
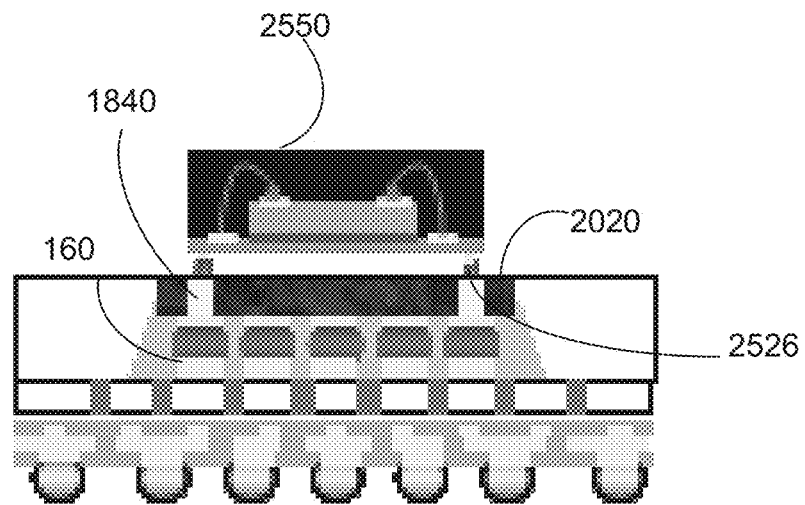

In an alternate embodiment, the process as described with respect to FIGS. 20*a-e* may be modified to form a 3D Package on Package (PoP). Common features and process steps need not be discussed or discussed in detail. In one embodiment, instead of attaching a wirebond die on the top surface of the first cap, a semiconductor package 2550 may be stacked on the top surface of the first cap as shown in FIG. 20*f*. The semiconductor package 2550, for example, may include a wirebond die therein. Providing other types of dies in the semiconductor package is also useful. In one embodiment, the package contacts 2526 of the semiconductor package 2550 are coupled to the exposed TSV contacts. As such, the exposed TSV contacts facilitate electrical connection between the top semiconductor package and the bottom semiconductor package with the base carrier.

Figure 20G:
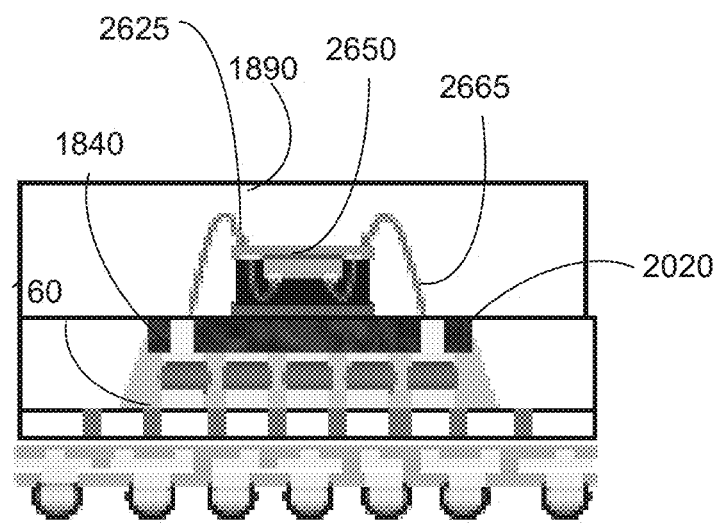

In yet another alternate embodiment, the process as described with respect to FIGS. 20*a-e* may be modified to form a 3D Package in Package (PiP). Common features and process steps need not be described or described in detail. In one embodiment, instead of attaching a wirebond die on the top surface of the first cap, a semiconductor package 2650 may be stacked on the top surface of the first cap as shown in FIG. 20*g*. The semiconductor package 2550, for example, may include a wirebond die therein. Providing other types of dies in the semiconductor package is also useful. In one embodiment, one of the surfaces of the semiconductor package is attached to the top surface of the first cap by an adhesive. The package contacts 2625 of the semiconductor package 2550 are coupled to the exposed TSV contacts by wirebonds 2665. As such, the exposed TSV contacts facilitate electrical connection between the top semiconductor package and the bottom semiconductor package with the base carrier.

FIGS. 21*a-e* show another embodiment of a method for forming a 3D package 2100. The 3D package, for example, includes a 3D multi chip module (MCM) package. The package has similarities to that described in FIG. 18*a-j* and FIG. 19*a-g*. The package, for example, includes a fan out structure on top of the package. Common features and process steps may not be described or described in detail.

Figure 21A:
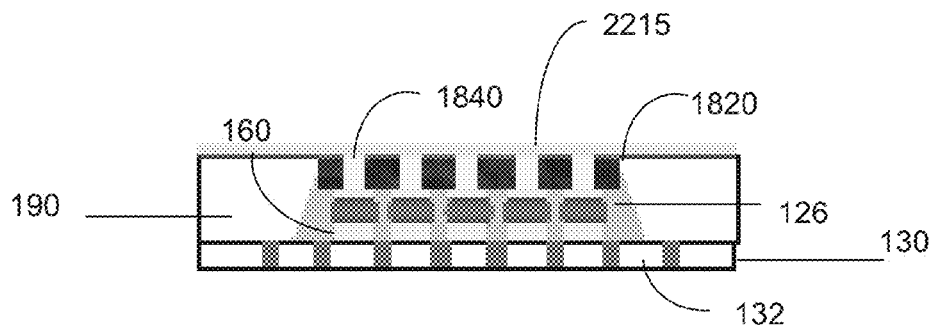

FIG. 21*a* shows the package processed similarly to the stage as described in FIG. 18*g*. For example, a die 1820 is attached on the die region of the base carrier. The top surface of the first cap is thinned until top surfaces of the TSV contacts are exposed, as shown in FIG. 18*g*. As such, common features and process steps need not be discussed. Referring to FIG. 21*a*, the process continues to form isolation material, such as a dielectric layer 2215, is formed over the top surface of the first cap. The dielectric layer, for example, is formed of polymer, solder mask or dielectric composite materials. The dielectric layer, for example, may be formed by printing, lamination or spin on techniques. Other dielectric materials or techniques may also be useful.

Figure 21B:
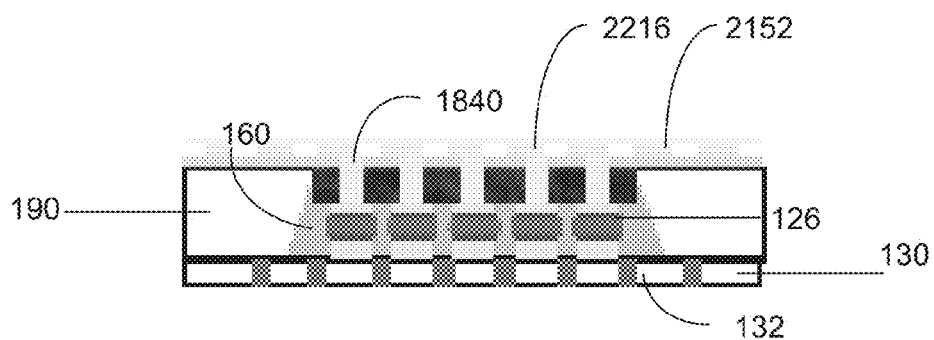

In one embodiment, the process continues to form a first line level on top of the first cap. As shown in FIG. 21*b*, a conductive layer 2216 is formed on the dielectric layer 2215. In one embodiment, the conductive layer is formed of copper. The conductive layer may be formed by plating techniques, including electrolytic and electroless plating. The conductive layer should be sufficiently thick to form first conductive traces of a first line level on top of the first cap. The conductive material is patterned to form first conductive traces 2152 separated by spaces.

Figure 21C:
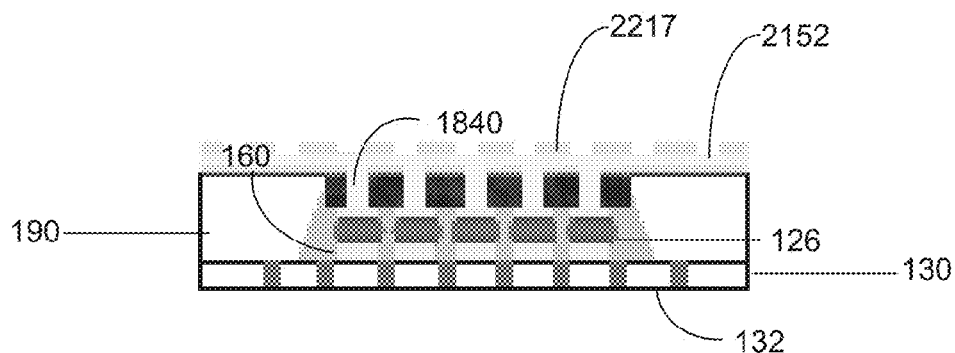

In FIG. 21*c*, a dielectric layer 2217 is formed on top of the conductive layer, filling the spaces between and covering portions of the first conductive traces on top of the first cap. The dielectric layer 2217, for example, may be similar to dielectric layer 2215. Other types of dielectric material may also be used to form the dielectric layer 2217. The dielectric layer is patterned to form openings to expose the first conductive traces 2152. The openings correspond to locations of package pads. Patterning of the dielectric layer may be achieved using a resist mask and an etch.

Figure 21D:
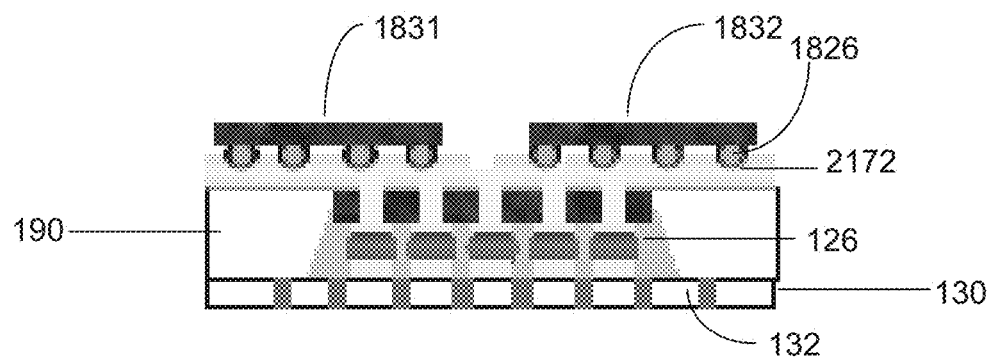

As shown in FIG. 21*d*, package pads 2172 are formed in the openings. The package pads, for example, may be formed by UBM. Other types of package pads may also be useful. More than one device, such as two flip chip devices, may be provided on top of the package pads. Providing more than two flip chip devices may also be useful. The die contacts of the second 1831 and third flip chip 1832 are coupled to the package pads, as shown in FIG. 21*d*.

Figure 21E:
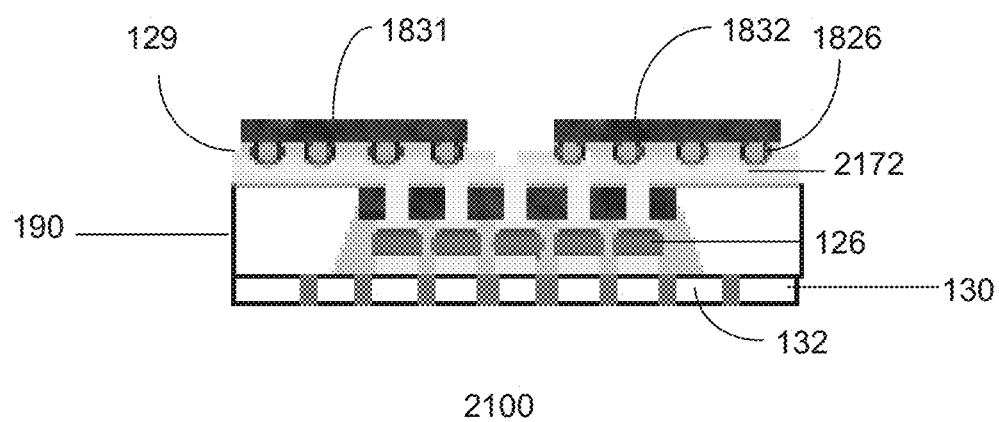

In FIG. 21*e*, an underfill 129, such as an epoxy-based polymeric material, may be dispensed in the space between the die contacts of the flip chips and the dielectric layer 2217. Alternatively, no underfill is provided. The process continues to form the package. For example, the process continues as described in FIGS. 12*i-m*.

Figure 22:
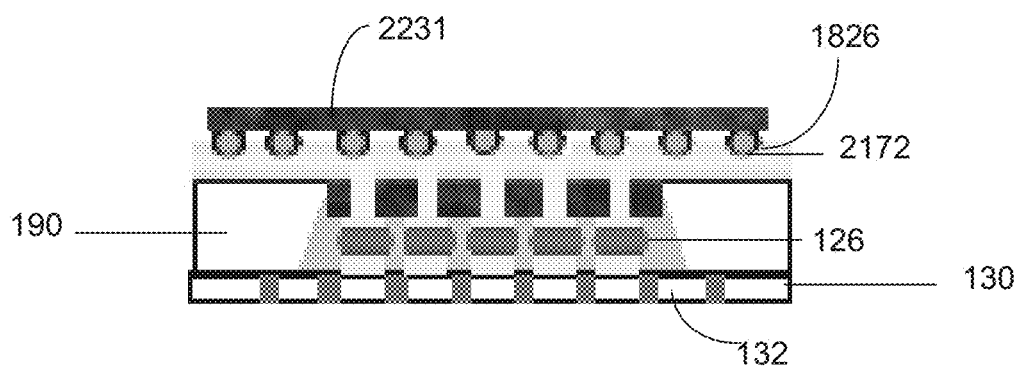

In an alternate embodiment, instead of forming a 3D multi chip module package, the method as described with respect to FIGS. 21*a-e* may also be modified and used to form a 3D single chip package. FIG. 22 shows a 3D single chip package. FIG. 22 is similar to FIG. 21*d* except that a single flip chip 2231 is attached on top of the first cap. As such, common features and process steps need not be discussed or discussed in detail.

Figure 23A:
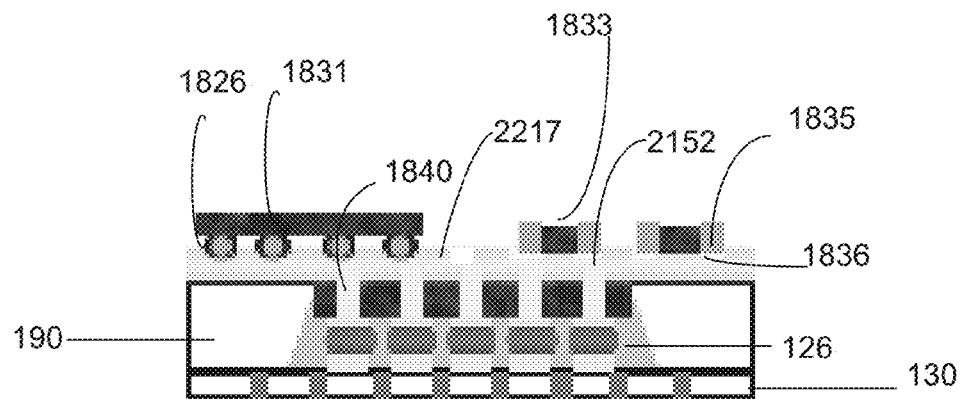
Figure 23B:
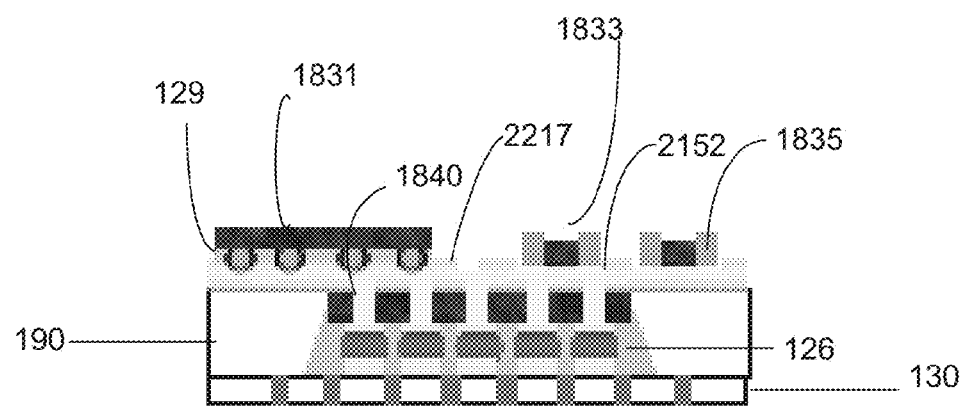
Figure 23C:
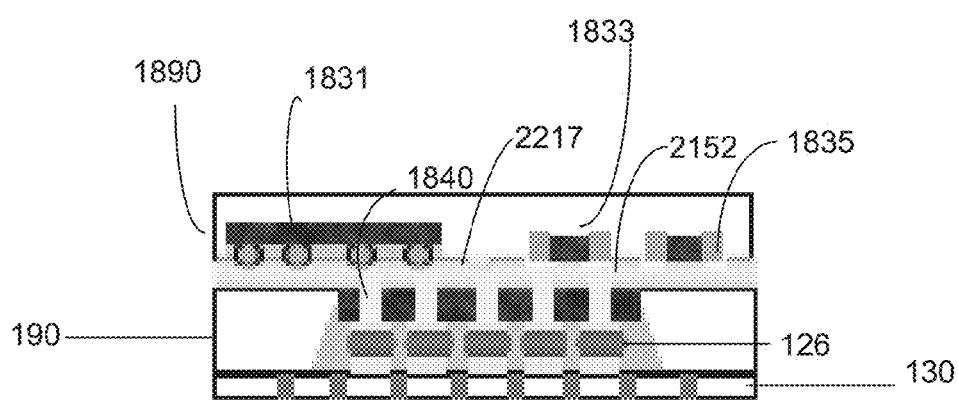

FIGS. 23*a-c* show another embodiment of a process for forming a 3D package. The 3D package, for example, includes a 3D System in Package with fan out structure at the top of the package. FIG. 23*a* shows the package processed similarly to the stage as described in FIG. 21*c*. For example, a dielectric layer 2217 is formed on top of the conductive layer, filling the spaces between and covering portions of the first conductive traces on top of the first cap. Hence, common features and process steps need not be described.

Referring to FIG. 23*a*, one or more active and passive components are provided on top of the dielectric layer 2217.

For example, a flip chip 1831, first and second passive components, 1833 and 1835, are provided on top of the dielectric layer. Providing other number of components may also be useful. In one embodiment, the one or more devices, including both active and passive components, may be stacked onto the exposed conductive traces on the top surface of the first cap. As shown in FIG. 23*a* for example, the die contacts 1826 of the flip chip and the electrical contacts 1836 of the passive components are coupled to the exposed conductive traces 2152. As such, the exposed conductive traces facilitate electrical connection of the components to the package with the leadframe below. In one embodiment, as shown in FIG. 23*b*, an underfill 129, such as an epoxy-based polymeric material, may be dispensed in the space between the die contacts of the flip chip and the dielectric layer. Alternatively, no underfill is provided.

In FIG. 23*c*, a second cap 1890 is formed over the flip chip and the passive devices. The second cap, for example, may comprise a mold compound. Other types of materials may also be useful. Providing the second cap with a material different than the first cap may also be useful. The second cap provides protection against the environment. A transfer, compression or injection molding process may be employed to form the second cap. As shown, the cap completely covers the top of the flip chip and the passive components. The process continues to form the package. For example, the process continues as described in FIGS. 12*i-m* to form the package.

Figure 24A:
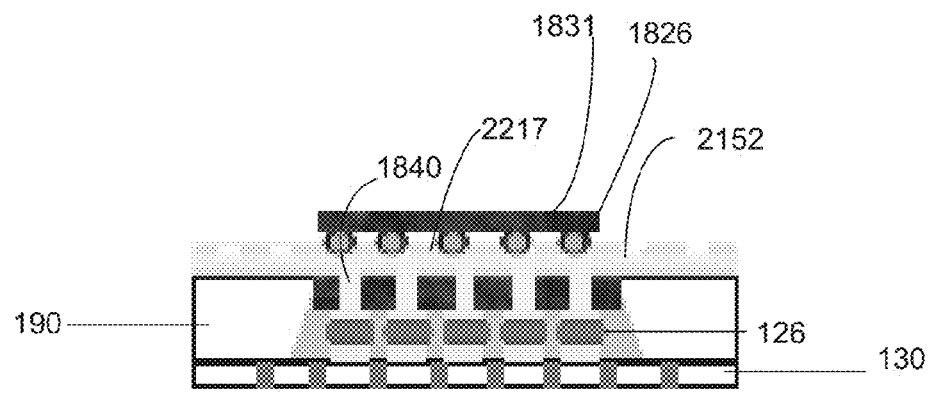

FIGS. 24*a-e* show another embodiment of a process for forming a 3D package 2400. For example, the 3D package includes a 3D hybrid with fan out at the top of the package. FIG. 24*a* shows the package processed similarly to the stage as described in FIG. 21*c*. For example, a dielectric layer 2217 is formed on top of the conductive layer, filling the spaces between and covering portions of the first conductive traces on top of the first cap. Hence, common features and process steps need not be described.

Figure 24B:
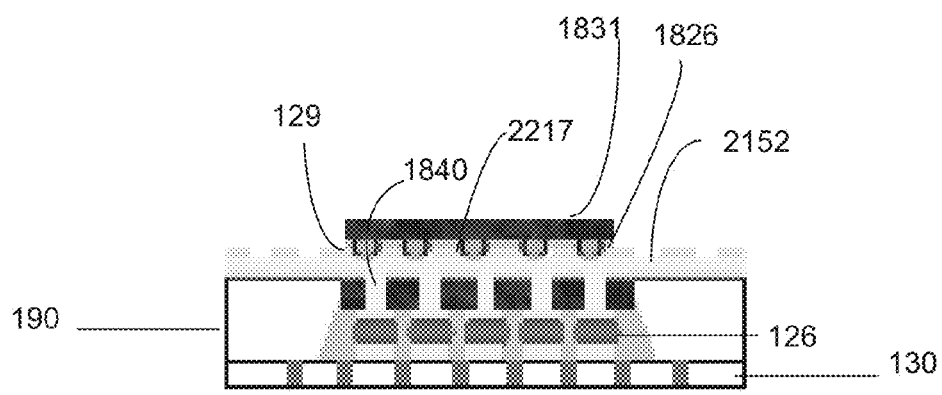

Referring to FIG. 24*a*, one or more devices may be provided on top of the dielectric layer. One or more active and passive components are provided on top of the dielectric layer 2217. In this embodiment, a flip chip 1831 is provided on top of the dielectric layer. Providing other number of components may also be useful. In one embodiment, the flip chip may be stacked onto the exposed conductive traces on the top surface of the first cap. As shown in FIG. 24*a* for example, the die contacts 1826 of the flip chip are coupled to the exposed conductive traces 2152. As such, the exposed conductive traces facilitate electrical connection of the flip chip to the package with the leadframe below. In one embodiment, as shown in FIG. 24*b*, an underfill 129, such as an epoxy-based polymeric material, may be dispensed in the space between the die contacts of the flip chip and the dielectric layer. Alternatively, no underfill is provided.

Figure 24C:
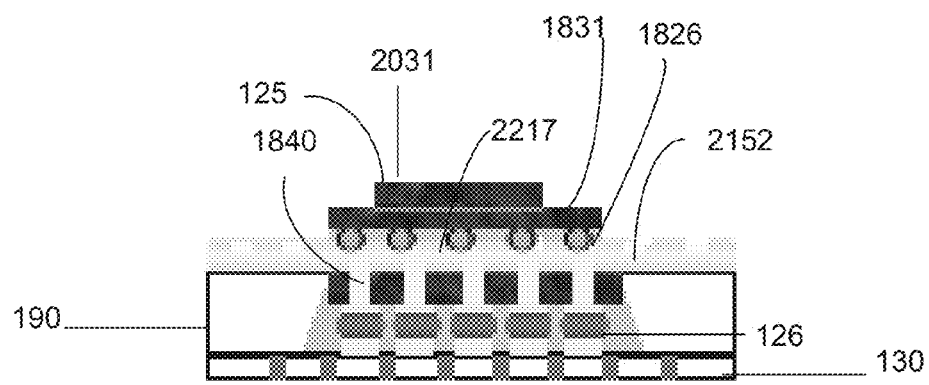

The process continues by providing a second die 2031. A second die 2031, for example, is stacked on top of the flip chip 1831, as shown in FIG. 24*c*. In one embodiment, the die is a wirebond type of die. For example, the wirebond die includes bond pads 125 on an active surface. In one embodiment, an adhesive (not shown) may be used to mount the die to the top surface of the flip chip. The adhesive, for example, may comprise an adhesive paste or die attach film, such as tape. Other types of adhesives, such as epoxy, may also be useful. The inactive surface of the second die is attached to the top surface of the flip chip, leaving the active surface with the bond pads exposed.

Figure 24D:
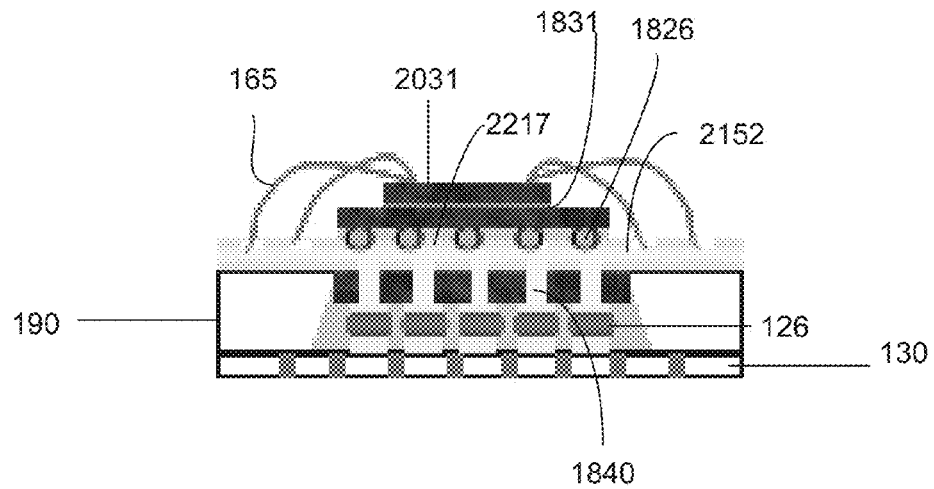
Figure 24E:
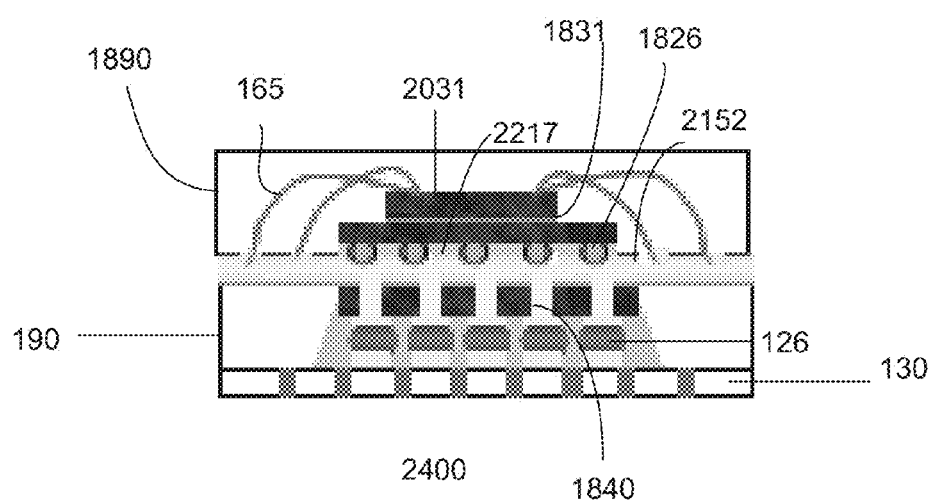

In FIG. 24*d*, wire bonds 165 are attached to the exposed conductive traces 2152. The wirebonds may be attached using a wirebond process. A second cap 1890 is formed over the second die, wire bonds and top surface of the dielectric layer, as shown in FIG. 24*e*. The second cap, for example, may comprise a mold compound. Other types of materials may also be useful. The cap provides protection against the environment. As shown the cap completely covers the top of the second die, wirebonds and the flip chip. The process continues to form the package. For example, the process continues as described in FIGS. 12*i-m*.

The embodiments, as discussed, provides a semiconductor package using a base carrier or leadframe to act as a support carrier and forms part of the package substrate during the IC build up process, packaging assembly and IC wafer assembly. Since the leadframe forms part of the package substrate, an additional temporary carrier to serve as a support structure is not required. Hence, the step of removing the temporary carrier as used in conventional method is avoided and reliability issues due to remnants of adhesive left behind in the support carrier removal step is also prevented.

Furthermore, the base carrier or leadframe also forms part of the electrical interconnection within the semiconductor package. As described, the partially processed or patterned base carrier or leadframe, defines a conductive line level and traces that permit routing of signals under the die attach region, as well as routing in areas outside of the die attach region. In addition, the leadframe also serves as the starting layer where additional or multiple conductive lines or traces are later built on. As such, the use of the conductive base carrier or leadframe as part of the electrical interconnection reduces at least one build up step for the wiring layers during formation of the semiconductor package. Additionally, this enables complex interconnection circuitry structures in the semiconductor package, thereby allowing higher I/O counts for the package.

The embodiments may also be extended to wafer level packaging to build up additional conductive line levels or traces and reroute wiring structures. The embodiments as disclosed provide a more cost effective solution, in particular, the embodiments reduces the costs associated with thin wafer handling and processing compared to conventional wafer level packaging technology, including fan-out wafer level packaging.

Although method or process steps, or the like may be described in a sequential order, such processes may be configured to work in different orders. In other words, any sequence or order of steps that may be explicitly described does not necessarily indicate a requirement that the steps be performed in that order. The steps of processes described herein may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the invention, and does not imply that the illustrated process is preferred.

Although a process may be described as including a plurality of steps, that does not indicate that all or even any of the steps are essential or required. Various other embodiments within the scope of the described invention(s) include other processes that omit some or all of the described steps. Unless otherwise specified explicitly, no step is essential or required.

In addition, different aspects of the embodiments can be combined. For example, the PoP contacts or posts as described can be employed in the embodiments as described with respect to FIG. 12 onwards. The PoP contacts or posts, for example, may also be used to provide a 3D package.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a semiconductor package comprising:
   providing a conductive base carrier having first and second planar surfaces, wherein the conductive base carrier comprises a leadframe;
   mounting a die on the first planar surface of the conductive base carrier, the die having die contacts coupled to the first planar surface of the conductive base carrier;
   encapsulating the die with a cap, wherein the cap is in direct contact with the first planar surface of the conductive base carrier;
   processing the second planar surface of the conductive carrier while the cap is in direct contact with the first planar surface of the conductive base carrier, wherein processing the second planar surface of the conductive carrier comprises patterning the conductive carrier to define first conductive traces of a first conductive line level, wherein the first conductive traces are separated by gaps;
   forming a first dielectric layer on the first conductive traces of the first conductive line level, wherein the first dielectric layer fills the gaps between the first conductive traces;
   forming a second conductive line level below the first dielectric layer, wherein the second conductive line level includes a plurality of second conductive traces separated from each other; and
   forming package contacts below the second conductive line level, wherein the package contacts are conductively interconnected to the die contacts.

2. The method of claim 1 comprising patterning the first dielectric layer to form dielectric openings which expose the first conductive traces, wherein a conductive layer is formed on the patterned first dielectric layer to fill the dielectric openings with a conductive material and define the second conductive line level.

3. The method of claim 2 wherein the conductive layer is formed on the patterned first dielectric layer by electrolytic plating or electroless plating.

4. The method of claim 2 wherein forming the conductive layer includes forming the second conductive traces of the second conductive line level, and forming spaces between each of the second conductive traces.

5. The method of claim 4 comprising forming a second dielectric layer below the second conductive line level, wherein the second dielectric layer is patterned to form dielectric openings which expose the second conductive traces.

6. The method of claim 5 wherein the dielectric openings in the second dielectric layer correspond to locations of the package contacts.

7. The method of claim 5 wherein the first and second dielectric layers include polymer, solder mask or dielectric composite materials.

8. A method of forming a semiconductor package comprising:
   providing a conductive base carrier having first and second planar surfaces;
   mounting a die on the first planar surface of the conductive base carrier;
   encapsulating the die with a cap, wherein the cap is in direct contact with the first planar surface of the conductive base carrier;
   patterning the second planar surface of the conductive carrier while the cap is in direct contact with the first planar surface of the conductive base carrier, wherein patterning the second planar surface of the conductive base carrier forms a plurality of first conductive traces of a first conductive line level, wherein the first conductive traces are separated by gaps;
   forming a first dielectric layer on the patterned second planar surface of the conductive carrier, wherein the first dielectric layer fills the gaps between the first conductive traces and covers the first conductive traces;
   forming a second conductive line level below the first dielectric layer, wherein the second conductive line level includes a plurality of second conductive traces separated from each other;
   forming a second dielectric layer below the second conductive line level, wherein the second dielectric layer includes dielectric openings to expose the conductive traces in the second conductive line level; and
   wherein the dielectric openings in the second dielectric layer correspond to locations of package contacts.

9. The method of claim 8 comprising forming package contacts in the dielectric openings below the second conductive line level.

10. The method of claim 8 wherein the conductive base carrier comprises a leadframe, wherein the leadframe is patterned to define the first conductive traces.

11. The method of claim 10 wherein the gaps, which separate the first conductive traces, are formed in portions of the leadframe underlapping a die attach region of the conductive base carrier, and in portions of the leadframe outside of the die attach region.

12. The method of claim 8 wherein patterning the second planar surface of the conductive base carrier comprises forming the gaps, which separate the first conductive traces, in portions of the conductive base carrier underlapping the die.

13. The method of claim 8 wherein forming the second conductive line level comprises forming via contacts which extend through the first dielectric layer to couple the second conductive line level to the first conductive line level.

14. The method of claim 8 wherein the locations of the package contacts correspond to a fan-out package structure.

15. A method of forming a semiconductor package comprising:
   providing a conductive base carrier having first and second planar surfaces;
   mounting a die on the first planar surface of the conductive base carrier, the die having die contacts coupled to the first planar surface of the conductive base carrier;
   encapsulating the die with a cap;
   processing the second planar surface of the conductive base carrier to form a first conductive line level below the die and the cap, wherein the first conductive line level is defined by a plurality of first conductive traces separated from each other by gaps;

forming a first dielectric layer on the first conductive traces of the first conductive line level, wherein the first dielectric layer fills the gaps between the first conductive traces; and forming package contacts below the first dielectric layer, wherein the package contacts are conductively interconnected to the die contacts.

16. The method of claim 15 comprising forming a second conductive line level below the first dielectric layer prior to forming the package contacts, wherein the second conductive line level includes a plurality of second conductive traces separated from each other.

17. The method of claim 16 comprising forming a second dielectric layer below the second conductive line level prior to forming the package contacts, wherein the second dielectric layer is patterned to form openings which expose the second conductive traces in the second conductive line level.

18. The method of claim 16 wherein the first dielectric layer partially covers the first conductive traces of the first conductive line level, and via openings of a first via level are defined in the first dielectric layer, wherein forming the second conductive line level comprises forming a conductive layer which fills the via openings of the first via level.

19. The method of claim 17 wherein the package contacts are formed in the openings of the second dielectric layer.

20. The method of claim 15 wherein processing the second planar surface of the conductive base carrier comprises forming the gaps, which separate the first conductive traces from each other, in portions of the conductive base carrier underlapping the die.

\* \* \* \* \*